United States Patent
Takagi et al.

(10) Patent No.: US 11,550,086 B2
(45) Date of Patent: Jan. 10, 2023

(54) OPTICAL FILTER AND IMAGING APPARATUS

(71) Applicant: Nippon Sheet Glass Company, Limited, Tokyo (JP)

(72) Inventors: Tomitaka Takagi, Tokyo (JP); Katsuhide Shimmo, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 248 days.

(21) Appl. No.: 16/770,469

(22) PCT Filed: Nov. 12, 2018

(86) PCT No.: PCT/JP2018/041868
§ 371 (c)(1),
(2) Date: Jun. 5, 2020

(87) PCT Pub. No.: WO2019/111638
PCT Pub. Date: Jun. 13, 2019

(65) Prior Publication Data
US 2020/0386928 A1 Dec. 10, 2020

(30) Foreign Application Priority Data
Dec. 6, 2017 (JP) ............................. JP2017-234409

(51) Int. Cl.
*G02B 5/20* (2006.01)
*C09B 69/00* (2006.01)

(52) U.S. Cl.
CPC ............ *G02B 5/208* (2013.01); *C09B 69/007* (2013.01)

(58) Field of Classification Search
CPC ............................ G02B 5/208; G01S 7/4816
See application file for complete search history.

(56) References Cited

U.S. PATENT DOCUMENTS

| 2002/0186310 A1 | 12/2002 | Kitagishi |
| 2012/0243077 A1 | 9/2012 | Osawa et al. |

(Continued)

FOREIGN PATENT DOCUMENTS

| JP | 2002281515 | 9/2002 |
| JP | 2011159800 | 8/2011 |

(Continued)

OTHER PUBLICATIONS

International Search Report and Written Opinion issued for International Patent Application No. PCT/JP2018/041868, dated Feb. 5, 2019, 9 pages including English translation of Search Report.

*Primary Examiner* — Mary Ellen Bowman
(74) *Attorney, Agent, or Firm* — Hamre, Schumann, Mueller & Larson, P.C.

(57) ABSTRACT

An optical filter (1a) includes a light-absorbing layer (10). The light-absorbing layer absorbs light in at least a portion of the near-infrared region. When light with a wavelength of 300 to 1200 nm is incident on the optical filter (1a) at an incident angle of 0°, the optical filter (1a) satisfies given requirements. When light with a wavelength of 300 to 1200 nm is incident on the optical filter (1a) at incident angles of 0°, 30°, 35°, and 40°, the optical filter (1a) satisfies given requirements related to a normalized spectral transmittance. The normalized spectral transmittance is determined by normalization of a spectral transmittance for each incident angle so that the maximum of the spectral transmittance for each incident angle in the wavelength range of 400 to 650 nm is 100%.

12 Claims, 19 Drawing Sheets

(56) References Cited

U.S. PATENT DOCUMENTS

| | | |
|---|---|---|
| 2014/0063597 A1 | 3/2014 | Shimmo et al. |
| 2014/0300956 A1 | 10/2014 | Kubo et al. |
| 2015/0146057 A1 | 5/2015 | Konishi |
| 2017/0146708 A1 | 5/2017 | Lah |
| 2018/0003872 A1 | 1/2018 | Kubo et al. |
| 2018/0095203 A1 | 4/2018 | Ooi et al. |
| 2018/0188428 A1 | 7/2018 | Arimura et al. |
| 2018/0275326 A1 | 9/2018 | Kubo et al. |
| 2018/0282521 A1 | 10/2018 | Kubo et al. |

FOREIGN PATENT DOCUMENTS

| | | |
|---|---|---|
| JP | 2012103340 | 5/2012 |
| JP | 2014052482 | 3/2014 |
| JP | 2014203044 | 10/2014 |
| JP | 2017146506 | 8/2017 |
| JP | 6232161 | 11/2017 |
| WO | 2014030628 | 2/2014 |
| WO | 2017006571 | 1/2017 |
| WO | 2017051512 | 3/2017 |
| WO | 2017051867 | 3/2017 |
| WO | 2017056803 | 4/2017 |
| WO | 2017183671 | 10/2017 |

———Incident angle 0° ------Incident angle 30° — — -Incident angle 50°

OPTICAL FILTER AND IMAGING APPARATUS

TECHNICAL FIELD

The present invention relates to an optical filter and imaging apparatus.

BACKGROUND ART

Imaging apparatuses including an optical filter such as a near-infrared cut filter are conventionally known. For example, Patent Literature 1 describes a near-infrared cut filter including a laminated sheet having a near-infrared-absorber-including resin layer provided on at least one side of a glass sheet substrate. For example, this near-infrared cut filter has a dielectric multilayer film provided on at least one side of the laminated sheet. For this near-infrared cut filter, the absolute value |Ya−Yb| of the difference between a wavelength value (Ya) and a wavelength value (Yb) is less than 15 nm. The wavelength value (Ya) is a value of a wavelength which lies in the wavelength range of 560 to 800 nm and at which the transmittance measured in the direction perpendicular to the near-infrared cut filter is 50%. The wavelength value (Yb) is a value of a wavelength which lies in the wavelength range of 560 to 800 nm and at which the transmittance measured at an incident angle of 30° to the near-infrared cut filter is 50%. As just described, the dependence of the transmission characteristics of the near-infrared cut filter according to Patent Literature 1 on the incident angle of light is adjusted to be small.

Patent Literature 2 describes a near-infrared cut filter including a near-infrared-absorbing glass substrate, near-infrared-absorbing layer, and dielectric multilayer film. The near-infrared-absorbing layer includes a near-infrared-absorbing dye and transparent resin. Patent Literature 2 describes a solid-state imaging apparatus including this near-infrared cut filter and a solid-state imaging device. According to Patent Literature 2, the influence of the incident angle dependence which dielectric multilayer films inherently have and in which a blocking wavelength shifts depending on the incident angle can be almost completely eliminated by laminating the near-infrared-absorbing glass substrate and near-infrared-absorbing layer. For example, in Patent Literature 2, a transmittance (To) at an incident angle of 0° and a transmittance ($T_{30}$) at an incident angle of 30° are measured for the near-infrared cut filter.

Patent Literatures 3 and 4 each describe an infrared cut filter including a transparent dielectric substrate, an infrared-reflecting layer, and an infrared-absorbing layer. The infrared-reflecting layer is formed of a dielectric multilayer film. The infrared-absorbing layer includes an infrared-absorbing dye. Patent Literatures 3 and 4 each describe an imaging apparatus including this infrared cut filter. Patent Literatures 3 and 4 each describe transmittance spectra shown by the infrared cut filter for light incident at incident angles of 0°, 25°, and 35°.

CITATION LIST

Patent Literature

Patent Literature 1; JP 2012-103340 A
Patent Literature 2; WO 2014/030628 A1
Patent Literature 3; JP 2014-52482 A
Patent Literature 4; JP 2014-203044 A

SUMMARY OF INVENTION

Technical Problem

The above patent literatures fail to specifically discuss the characteristics which would be exhibited by the optical filters when light is incident on the optical filters at an incident angle larger than 35° (e.g., 40° or larger). Therefore, the present invention provides an optical filter that can block unnecessary light and that exhibits characteristics advantageous to prevent uneven coloring of an image generated by an imaging apparatus even when the incident angle of light is larger. The present invention also provides an imaging apparatus including this optical filter.

Solution to Problem

The present invention provides an optical filter, including a light-absorbing layer that includes a light absorber for absorbing light in at least a portion of the near-infrared region, wherein when light with a wavelength of 300 to 1200 nm is incident on the optical filter at an incident angle of 0°, the optical filter satisfies the following requirements (1) to (9);

(1) a spectral transmittance at a wavelength of 380 nm is 20% or less;

(2) the spectral transmittance at a wavelength of 450 nm is 75% or more;

(3) an average of the spectral transmittance in the wavelength range of 500 to 600 nm is 80% or more;

(4) the spectral transmittance at a wavelength of 700 nm is 5% or less;

(5) the spectral transmittance at a wavelength of 715 nm is 3% or less;

(6) an average of the spectral transmittance in the wavelength range of 700 to 800 nm is 1% or less;

(7) the maximum of the spectral transmittance in the wavelength range of 750 to 1080 nm is 1% or less;

(8) the maximum of the spectral transmittance in the wavelength range of 1000 to 1100 nm is 2% or less; and (9) a wavelength bandwidth of a wavelength band in which the spectral transmittance in the wavelength range of 400 to 700 nm is 75% or more is 170 nm or more, when light with a wavelength of 300 to 1200 nm is incident on the optical filter at incident angles of 0°, 30°, 35°, and 40°, the optical filter further satisfies the following requirements (10) to (18):

(10) a normalized spectral transmittance at a wavelength of 380 nm is 24% or less;

(11) the normalized spectral transmittance at a wavelength of 450 nm is 84% or more;

(12) an average of the normalized spectral transmittance in the wavelength range of 500 to 600 nm is 95% or more;

(13) the normalized spectral transmittance at a wavelength of 700 nm is 6.0% or less;

(14) the normalized spectral transmittance at a wavelength of 715 nm is 4.5% or less;

(15) an average of the normalized spectral transmittance in the wavelength range of 700 to 800 nm is 1.2% or less;

(16) the maximum of the normalized spectral transmittance in the wavelength range of 750 to 1080 nm is 1.2% or less;

(17) the maximum of the normalized spectral transmittance in the wavelength range of 1000 to 1100 nm is 2.4% or less; and

(18) a wavelength bandwidth of a wavelength band in which the normalized spectral transmittance in the wavelength range of 400 to 700 nm is 80% or more is 170 nm or more, the normalized spectral transmittance being determined by normalization of the spectral transmittance for each incident angle so that the maximum of the spectral transmittance for each incident angle in the wavelength range of 400 to 650 nm is 100%.

The present invention also provides an imaging apparatus including;

a lens system;

an imaging device that receives light having been transmitted through the lens system; and the above optical filter that is disposed ahead of the imaging device.

Advantageous Effects of Invention

The above optical filter can block unnecessary light and exhibits characteristics advantageous to prevent uneven coloring of an image generated by an imaging apparatus even when the incident angle of light is larger. Moreover, an image generated by the above imaging apparatus of the present invention is unlikely to be colored unevenly.

DESCRIPTION OF EMBODIMENTS

Figure 1A:
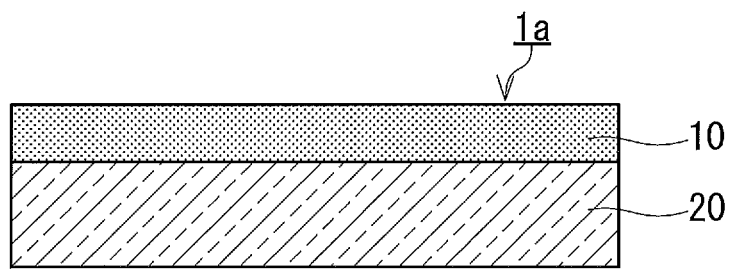
FIG. 1A is a cross-sectional view of an example of an optical filter of the present invention.

Hereinafter, embodiments of the present invention will be described with reference to the drawings. The following description is directed to some examples of the present invention, and the present invention is not limited by these examples.

The present inventors have invented the optical filter according to the present invention based on new findings obtained from the following studies of optical filters.

An optical filter blocking against unnecessary light other than visible light is disposed in a camera module or imaging apparatus mounted in a personal digital assistant such as a smartphone. The use of an optical filter including a light-absorbing layer has been discussed to block unnecessary light. Like the optical filters described in Patent Literatures 1 to 4, many optical filters including a light-absorbing layer further include a light-reflecting layer composed of a dielectric multilayer film.

Interference of light reflecting on the front and back surfaces of each layer of a light-reflecting layer composed of a dielectric multilayer film determines a wavelength band of transmitted light and a wavelength band of reflected light. Light can be incident on the optical filter at various incident angles. As the incident angle of light gets larger, the optical path length in each layer of the light-reflecting layer changes. As a result, a phenomenon is observed in which the wavelength band of transmitted light and the wavelength band of reflected light shift to the short wavelength side. Therefore, it is conceivable that when light in a given wavelength band is reflected by the light-reflecting layer that is a dielectric multilayer film, a boundary between a wavelength band of light to be blocked and a wavelength band of light to be transmitted is determined by a wavelength band of light absorption so that the transmittance characteristics of the optical filter do not greatly vary depending on the incident angle of light.

In Patent Literatures 1 and 2, the transmission characteristics of the near-infrared cut filters for light incident at incident angles of 0° and 30° are evaluated. In Patent Literatures 3 and 4, transmittance spectra shown by the infrared cut filters for light incident at incident angles of 0°, 25°, and 35° are evaluated. In recent years, camera modules and imaging apparatuses mounted in personal digital assistants such as smartphones have been expected to achieve a wider angle of view and a much lower profile. Therefore, it is desirable that the wavelength band and amount of light transmitted through optical filters be unlikely to vary even when the incident angle of light is larger (e.g., 40° or larger).

In these points of view, for example, it is conceivable that an optical filter is designed so that a light-reflecting layer composed of a dielectric multilayer film has a boundary between a wavelength band of transmitted light and a wavelength band of reflected light at a wavelength sufficiently longer than a wavelength at which a light-absorbing layer has a boundary between a wavelength band of transmitted light and a wavelength band of absorbed light. In this case, a boundary between a wavelength band of light to be transmitted through the optical filter and a wavelength band of light to be blocked by the optical filter is prevented from shifting to the short wavelength side even when the incident angle of light is larger. However, when the incident angle of light is much larger, the amount of change in optical path length in each layer of the light-reflecting layer increases and, depending on the incident angle of light, a defect called a ripple, which is a local increase in light reflectance and a local decrease in transmittance, can happen in a wavelength band of light to be transmitted. In particular, even an optical filter designed to be free of ripples at incident angles of 0° to 35° may suffer a ripple at an incident angle of 40° or larger. Occurrence of a ripple greatly decreases the sensitivity of an imaging apparatus to light with a certain wavelength to lower than the sensitivity thereof to light with other wavelengths and may cause uneven coloring of an image obtained therewith.

Under these circumstances, the present inventors went through much trial and error to develop an optical filter that can block unnecessary light and that is advantageous to prevent uneven coloring of an image generated by an imaging apparatus even when the incident angle of light is larger. As a result, the present inventors have found that desirable characteristics can be imparted to an optical filter by a given light absorbing layer without combined use of a light-reflecting layer composed of a dielectric multilayer, and thus invented the optical filter according to the present invention.

Herein, the term "spectral transmittance" refers to a transmittance obtained when light with a given wavelength is incident on an object such as a specimen and the term "average transmittance" refers to an average of the spectral transmittance in a given wavelength range. Additionally, the term "transmittance spectrum" herein refers to one in which spectral transmittance values at wavelengths in a given wavelength range are arranged in the wavelength order.

As shown in FIG. 1A, the optical filter 1a includes a light-absorbing layer 10. The light-absorbing layer 10 includes a light absorber. The light absorber absorbs light in at least a portion of the near-infrared region. When light with a wavelength of 300 to 1200 nm is incident on the optical filter 1a at an incident angle of 0°, the optical filter 1a satisfies the following requirements (1) to (9):

(1) a spectral transmittance at a wavelength of 380 nm is 20% or less;
(2) the spectral transmittance at a wavelength of 450 nm is 75% or more;
(3) an average of the spectral transmittance in the wavelength range of 500 to 600 nm is 80% or more;
(4) the spectral transmittance at a wavelength of 700 nm is 5% or less;
(5) the spectral transmittance at a wavelength of 715 nm is 3% or less;
(6) an average of the spectral transmittance in the wavelength range of 700 to 800 nm is 1% or less;
(7) the maximum of the spectral transmittance in the wavelength range of 750 to 1080 nm is 1% or less;
(8) the maximum of the spectral transmittance in the wavelength range of 1000 to 1100 nm is 2% or less; and
(9) a wavelength bandwidth of a wavelength band in which the spectral transmittance in the wavelength range of 400 to 700 nm is 75% or more is 170 nm or more.

When light with a wavelength of 300 to 1200 nm is incident on the optical filter 1a at incident angles of 0°, 30°, 35°, and 40°, the optical filter 1a further satisfies the following requirements (10) to (18):

(10) a normalized spectral transmittance at a wavelength of 380 nm is 24% or less;

(11) the normalized spectral transmittance at a wavelength of 450 nm is 84% or more;

(12) an average of the normalized spectral transmittance in the wavelength range of 500 to 600 nm is 95% or more;

(13) the normalized spectral transmittance at a wavelength of 700 nm is 6.0% or less;

(14) the normalized spectral transmittance at a wavelength of 715 nm is 4.5% or less;

(15) an average of the normalized spectral transmittance in the wavelength range of 700 to 800 nm is 1.2% or less;

(16) the maximum of the normalized spectral transmittance in the wavelength range of 750 to 1080 nm is 1.2% or less;

(17) the maximum of the normalized spectral transmittance in the wavelength range of 1000 to 1100 nm is 2.4% or less; and

(18) a wavelength bandwidth of a wavelength band in which the normalized spectral transmittance in the wavelength range of 400 to 700 nm is 80% or more is 170 nm or more.

The normalized spectral transmittance mentioned above is determined by normalization of the spectral transmittance for each incident angle so that the maximum of the spectral transmittance for each incident angle in the wavelength range of 400 to 650 nm will be 100%. Typically, light with a wavelength of 300 to 1200 nm is allowed to be incident on the optical filter 1a at incident angles of 0°, 30°, 35°, and 40°, and the spectral transmittance is measured at every 1 nm in the wavelength range of 300 to 1200 nm. For the spectral transmittance thus measured at each incident angle, the spectral transmittance value at each wavelength is divided by the maximum of the spectral transmittance in the wavelength range of 400 to 650 nm, and the resultant value is expressed in percentage. A normalized spectral transmittance is thus determined.

As to the above requirement (9), when a plurality of discrete wavelength bands in which the spectral transmittance is 75% or more exists in the wavelength range of 400 to 700 nm, the sum of the wavelength bandwidths of the plurality of wavelength bands is defined as "wavelength bandwidth". As to the above requirement (18), when a plurality of discrete wavelength bands in which the normalized spectral transmittance is 80% or more exists in the wavelength range of 400 to 700 nm, the sum of the wavelength bandwidths of the plurality of wavelength bands is defined as a "wavelength bandwidth".

Since the optical filter 1a has the above characteristics, the optical filter 1a can appropriately block unnecessary light such as light in the near-infrared region without a light-reflecting layer composed of a dielectric multilayer film. The optical filter 1a may appropriately block light in the ultraviolet region as well. Because of the absence of a light-reflecting layer composed of a dielectric multilayer film from the optical filter 1a, no ripple occurs in a wavelength band of light to be transmitted even when the incident angle of light is large, and an image generated by an imaging apparatus including the optical filter 1a is unlikely to be colored unevenly. Additionally, for the optical filter 1a, the boundary between a wavelength band of transmitted light and a wavelength band of blocked light is prevented from shifting to the short wavelength side with increase in incident angle of light. Moreover, since the above requirements (10) to (18) related to the normalized spectral transmittance are satisfied at incident angles of 0°, 30°, 35°, and 40°, each difference in shape between one and another of normalized spectral transmittance curves for these incident angles is likely to be small.

It is conceivable that the optical filter 1a is used, for example, when a color filter consisting of R (red), G (green), and B (blue) segments is disposed at each pixel of an imaging device such as a charge-coupled device (CCD) or complementary metal oxide semiconductor (CMOS). In this case, output from each pixel of the imaging device is appropriately adjusted by the optical filter 1a, and spectral sensitivity characteristics corresponding to the output from each pixel of the imaging device are likely to well conform to the visual sensitivity.

An optical filter that blocks unnecessary light is commonly disposed with its principal surface parallel to a light receiving surface of an imaging device near the optical filter. In this case, light incident on the optical filter and then on the imaging device is incident on the optical filter and the imaging device at a substantially equal incident angle. A chief ray is incident near the center of an imaging device at an incident angle of nearly 0° while it is incident on the peripheral portion of the imaging device at a large incident angle. Therefore, in the case where the shape of a spectral sensitivity curve changes depending on the incident angle of light incident on an imaging apparatus, the central portion and the peripheral portion of an image taken with the imaging apparatus differ in color when the image is displayed or printed. Therefore, an object expected to be colored with one color in the image is likely to gradually discolor from the central portion toward the peripheral portion, and the discoloration is likely to be recognized as color unevenness. Additionally, in the case where the shape of the spectral sensitivity curve changes in a narrow incident angle range, e.g., 5° to 10°, discoloration is likely to occur in a narrow area on the resultant image and is particularly likely to be recognized as color unevenness. If an incident angle-dependent change in the shape of a normalized spectral transmittance curve can be reduced by means of the optical filter, the incident angle-dependent change in the shape of the spectral sensitivity curve can be reduced and uneven coloring of an image generated by the imaging apparatus can be prevented. As the optical filter 1a satisfies the above requirements (10) to (18), the optical filter 1a has characteristics advantageous to prevent uneven coloring of an image generated by an imaging apparatus.

It is desirable that when light with a wavelength of 300 to 1200 nm is incident on the optical filter at incident angles of 45°, 50°, and 60°, the optical filter further satisfy the above requirements (10) to (18). In other words, the normalized spectral transmittances for incident angles of 45°, 50°, and 60° also satisfy the above requirements (10) to (18). The normalized spectral transmittances for incident angles of 45°, 50°, and 60° can be determined in the same manner as for the normalized spectral transmittances for incident angles of 0°, 30°, 35°, and 40°.

It is more desirable that when light with a wavelength of 300 to 1200 nm is incident on the optical filter 1a at an incident angle of 65°, the optical filter 1a further satisfy the above requirements (10) to (18). In other words, a normalized spectral transmittance for an incident angle of 65° also satisfies the above requirements (10) to (18). The normalized spectral transmittance for an incident angle of 65° can be determined in the same manner as for the normalized spectral transmittances for incident angles of 0°, 30°, 35°, and 40°. When, as described above, the shape of the normalized spectral transmittance shown by the optical filter 1a change little depending on the incident angle ranging from 0° to 65°, the optical filter 1*a* can be used as a protective material, such as a cover glass or protective filter, of a wide-angle-lens-equipped imaging apparatus.

In the case where a wide-angle lens is used in an imaging apparatus, the incident angle of light incident on a light receiving surface of an imaging device can be reduced by certain design of the lens. It is inevitable, however, that light incident on a cover glass located ahead of the lens of the imaging apparatus includes light incident at a large incident angle. When the optical filter 1*a* satisfies the above requirements, an image generated by an imaging apparatus including the optical filter 1*a* as a cover glass is unlikely to be colored unevenly. Additionally, the optical filter 1*a* functioning also as a cover glass can reduce the number of components of the imaging apparatus and makes it easy to achieve a lower-profile imaging apparatus. Besides, in that case, the freedom of lens design is expanded. Moreover, flare and ghost caused by reflection on a principal surface of a conventional optical filter disposed independently of a cover glass can be prevented.

The light absorber included in the light-absorbing layer 10 is not particularly limited as long as the light absorber absorbs light in at least a portion of the near-infrared region and the optical filter 1*a* satisfies the above requirements (1) to (18). The light absorber is, for example, formed by a phosphonic acid and copper ion. In this case, light in a wide wavelength band covering the near-infrared region and a portion of the visible region adjacent to the near-infrared region can be absorbed by the light-absorbing layer 10. Therefore, the desired characteristics can be exhibited even when the optical filter 1*a* does not include a light-reflecting layer.

When the light-absorbing layer 10 includes the light absorber formed by a phosphonic acid and copper ion, the phosphonic acid includes, for example, a first phosphonic acid having an aryl group. In the first phosphonic acid, the aryl group is bonded to a phosphorus atom. Thus, the above requirements are easily satisfied by the optical filter 1*a*.

The aryl group of the first phosphonic acid is, for example, a phenyl group, benzyl group, toluyl group, nitrophenyl group, hydroxyphenyl group, halogenated phenyl group in which at least one hydrogen atom of a phenyl group is substituted by a halogen atom, or halogenated benzyl group in which at least one hydrogen atom of a benzene ring of a benzyl group is substituted by a halogen atom.

When the light-absorbing layer 10 includes the light absorber formed by the phosphonic acid and copper ion, the phosphonic acid desirably further includes a second phosphonic acid having an alkyl group. In the second phosphonic acid, the alkyl group is bonded to a phosphorus atom.

The alkyl group of the second phosphonic acid is, for example, an alkyl group having 6 or less carbon atoms. This alkyl group may be linear or branched.

When the light-absorbing layer 10 includes the light absorber formed by the phosphonic acid and copper ion, the light-absorbing layer 10 further includes, for example, a phosphoric acid ester allowing the light absorber to be dispersed and matrix resin. The light-absorbing layer 10 further includes, if necessary, a hydrolytic polycondensation product of an alkoxysilane monomer.

The phosphoric acid ester included in the light-absorbing layer 10 is not limited to any particular one, as long as the phosphoric acid ester allows good dispersion of the light absorber. For example, the phosphoric acid ester includes at least one of a phosphoric acid diester represented by the following formula (c1) and a phosphoric acid monoester represented by the following formula (c2). In the formulae (c1) and (c2), $R_{21}$, $R_{22}$, and $R_3$ are each a monovalent functional group represented by —$(CH_2CH_2O)_nR_4$, wherein n is an integer of 1 to 25 and $R_4$ is an alkyl group having 6 to 25 carbon atoms. $R_{21}$, $R_{22}$, and $R_3$ may be the same or different functional groups.

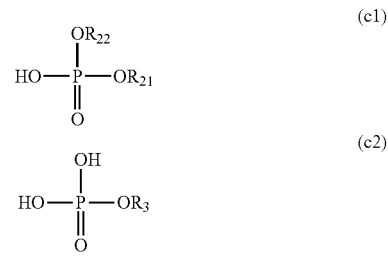

The phosphoric acid ester is not particularly limited. The phosphoric acid ester can be, for example, PLYSURF A208N (polyoxyethylene alkyl (C12, C13) ether phosphoric acid ester), PLYSURF A208F (polyoxyethylene alkyl (C8) ether phosphoric acid ester), PLYSURF A208B (polyoxyethylene lauryl ether phosphoric acid ester), PLYSURF A219B (polyoxyethylene lauryl ether phosphoric acid ester), PLYSURF AL (polyoxyethylene styrenated phenylether phosphoric acid ester), PLYSURF A212C (polyoxyethylene tridecyl ether phosphoric acid ester), or PLYSURF A215C (polyoxyethylene tridecyl ether phosphoric acid ester). All of these are products manufactured by DKS Co., Ltd. The phosphoric acid ester can be NIKKOL DDP-2 (polyoxyethylene alkyl ether phosphoric acid ester), NIKKOL DDP-4 (polyoxyethylene alkyl ether phosphoric acid ester), or NIKKOL DDP-6 (polyoxyethylene alkyl ether phosphoric acid ester). All of these are products manufactured by Nikko Chemicals Co., Ltd.

The matrix resin included in the light-absorbing layer 10 is, for example, a heat-curable or ultraviolet-curable resin in which the light absorber is dispersible. Additionally, as the matrix resin can be used a resin that has a transmittance of, for example, 80% or more, preferably 85% or more, and more preferably 90% or more for light with a wavelength of 350 nm to 900 nm in the form of a 0.1-mm-thick resin layer. The matrix resin is not limited to a particular resin as long as the optical filter 1*a* satisfies the above requirements (1) to (18). The content of the phosphonic acid in the light-absorbing layer 10 is, for example, 3 to 180 parts by mass with respect to 100 parts by mass of the matrix resin.

The matrix resin included in the light-absorbing layer 10 is, for example, a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, or silicone resin. The matrix resin may contain an aryl group such as a phenyl group and is desirably a silicone resin containing an aryl group such as a phenyl group. If the light-absorbing layer 10 is excessively hard, the likelihood of cure shrinkage-induced cracking during the production process of the optical filter 1*a* increases with increasing thickness of the light-absorbing layer 10. When the matrix resin is a silicone resin containing an aryl group, the light-absorbing layer 10 is likely to have high crack resistance. Moreover, with the use of a silicone resin containing an aryl group, the light absorber formed by the above phosphonic acid and copper ion is less likely to be aggregated when included. Further, when the matrix resin of the light-absorbing layer 10 is a silicone resin containing an aryl group, it is desirable for the phosphoric acid ester included in the light-absorbing layer 10 to have a flexible, linear organic functional group, such as an oxyalkyl group, just as does the phosphoric acid ester represented by the formula (c1) or formula (c2). This is because interaction derived from the combination of the above phosphonic acid, a silicone resin containing an aryl group, and phosphoric acid ester having a linear organic functional group such as an oxyalkyl group makes aggregation of the light absorber less likely and can impart good rigidity and good flexibility to the light-absorbing layer. Specific examples of the silicone resin available as the matrix resin include KR-255, KR-300, KR-2621-1, KR-211, KR-311, KR-216, KR-212, KR-251, and KR-5230. All of these are silicone resins manufactured by Shin-Etsu Chemical Co., Ltd.

Examples of the hydrolytic polycondensation product of an alkoxysilane monomer, the hydrolytic polycondensation product possibly being included in the optical filter 1a, include hydrolytic polycondensation products of the following alkoxysilane monomers. The alkoxysilane monomers are tetramethoxysilane, tetraethoxysilane, methyltrimethoxysilane, methyltriethoxysilane, dimethyldiethoxysilane, dimethyldimethoxysilane, phenyltrimethoxysilane, phenyltriethoxysilane, 3-glycidoxypropyltrimethoxysilane, 3-glycidoxypropyltriethoxysilane, and 3-glycidoxypropylmethyldiethoxysilane.

As shown in FIG. 1A, the optical filter 1a further includes, for example, a transparent dielectric substrate 20. One principal surface of the transparent dielectric substrate 20 is covered with the light-absorbing layer 10. The characteristics of the transparent dielectric substrate 20 are not particularly limited as long as the optical filter 1a satisfies the above requirements (1) to (18). The transparent dielectric substrate 20 is a dielectric substrate having a high average transmittance (for example, 80% or more, preferably 85% or more, and more preferably 90% or more) in the wavelength range of, for example, 450 nm to 600 nm.

The transparent dielectric substrate 20 is, for example, made of glass or resin. When the transparent dielectric substrate 20 is made of glass, the glass is, for example, borosilicate glass such as D 263 T eco, soda-lime glass (blue plate glass), white sheet glass such as B 270, alkali-free glass, or infrared-absorbing glass such as copper-containing phosphate glass or copper-containing fluorophosphate glass. When the transparent dielectric substrate 20 is made of infrared-absorbing glass such as copper-containing phosphate glass or copper-containing fluorophosphate glass, the desired infrared absorption performance can be imparted to the optical filter 1a by a combination of the infrared absorption performance of the transparent dielectric substrate 20 and the infrared absorption performance of the light-absorbing layer 10. Examples of such an infrared-absorbing glass include BG-60, BG-61, BG-62, BG-63, and BG-67 manufactured by SCHOTT AG, 500EXL manufactured by Nippon Electric Glass Co., Ltd., and CM5000, CM500, C5000, and C500S manufactured by HOYA CORPORATION. Moreover, the transparent dielectric substrate 20 may have ultraviolet absorption characteristics.

The transparent dielectric substrate 20 may be a transparent crystalline substrate, such as magnesium oxide, sapphire, or quartz. For example, sapphire is very hard and is thus scratch resistant. Therefore, as a scratch-resistant protective material such as a protective filter or cover glass in an imaging apparatus, a sheet-shaped sapphire is sometimes disposed ahead of a camera module or lens included in mobile devices such as smartphones and mobile phones. Formation of the light-absorbing layer 10 on such a sheet-shaped sapphire makes it possible to protect camera modules and lenses and cut off unnecessary light such as infrared light.

When the transparent dielectric substrate 20 is made of resin, the resin is, for example, a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, or silicone resin.

The optical filter 1a can be produced, for example, by applying a coating liquid for forming the light-absorbing layer 10 to one principal surface of the transparent dielectric substrate 20 to form a film and drying the film. The method for preparing the coating liquid and the method for producing the optical filter 1a will be described with an example in which the light-absorbing layer 10 includes the light absorber formed by the phosphonic acid and copper ion.

First, an exemplary method for preparing the coating liquid will be described. A copper salt such as copper acetate monohydrate is added to a given solvent such as tetrahydrofuran (THF), followed by stirring to obtain a copper salt solution. To this copper salt solution is then added a phosphoric acid ester compound such as a phosphoric acid diester represented by the formula (c1) or a phosphoric acid monoester represented by the formula (c2), followed by stirring to prepare a solution A. The first phosphonic acid is added to a given solvent such as THF, followed by stirring to prepare a solution B. When the solution B includes a plurality of first phosphonic acids, the solution B may be prepared by adding each of the phosphonic acids to a given solvent such as THF, stirring each of the resultant mixtures, and mixing the plurality of liquids thus prepared. When the optical filter 1a includes the hydrolytic polycondensation product of the alkoxysilane monomer, for example, the alkoxysilane monomer is further added to prepare the solution B.

Next, the solution B is added to the solution A while the solution A is stirred, and the mixture is further stirred for a given period of time. To the resultant solution is then added a given solvent such as toluene, followed by stirring to obtain a solution C. Subsequently, the solution C is subjected to solvent removal under heating for a given period of time to obtain a solution D. This process removes the solvent such as THF and the component such as acetic acid (boiling point: about 118° C.) generated by disassociation of the copper salt and yields a light absorber formed by the first phosphonic acid and copper ion. The temperature at which the solution C is heated is chosen based on the boiling point of the to-be-removed component disassociated from the copper salt. During the solvent removal, the solvent such as toluene (boiling point: about 110° C.) used to obtain the solution C is also evaporated. A certain amount of this solvent desirably remains in the coating liquid. This is preferably taken into account in determining the amount of the solvent to be added and the time period of the solvent removal. To obtain the solution C, o-xylene (boiling point: about 144° C.) may be used instead of toluene. In this case, the amount of o-xylene to be added can be reduced to about one-fourth of the amount of toluene to be added, because the boiling point of o-xylene is higher than the boiling point of toluene. A matrix resin such as a silicone resin is added to the solution D, followed by stirring. The coating liquid can thus be prepared.

The coating liquid is applied to one principal surface of the transparent dielectric substrate 20 to form a film. For example, the coating liquid is applied to one principal surface of the transparent dielectric substrate 20 by die coating or spin coating or with a dispenser to form a film. Next, this film is cured by a given heat treatment. For example, the film is exposed to an environment at a temperature of 50° C. to 200° C. for a given period of time.

The coating liquid may further contain the second phosphonic acid. In this case, the coating liquid is prepared, for example, by mixing and stirring the solution D, a solution H containing the second phosphonic acid, and a matrix resin. The solution H can be prepared, for example, in the following manner.

A copper salt such as copper acetate monohydrate is added to a given solvent such as tetrahydrofuran (THF), followed by stirring to obtain a copper salt solution. To this copper salt solution is then added a phosphoric acid ester compound such as a phosphoric acid diester represented by the formula (c1) or a phosphoric acid monoester represented by the formula (c2), followed by stirring to prepare a solution E. The second phosphonic acid is added to a given solvent such as THF, followed by stirring to prepare a solution F. Next, the solution F is added to the solution E while the solution E is stirred, and the mixture is further stirred for a given period of time. To the resultant solution is then added a given solvent such as toluene, followed by stirring to obtain a solution G. Subsequently, the solution G is subjected to solvent removal under heating for a given period of time to obtain a solution H.

The light-absorbing layer 10 of the optical filter 1a may be formed as a single layer or may be formed as a plurality of layers. When the light-absorbing layer 10 is formed as a plurality of layers, the light-absorbing layer 10 includes, for example, a first layer including the light absorber formed by the first phosphonic acid and copper ion and a second layer including the light absorber formed by the second phosphonic acid and copper ion. In this case, a coating liquid for forming the first layer can be obtained by adding a matrix resin such as a silicone resin to the solution D and stirring the mixture. The second layer is formed using a coating liquid prepared separately from the coating liquid for forming the first layer. The coating liquid for forming the second layer can be obtained, for example, by adding a matrix resin such as a silicone resin to the solution H and stirring the mixture.

The first and second layers can be formed by applying the coating liquid for forming the first layer and that for forming the second layer to form films, which are cured by a given heat treatment. For example, the films are exposed to an environment at a temperature of 50° C. to 200° C. for a given period of time. The order of forming the first and second layers is not particularly limited. The first and second layers may be formed in different time periods, or may be formed in the same time period. A protective layer may be formed between the first and second layers. The protective layer is formed of, for example, a $SiO_2$-deposited film.

<Modifications>

The optical filter 1a can be modified in various respects. For example, the optical filter 1a may be modified to optical filters 1b to 1e shown in FIG. 1B to FIG. 1E. The optical filters 1b to 1e are configured in the same manner as the optical filter 1a, unless otherwise described. The components of the optical filters 1b to 1e that are the same as or correspond to those of the optical filter 1a are denoted by the same reference characters, and detailed descriptions of such components are omitted. The description given for the optical filter 1a can apply to the optical filters 1b to 1e, unless there is technical inconsistency.

Figure 1B:
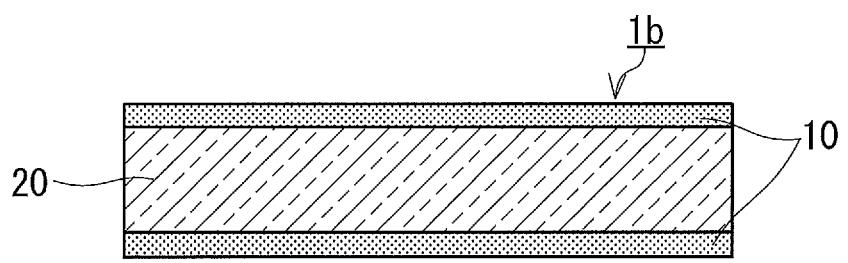
FIG. 1B is a cross-sectional view of another example of the optical filter of the present invention.

As shown in FIG. 1B, the optical filter 1b has the light-absorbing layers 10 formed on both principal surfaces of the transparent dielectric substrate 20. Therefore, the above requirements (1) to (18) are satisfied not by one light-absorbing layer 10 but by the two light-absorbing layers 10 separated by the transparent dielectric substrate 20. The light-absorbing layers 10 on both principal surfaces of the transparent dielectric substrate 20 may have the same or different thicknesses. That is, the formation of the light-absorbing layers 10 on both principal surfaces of the transparent dielectric substrate 20 is done so that the two light-absorbing layers 10 account for equal or unequal proportions of the light-absorbing layer thickness required for the optical filter 1b to have desired optical characteristics. Thus, each of the light-absorbing layers 10 formed on both principal surfaces of the transparent dielectric substrate 20 of the optical filter 1b has a smaller thickness than the thickness of the light-absorbing layer 10 of the optical filter 1a. The formation of the light-absorbing layers 10 on both principal surfaces of the transparent dielectric substrate 20 can reduce warping of the optical filter 1b even when the transparent dielectric substrate 20 is thin. Each of the two light-absorbing layers 10 may be formed as a plurality of layers.

Figure 1C:
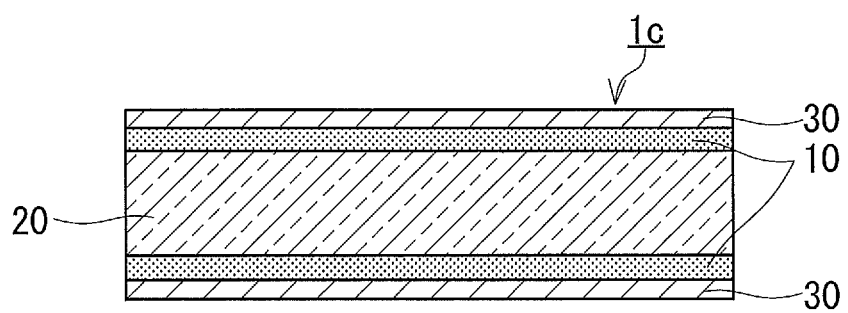
FIG. 1C is a cross-sectional view of yet another example of the optical filter of the present invention.

As shown in FIG. 1C, the optical filter 1c has the light-absorbing layers 10 formed on both principal surfaces of the transparent dielectric substrate 20. The optical filter 1c additionally includes an anti-reflection film 30. The anti-reflection film 30 is a film formed as an interface between the optical filter 1c and air and reducing reflection of visible light. The anti-reflection film 30 is, for example, a film formed of a dielectric made of, for example, a resin, an oxide, or a fluoride. The anti-reflection film 30 may be a multilayer film formed by laminating two or more types of dielectrics having different refractive indices. The anti-reflection film 30 may be, particularly, a dielectric multilayer film made of a low-refractive-index material such as $SiO_2$ and a high-refractive-index material such as $TiO_2$ or $Ta_2O_5$. In this case, Fresnel reflection at the interface between the optical filter 1c and air is reduced and the amount of visible light transmitted through the optical filter 1c can be increased. The anti-reflection film 30 may be formed on both sides of the optical filter 1c, or may be formed on one side thereof.

Figure 1D:
FIG. 1D is a cross-sectional view of yet another example of the optical filter of the present invention.

As shown in FIG. 1D, the optical filter 1d consists only of the light-absorbing layer 10. The optical filter 1d can be produced, for example, by applying the coating liquid onto a given substrate such as a glass substrate, resin substrate, or metal substrate (such as a steel substrate or stainless steel substrate) to form a film, curing the film, and then separating the film from the substrate. The optical filter 1d may be produced by casting. Not including the transparent dielectric substrate 20, the optical filter 1d is thin. The optical filter 1d can thus contribute more to achievement of lower-profile imaging apparatuses.

Figure 1E:
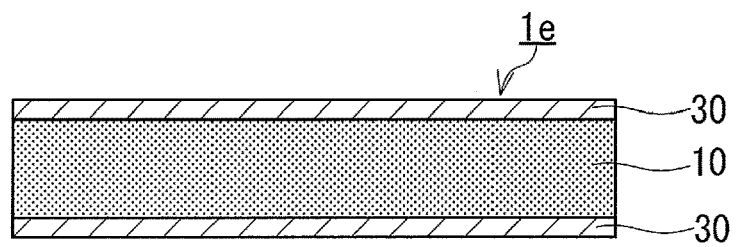
FIG. 1E is a cross-sectional view of yet another example of the optical filter of the present invention.

As shown in FIG. 1E, the optical filter 1e includes the light-absorbing layer 10 and a pair of the anti-reflection films 30 disposed on both sides of the light-absorbing layer 10. In this case, the optical filter 1e can contribute to achievement of lower-profile imaging apparatuses and can increase the amount of visible light transmitted therethrough more than the optical filter 1d can.

The optical filters 1a to 1e may be modified to include an infrared-absorbing layer (not shown) in addition to the light-absorbing layer 10, if necessary. The infrared-absorbing layer includes, for example, an organic infrared absorber, such as a cyanine-based, phthalocyanine-based, squarylium-based, diimmonium-based, or azo-based infrared absorber or an infrared absorber composed of a metal complex. The infrared-absorbing layer includes, for example, one infrared absorber or two or more infrared absorbers selected from these infrared absorbers. The organic infrared absorber can absorb light in a relatively narrow wavelength range (absorption band) and is suitable for absorbing light with a given wavelength range.

The optical filters 1a to 1e may be modified to include an ultraviolet-absorbing layer (not shown) in addition to the light-absorbing layer 10, if necessary. The ultraviolet-absorbing layer includes, for example, an ultraviolet absorber, such as a benzophenone-based, triazine-based, indole-based, merocyanine-based, or oxazole-based ultraviolet absorber. The ultraviolet-absorbing layer, for example, includes one ultraviolet absorber or two or more ultraviolet absorbers selected from these ultraviolet absorbers. The ultraviolet absorber can include ultraviolet absorbers that absorbs ultraviolet light with a wavelength around, for example, 300 nm to 340 nm, emits light (fluorescence) with a wavelength longer than the absorbed wavelength, and functions as a fluorescent agent or fluorescent brightener. The ultraviolet-absorbing layer can reduce incidence of ultraviolet light which deteriorates the materials, such as resin, used in the optical filter.

The above infrared absorber and/or ultraviolet absorber may be contained beforehand in the transparent dielectric substrate 20 made of resin to form a substrate having characteristics of absorbing infrared light and/or ultraviolet light. In this case, it is necessary for the resin to allow the infrared absorber and/or ultraviolet absorber to be appropriately dissolved or dispersed therein and be transparent. Examples of such a resin include a (poly)olefin resin, polyimide resin, polyvinyl butyral resin, polycarbonate resin, polyamide resin, polysulfone resin, polyethersulfone resin, polyamideimide resin, (modified) acrylic resin, epoxy resin, and silicone resin.

Figure 2:
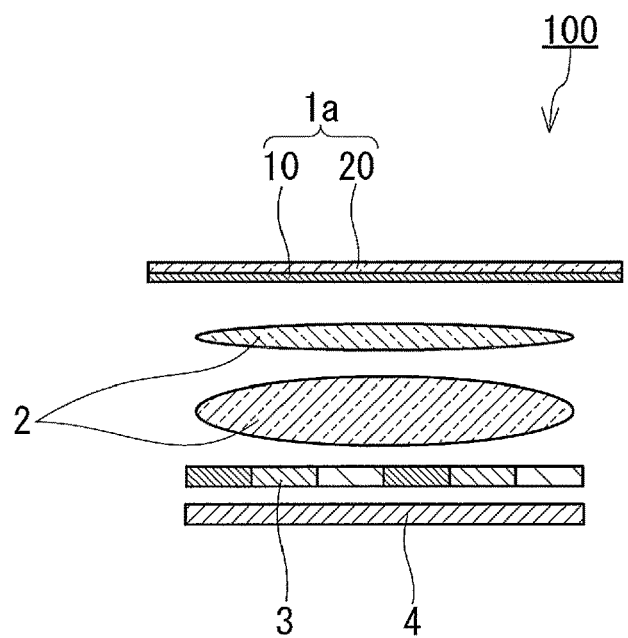
FIG. 2 is a cross-sectional view showing an example of an imaging apparatus according to the present invention.

As shown in FIG. 2, the optical filter 1a is used to produce, for example, an imaging apparatus 100 (camera module). The imaging apparatus 100 includes a lens system 2, an imaging device 4, and the optical filter 1a. Since the optical filter 1a satisfies the above requirements (1) to (18), an image generated by the imaging apparatus 100 is unlikely to be colored unevenly.

As shown in FIG. 2, the imaging apparatus 100 further includes, for example, a color filter 3 that is disposed ahead of the imaging device 4 and is a filter of three colors, R (red), G (green), and B (blue). The optical filter 1a is disposed ahead of the color filter 3. The color filter 3 and imaging device 4 receive light having been transmitted through the lens system 2. The light-absorbing layer 10 is, for example, arranged to be in contact with a side of the transparent dielectric substrate 20, the side being closer to the lens system 2. As described previously, the protecting effect on the lens system 2 or imaging device 4 increases when a hard material such as sapphire is used as the transparent dielectric substrate 20. For example, in the color filter 3, the three colors, R (red), G (green), and B (blue), are arranged in a matrix, and each of the R (red), G (green), and B (blue) colors is disposed immediately above a pixel of the imaging device 4. The imaging device 4 receives light coming from an object and having been transmitted through the lens system 2, optical filter 1a, and color filter 3. The imaging apparatus 100 generates an image based on information on electric charge produced by the light received by the imaging device 4. The color filter 3 and imaging device 4 may be combined to configure a color image sensor.

The imaging apparatus 100 may be modified so that the optical filter 1a will be disposed adjacent to the color filter 3. The imaging apparatus 100 may also be modified to include at least one of the optical filters 1b to 1e instead of the optical filter 1a or in addition to the optical filter 1a.

EXAMPLES

The present invention will be described in more detail by examples. The present invention is not limited to the examples given below.

<Measurement of Transmittance Spectra>

Transmittance spectra shown upon incidence of light with wavelengths of 300 to 1200 nm on optical filters according to Examples and Comparative Examples, intermediate products of some of the optical filters according to Examples and Comparative Examples, and laminates according to Reference Examples were measured using an ultraviolet-visible spectrophotometer (manufactured by JASCO Corporation, product name: V-670). In the transmittance spectrum measurement, the incident angle of incident light was set to at least any one of 0°, 30°, 35°, 40°, 45°, 50°, 55°, 60°, and 65°. From the results of the measurement of the transmittance spectrum shown by each of the optical filters according to Examples and Comparative Examples at each incident angle, a spectral transmittance curve (normalized spectral transmittance curve) normalized so that the maximum of the spectral transmittance in the wavelength range of 400 to 650 nm would be 100% was obtained for each incident angle.

Example 1

1.125 g of copper acetate monohydrate ($(CH_3COO)_2Cu.H_2O$) and 60 g of tetrahydrofuran (THF) were mixed and stirred for 3 hours to obtain a copper acetate solution. To the obtained copper acetate solution was then added 0.412 g of PLYSURF A208N (manufactured by DKS Co., Ltd.) which is a phosphoric acid ester compound, followed by stirring for 30 minutes to obtain a solution A. 10 g of THF was added to 0.176 g of phenylphosphonic acid ($C_6H_5PO(OH)_2$) (manufactured by Nissan Chemical Industries, Ltd.), followed by stirring for 30 minutes to obtain a solution B1-1. 10 g of THF was added to 1.058 g of 4-bromophenylphosphonic acid ($C_6H_4BrPO(OH)_2$) (manufactured by Tokyo Chemical Industry Co., Ltd.), followed by stirring for 30 minutes to obtain a solution B1-2. Next, the solutions B1-1 and B1-2 were mixed and stirred for 1 minute. 2.166 g of methyltriethoxysilane (MTES: $CH_3Si(OC_2H_5)_3$) (manufactured by Shin-Etsu Chemical Co., Ltd.) and 0.710 g of tetraethoxysilane (TEOS: $Si(OC_2H_5)_4$) (manufactured by KISHIDA CHEMICAL Co., Ltd., special grade) were added, and the mixture was further stirred for 1 minute to obtain a solution B1. The solution B1 was added to the solution A while the solution A was stirred, and the mixture was stirred at room temperature for 1 minute. To the resultant solution was then added 25 g of toluene, followed by stirring at room temperature for 1 minute to obtain a solution C1. The solution C1 was placed in a flask and subjected to solvent removal using a rotary evaporator (manufactured by Tokyo Rikakikai Co., Ltd., product code: N-1110SF) under heating by means of an oil bath (manufactured by Tokyo Rikakikai Co., Ltd., product code: OSB-2100). The temperature of the oil bath was controlled to 105° C. The solution having undergone the solvent removal was then collected from the flask. A solution D1 was thus obtained. The solution D1 was a dispersion of fine particles of copper phenyl-based phosphonate (light absorber) including copper phenylphosphonate and copper 4-bromophenylphosphonate. The solution D1 was transparent, and the fine particles of the light absorber were well dispersed therein.

1.125 g of copper acetate monohydrate and 36 g of THF were mixed and stirred for 3 hours to obtain a copper acetate solution. To the obtained copper acetate solution was then added 0.643 g of PLYSURF A208N which is a phosphoric acid ester compound, followed by stirring for 30 minutes to obtain a solution E1. 10 g of THF was added to 0.722 g of n-butylphosphonic acid ($C_4H_9PO(OH)_2$) (manufactured by Nippon Chemical Industrial Co., Ltd.), followed by stirring for 30 minutes to obtain a solution F1. The solution F1 was added to the solution E1 while the solution E1 was stirred, and the mixture was stirred at room temperature for 1 minute. To the resultant solution was then added 25 g of toluene, followed by stirring at room temperature for 1 minute to obtain a solution G1. The solution G1 was placed in a flask and subjected to solvent removal using a rotary evaporator under heating by means of an oil bath. The temperature of the oil bath was controlled to 105° C. The solution having undergone the solvent removal was then collected from the flask. A solution E11 was thus obtained. The solution E11 was a dispersion of fine particles of copper butylphosphonate. The solution E11 was transparent, and the fine particles were well dispersed therein.

To the solution D1 was added 2.200 g of a silicone resin (manufactured by Shin-Etsu Chemical Co., Ltd., product name: KR-300), followed by stirring for 30 minutes to obtain a solution I1. The solution E11 was added to the solution I1, followed by stirring for 30 minutes to obtain a light-absorbing composition according to Example 1.

Figure 3A:
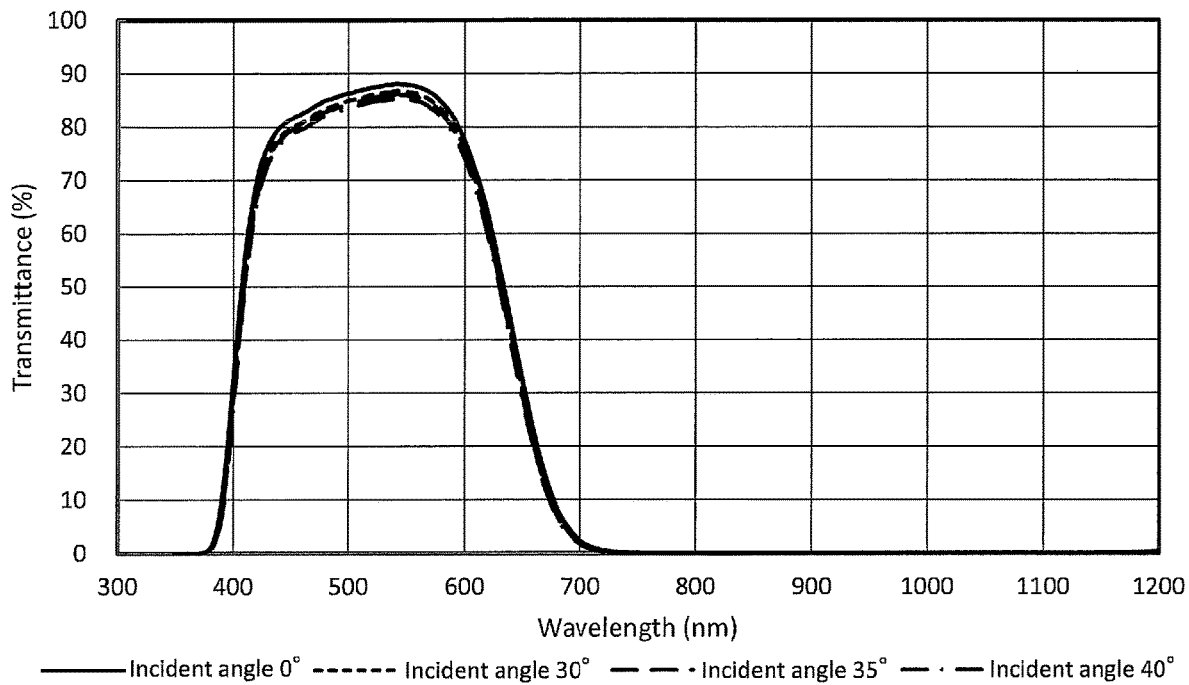
FIG. 3A shows transmittance spectra shown by an optical filter according to Example 1 for light incident at incident angles of 0°, 30°, 35°, and 40°.
Figure 3B:
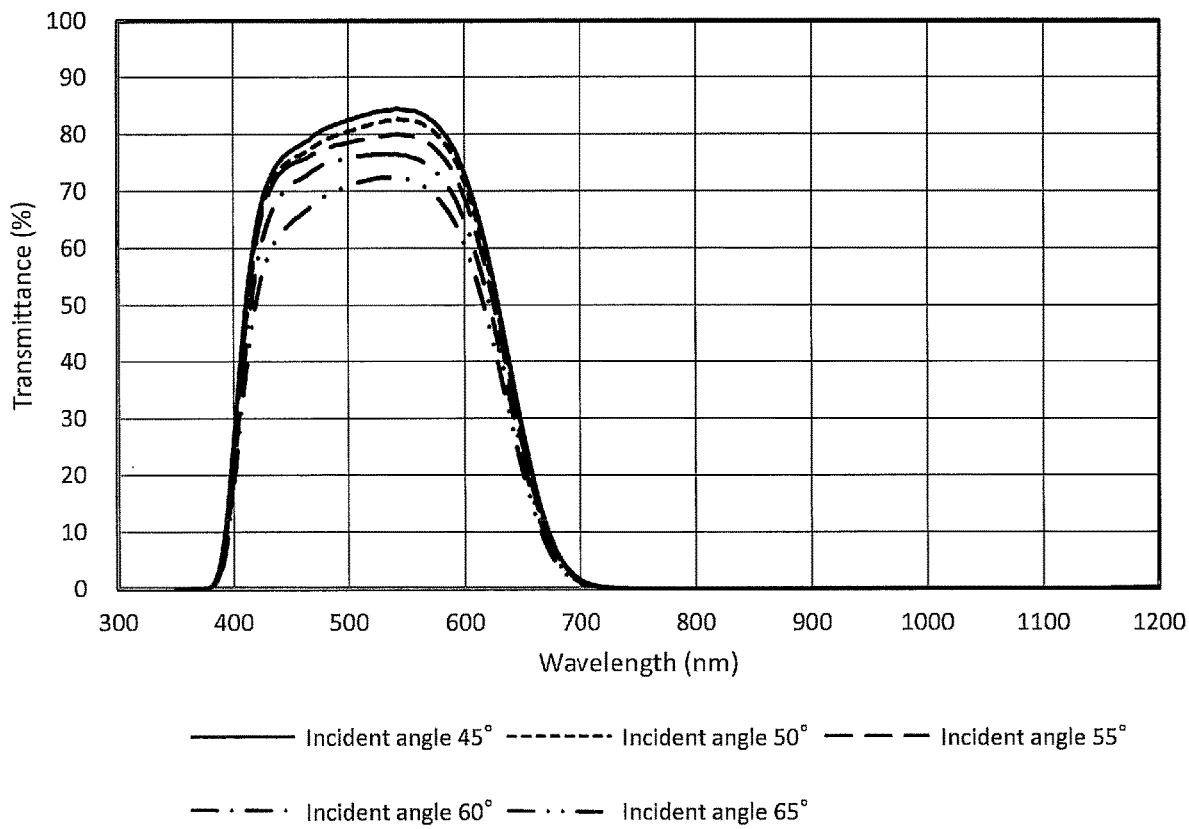
FIG. 3B shows transmittance spectra shown by the optical filter according to Example 1 for light incident at incident angles of 45°, 50°, 55°, 60°, and 65°.
Figure 4A:
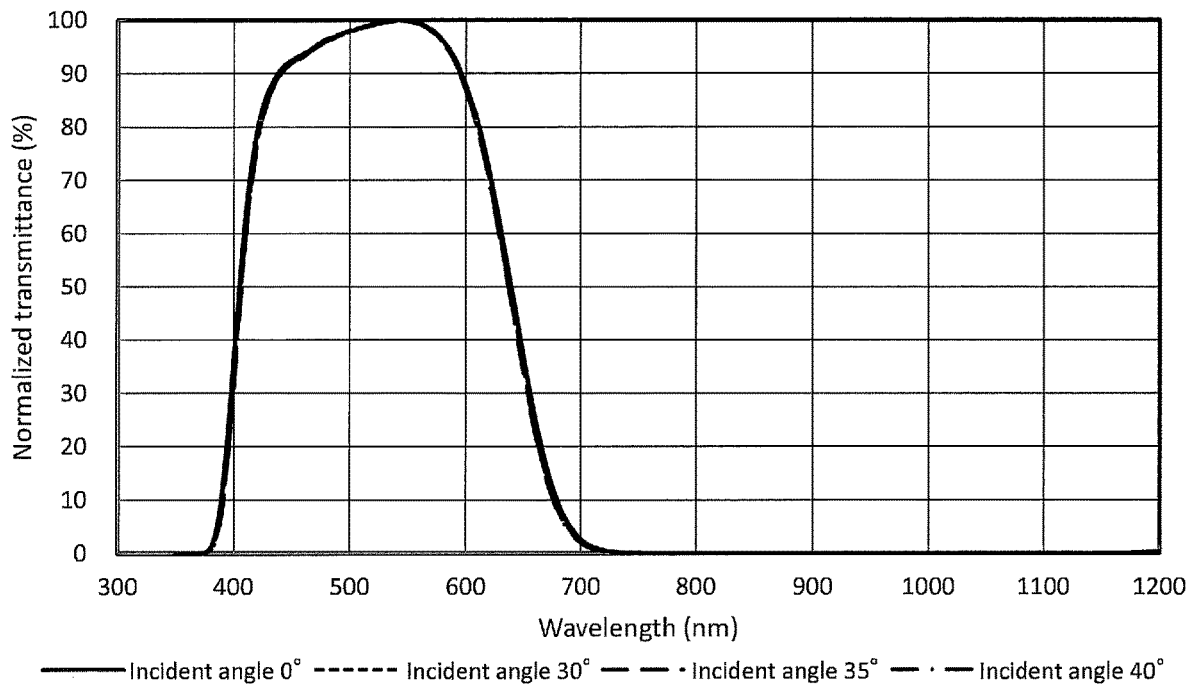
FIG. 4A shows normalized transmittance spectra shown by the optical filter according to Example 1 for light incident at incident angles of 0°, 30°, 35°, and 40°.
Figure 4B:
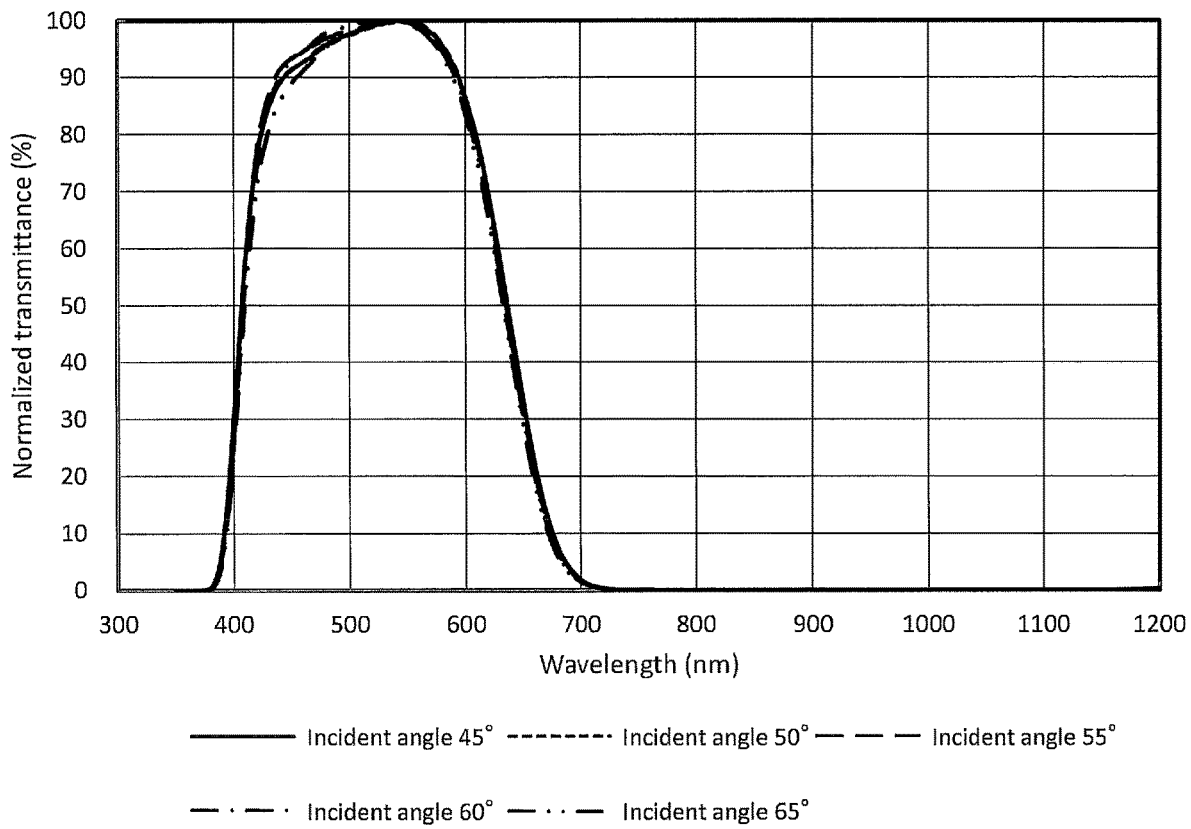
FIG. 4B shows normalized transmittance spectra shown by the optical filter according to Example 1 for light incident at incident angles of 45°, 50°, 55°, 60°, and 65°.

The light-absorbing composition according to Example 1 was applied with a dispenser to a 30 mm×30 mm central region of each surface of a transparent glass substrate (manufactured by SCHOTT AG, product name: D 263 T eco) made of borosilicate glass and having dimensions of 76 mm×76 mm×0.07 mm. Films were thus formed on the substrate. When the light-absorbing composition was applied to the transparent glass substrate, a frame having an opening corresponding in dimensions to the region where the film-forming liquid was applied was put on the transparent glass substrate to hold back the film-forming liquid and prevent the film-forming liquid from spreading. After the application to one surface of the transparent glass substrate, the transparent glass substrate was left at ordinary temperature until the applied light-absorbing composition lost its flowability. Then, the light-absorbing composition was applied also to the other surface of the transparent glass substrate in the same manner. The amount of the light-absorbing composition applied was determined so that the sum of the thicknesses of the layers which were originally the light-absorbing composition films and were formed on both surfaces of the transparent glass substrate would eventually be about 180 μm. Subsequently, the transparent glass substrate with the undried light-absorbing composition films was placed in an oven and heat-treated at 85° C. for 6 hours to cure the film. After that, the transparent glass substrate with the films formed thereon was placed in a thermohygrostat set at a temperature of 85° C. and a relative humidity of 85% for a 20-hour humidification treatment. The humidification treatment was performed to promote hydrolysis and polycondensation of the alkoxysilane monomer contained in the light-absorbing composition applied onto the transparent glass substrate and form a hard and dense matrix of each light-absorbing layer. After that, a region with the light-absorbing layers formed on the transparent glass substrate was cut out to obtain an optical filter according to Example 1. The sum of the thicknesses of the light-absorbing layers on both surfaces of the optical filter according to Example 1 is 183 μm. Transmittance spectra shown by the optical filter according to Example 1 at incident angles of 0°, 30°, 35°, 40°, 45°, 50°, 55°, 60°, and 65° are shown in FIGS. 3A and 3B. Values of characteristics derived from the transmittance spectrum shown by the optical filter according to Example 1 at an incident angle of 0° are shown in Table 1. Normalized spectral transmittance curves shown by the optical filter according to Example 1 at incident angles of 0°, 30°, 35°, 40°, 45°, 50°, 55°, 60°, and 65° are shown in FIGS. 4A and 4B. Values of characteristics derived from the normalized spectral transmittance curves shown by the optical filter according to Example 1 are shown in Table 2.

As shown in Tables 1 and 2, the above requirements (1) to (18) are satisfied by the optical filter according to Example 1. For the optical filter according to Example 1, as shown in FIGS. 3A and 3B, the transmittances in a wavelength region of 380 nm or less and a wavelength region of 700 nm or more are sufficiently low, and the transmittances at a wavelength of 450 nm and in the wavelength range of 500 to 600 nm are sufficiently high. In other words, the optical filter according to Example 1 can favorably block light in the ultraviolet and near-infrared regions and has characteristics of allowing light in the visible region to be transmitted sufficiently. For the optical filter according to Example 1, as shown in FIGS. 4A and 4B, the normalized spectral transmittances for incident angles of 0° to 65° are sufficiently low in a wavelength region of 380 nm or less and a wavelength region of 700 nm or more, and the normalized spectral transmittances for incident angles of 0° to 65° are sufficiently high at a wavelength of 450 nm and in the wavelength range of 500 to 600 nm. Therefore, the optical filter according to Example 1 favorably blocks light in the ultraviolet and near-infrared regions and has characteristics advantageous to sufficiently transmit light in the visible region, even when sensitivity correction is made so as to cover a decrease in the amount of light in accordance with the angle of light assumed from a design viewpoint to be incident on an imaging device in an imaging apparatus. Additionally, each difference in shape between one and another of the normalized spectral transmittance curves shown by the optical filter according to Example 1 at the incident angles is small, and an image generated by an imaging apparatus employing the optical filter according to Example 1 is deemed to be unlikely to be colored unevenly.

Example 2

1.125 g of copper acetate monohydrate (($CH_3COO)_2Cu \cdot H_2O$) and 60 g of tetrahydrofuran (THF) were mixed and stirred for 3 hours to obtain a copper acetate solution. To the obtained copper acetate solution was then added 0.412 g of PLYSURF A208N (manufactured by DKS Co., Ltd.) which is a phosphoric acid ester compound, followed by stirring for 30 minutes to obtain a solution A. 10 g of THF was added to 0.441 g of phenylphosphonic acid ($C_6H_5PO(OH)_2$) (manufactured by Nissan Chemical Industries, Ltd.), followed by stirring for 30 minutes to obtain a solution B2-1. 10 g of THF was added to 0.661 g of 4-bromophenylphosphonic acid ($C_6H_4BrPO(OH)_2$) (manufactured by Tokyo Chemical Industry Co., Ltd.), followed by stirring for 30 minutes to obtain a solution B2-2. Next, the solutions B2-1 and B2-2 were mixed and stirred for 1 minute. 1.934 g of methyltriethoxysilane (MTES: $CH_3Si(OC_2H_5)_3$) (manufactured by Shin-Etsu Chemical Co., Ltd.) and 0.634 g of tetraethoxysilane (TEOS: $Si(OC_2H_5)_4$) (manufactured by KISHIDA CHEMICAL Co., Ltd., special grade) were added, and the mixture was further stirred for 1 minute to obtain a solution B2. The solution B2 was added to the solution A while the solution A was stirred, and the mixture was stirred at room temperature for 1 minute. To the resultant solution was then added 25 g of toluene, followed by stirring at room temperature for 1 minute to obtain a solution C2. The solution C2 was placed in a flask and subjected to solvent removal using a rotary evaporator (manufactured by Tokyo Rikakikai Co., Ltd., product code: N-1110SF) under heating by means of an oil bath (manufactured by Tokyo Rikakikai Co., Ltd., product code: OSB-2100). The temperature of the oil bath was controlled to 105° C. The solution having undergone the solvent removal was then collected from the flask. A solution D2 was thus obtained. The solution D2 was a dispersion of fine particles of copper phenyl-based phosphonate (light absorber) including copper phenylphosphonate and copper 4-bromophenylphosphonate. The solution D2 was transparent, and the fine particles were well dispersed therein.

1.125 g of copper acetate monohydrate and 36 g of THF were mixed and stirred for 3 hours to obtain a copper acetate solution. To the obtained copper acetate solution was then added 0.710 g of PLYSURF A208N which is a phosphoric acid ester compound, followed by stirring for 30 minutes to obtain a solution E2. 10 g of THF was added to 0.708 g of n-butylphosphonic acid ($C_4H_9PO(OH)_2$) (manufactured by Nippon Chemical Industrial Co., Ltd.), followed by stirring for 30 minutes to obtain a solution F2. The solution F2 was added to the solution E2 while the solution E2 was stirred, and the mixture was stirred at room temperature for 1 minute. To the resultant solution was then added 25 g of toluene, followed by stirring at room temperature for 1 minute to obtain a solution G2. This solution G2 was placed in a flask and subjected to solvent removal using a rotary evaporator under heating by means of an oil bath. The temperature of the oil bath was controlled to 105° C. The solution having undergone the solvent removal was then collected from the flask. A solution H2 was thus obtained. The solution H2 was a dispersion of fine particles of copper butylphosphonate. The solution H2 was transparent, and the fine particles were well dispersed therein.

To the solution D2 was added 2.200 g of a silicone resin (manufactured by Shin-Etsu Chemical Co., Ltd., product name: KR-300), followed by stirring for 30 minutes to obtain a solution I2. The solution H2 was added to the solution I2, followed by stirring for 30 minutes to obtain a light-absorbing composition according to Example 2.

Figure 5A:
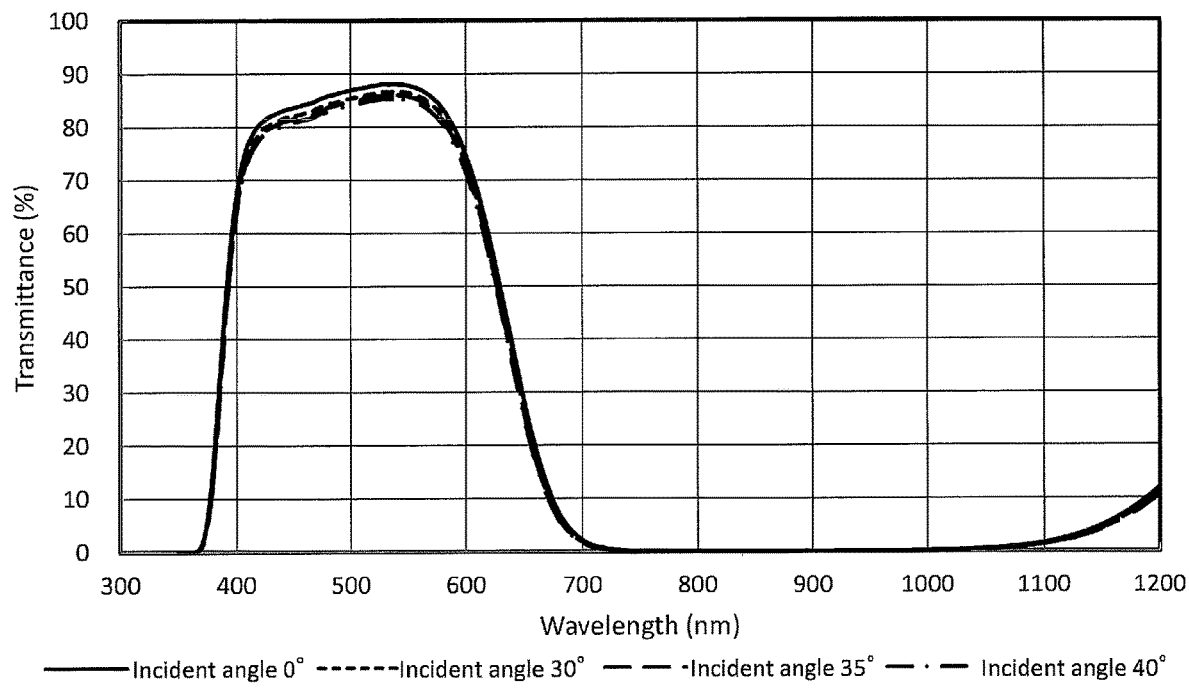
FIG. 5A shows transmittance spectra shown by an optical filter according to Example 2 for light incident at incident angles of 0°, 30°, 35°, and 40°.
Figure 5B:
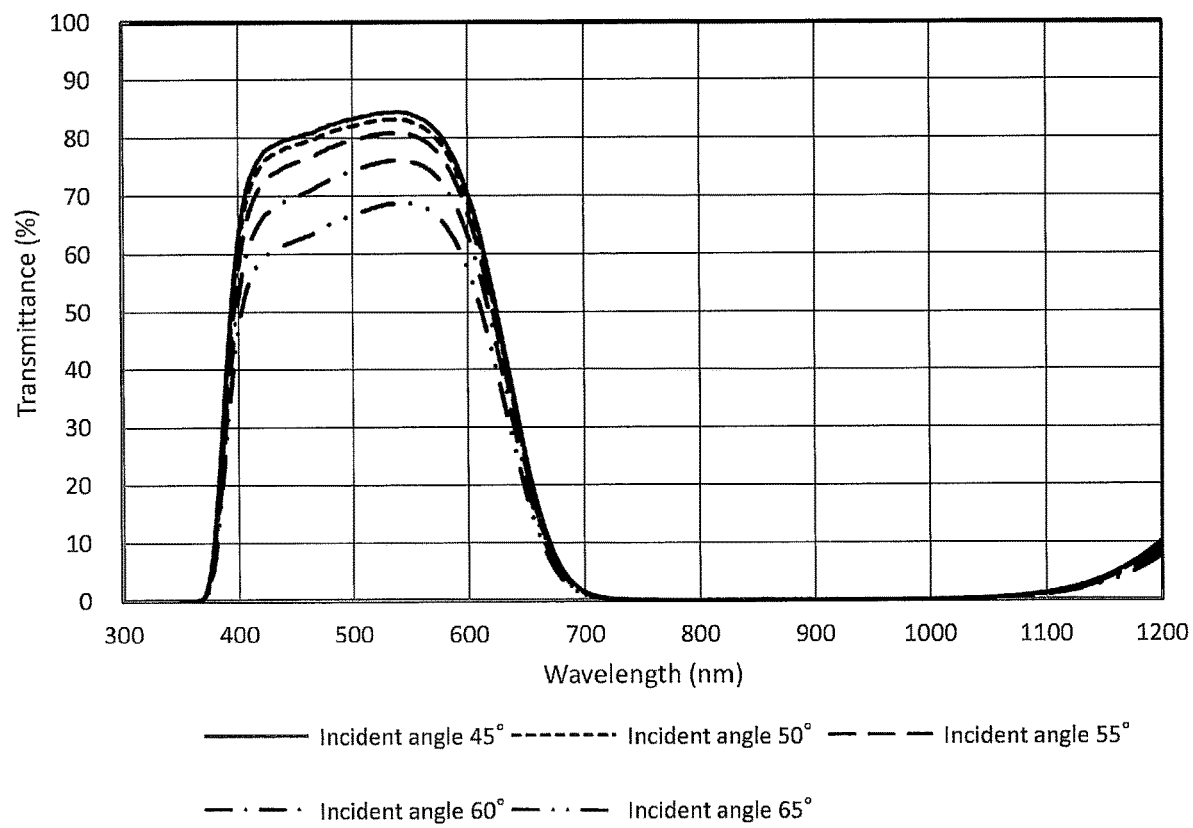
FIG. 5B shows transmittance spectra shown by the optical filter according to Example 2 for light incident at incident angles of 45°, 50°, 55°, 60°, and 65°.
Figure 6A:
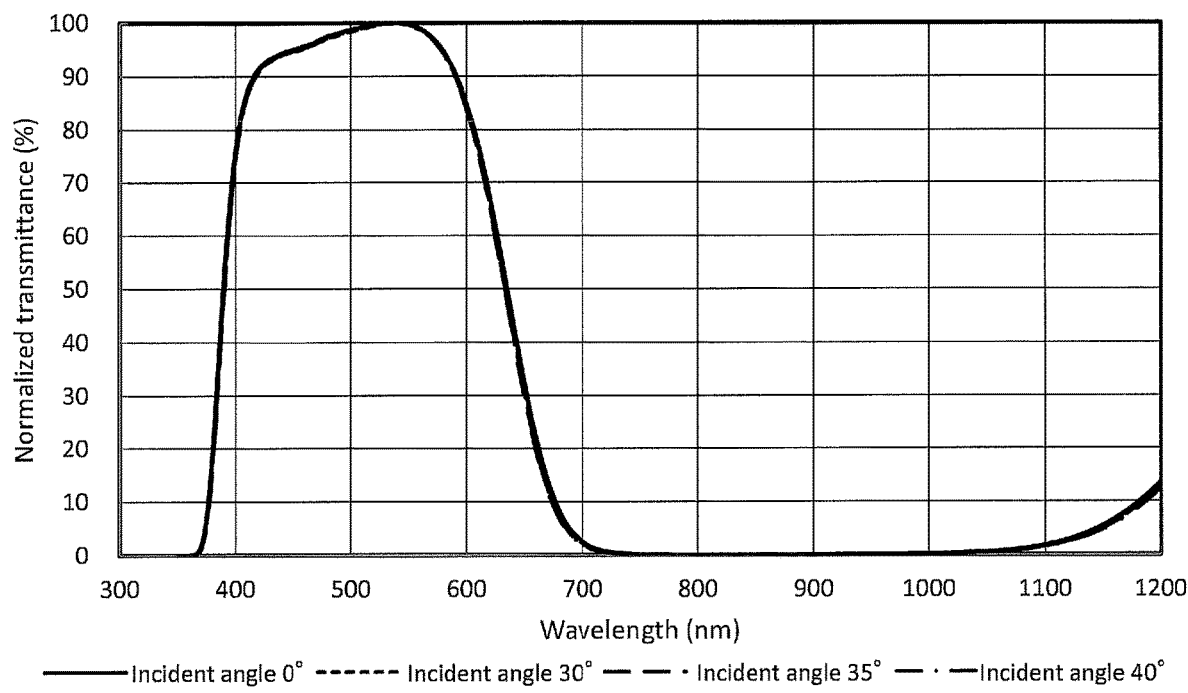
FIG. 6A shows normalized transmittance spectra shown by the optical filter according to Example 2 for light incident at incident angles of 0°, 30°, 35°, and 40°.
Figure 6B:
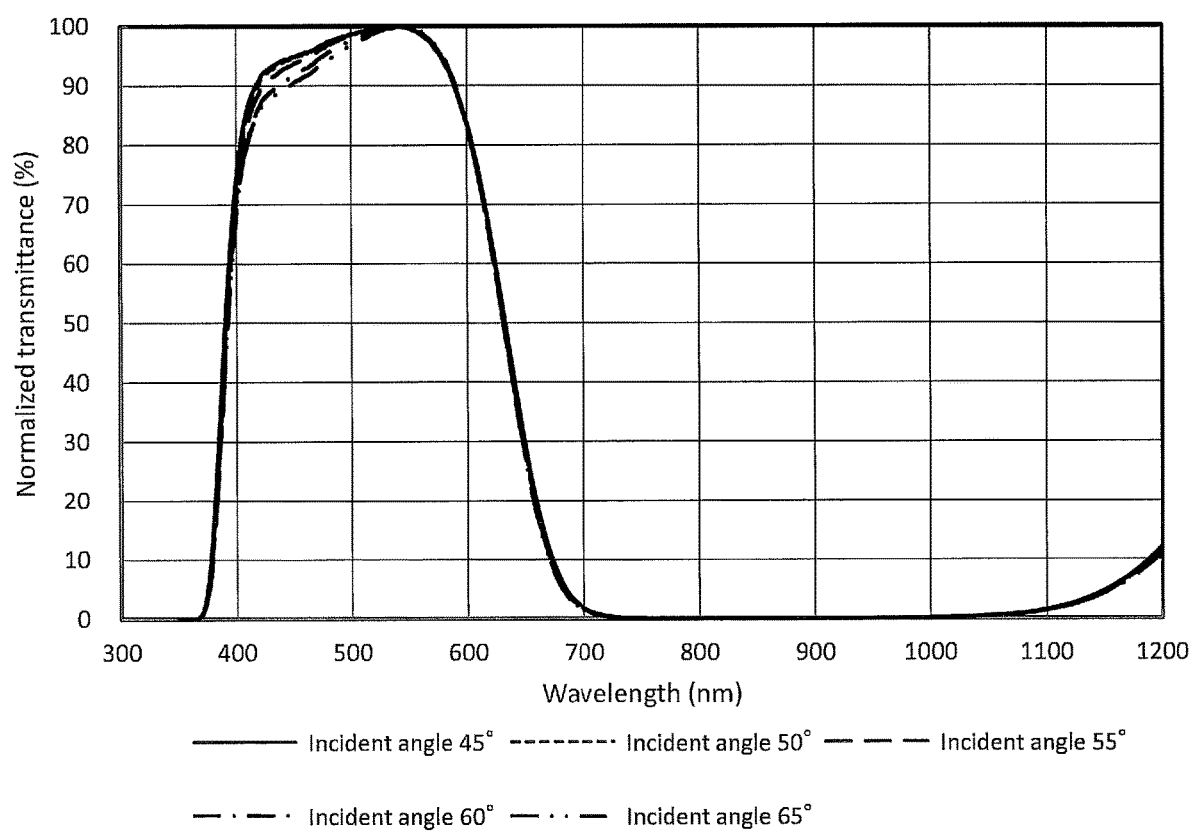
FIG. 6B shows normalized transmittance spectra shown by the optical filter according to Example 2 for light incident at incident angles of 45°, 50°, 55°, 60°, and 65°.

The light-absorbing composition according to Example 2 was applied with a dispenser to a 30 mm×30 mm central region of one principal surface of a transparent glass substrate (manufactured by SCHOTT AG, product name: D 263 T eco) made of borosilicate glass and having dimensions of 76 mm×76 mm×0.21 mm. A film was thus formed on the substrate. When the light-absorbing composition was applied to the transparent glass substrate, a frame having an opening corresponding in dimensions to the region where the film-forming liquid was applied was put on the transparent glass substrate to hold back the film-forming liquid and prevent the film-forming liquid from spreading. The amount of the light-absorbing composition applied was determined so that the thickness of the layer which was originally the light-absorbing composition film would eventually be about 170 μm. Subsequently, the transparent glass substrate with the undried light-absorbing composition film was placed in an oven and heat-treated at 85° C. for 6 hours to cure the film. After that, the transparent glass substrate with the film formed thereon was placed in a thermohygrostat set at a temperature of 85° C. and a relative humidity of 85% for a 20-hour humidification treatment. An optical filter according to Example 2 including a light-absorbing layer formed on a transparent glass substrate was thus obtained. The humidification treatment was performed to promote hydrolysis and polycondensation of the alkoxysilane monomer contained in the light-absorbing composition applied onto the transparent glass substrate and form a hard and dense matrix of the light-absorbing layer. After that, a region with the light-absorbing layer formed on a transparent glass substrate was cut out to obtain the optical filter according to Example 2. The thickness of the light-absorbing layer of the optical filter according to Example 2 is 170 μm. Transmittance spectra shown by the optical filter according to Example 2 at incident angles of 0°, 30°, 35°, 40°, 45°, 50°, 55°, 60°, and 65° are shown in FIGS. 5A and 5B. Values of characteristics derived from the transmittance spectrum shown by the optical filter according to Example 2 at an incident angle of 0° are shown in Table 3. Normalized spectral transmittance curves shown by the optical filter according to Example 2 at incident angles of 0°, 30°, 35°, 40°, 45°, 50°, 55°, 60°, and 65° are shown in FIGS. 6A and 6B. Values of characteristics derived from the normalized spectral transmittance curves shown by the optical filter according to Example 2 are shown in Table 4.

As shown in Tables 3 and 4, the above requirements (1) to (18) are satisfied by the optical filter according to Example 2. As shown in FIGS. 5A and 5B, a transmission band extends to a shorter wavelength side when the spectral transmittances of the optical filter according to Example 2 is observed in comparison with those of the optical filter according to Example 1, and the transmittance was slightly less than 20% at a wavelength of 380 nm. According to Japanese Industrial Standards (JIS) Z 8120, the short-wavelength limit in the wavelength range of an electromagnetic wave equivalent to a visible ray is 360 to 400 nm. It can be said that the transmittance of the optical filter according to Example 2 sharply increases around the short-wavelength limit of a visible ray with increase in wavelength. For the optical filter according to Example 2, transmission of a small amount of light was observed in a band of more than 1100 nm. In this band, however, common imaging devices have a low sensitivity. Therefore, incorporating the optical filter according to Example 2 in an imaging apparatus is not considered problematic in practical use.

For the optical filter according to Example 2, the transmittances in a wavelength region of less than 380 nm and a wavelength region of 700 nm or more, exclusive of a wavelength region of 1100 nm or more, are sufficiently low and the transmittances at a wavelength of 450 nm and in the wavelength range of 500 to 600 nm are sufficiently high. The optical filter according to Example 2 can favorably block light in the ultraviolet and near-infrared regions and has characteristics of allowing light in the visible region to be transmitted sufficiently. For the optical filter according to Example 2, as shown in FIGS. 6A and 6B, the normalized spectral transmittances for incident angles of 0° to 65° are sufficiently low in a wavelength region of less than 380 nm and a wavelength region of 700 nm or more exclusive of a wavelength region of 1100 nm or more, and the normalized spectral transmittances for incident angles of 0° to 65° are sufficiently high at a wavelength of 450 nm and in the wavelength range of 500 to 600 nm. Therefore, the optical filter according to Example 2 favorably blocks light in the ultraviolet and near-infrared regions and has characteristics advantageous to sufficiently transmit light in the visible region, even when sensitivity correction is made so as to cover a decrease in the amount of light in accordance with the angle of light assumed from a design viewpoint to be incident on an imaging device in an imaging apparatus. Additionally, each difference in shape between one and another of the normalized spectral transmittance curves shown by the optical filter according to Example 2 at the incident angles is small, and an image generated by an imaging apparatus employing the optical filter according to Example 2 is deemed to be unlikely to be colored unevenly. The optical filter according to Example 2 includes the light-absorbing layer only on one surface of the transparent glass substrate. Therefore, in order to reduce warping of the transparent glass substrate due to stress in the light-absorbing layer, the transparent glass substrate is thicker than the transparent glass substrate of the optical filter according to Example 1. In other words, the thickness of a transparent glass substrate is easily reduced by formation of a light-absorbing layer on each surface of the transparent glass substrate, as in the optical filter according to Example 1.

Example 3

1.125 g of copper acetate monohydrate (($CH_3COO)_2Cu.H_2O$) and 60 g of tetrahydrofuran (THF) were mixed and stirred for 3 hours to obtain a copper acetate solution. To the obtained copper acetate solution was then added 0.412 g of PLYSURF A208N (manufactured by DKS Co., Ltd.) which is a phosphoric acid ester compound, followed by stirring for 30 minutes to obtain a solution A. 10 g of THF was added to 0.176 g of phenylphosphonic acid ($C_6H_5PO(OH)_2$) (manufactured by Nissan Chemical Industries, Ltd.), followed by stirring for 30 minutes to obtain a solution B3-1. 10 g of THF was added to 1.058 g of 4-bromophenylphosphonic acid ($C_6H_4BrPO(OH)_2$) (manufactured by Tokyo Chemical Industry Co., Ltd.), followed by stirring for 30 minutes to obtain a solution B3-2. Next, the solutions B3-1 and B3-2 were mixed and stirred for 1 minute. 2.166 g of methyltriethoxysilane (MTES: $CH_3Si(OC_2H_5)_3$) (manufactured by Shin-Etsu Chemical Co., Ltd.) and 0.710 g of tetraethoxysilane (TEOS: $Si(OC_2H_5)_4$) (manufactured by KISHIDA CHEMICAL Co., Ltd., special grade) were added, and the mixture was further stirred for 1 minute to obtain a solution B3. The solution B3 was added to the solution A while the solution A was stirred, and the mixture was stirred at room temperature for 1 minute. To the resultant solution was then added 25 g of toluene, followed by stirring at room temperature for 1 minute to obtain a solution C3. This solution C3 was placed in a flask and subjected to solvent removal using a rotary evaporator (manufactured by Tokyo Rikakikai Co., Ltd., product code: N-1110SF) under heating by means of an oil bath (manufactured by Tokyo Rikakikai Co., Ltd., product code: OSB-2100). The temperature of the oil bath was controlled to 105° C. The solution having undergone the solvent removal was then collected from the flask. A solution D3 was thus obtained. The solution D3 was a dispersion of fine particles of copper phenyl-based phosphonate (light absorber) including copper phenylphosphonate and copper 4-bromophenylphosphonate. The solution D3 was transparent, and the fine particles were well dispersed therein.

1.125 g of copper acetate monohydrate and 36 g of THF were mixed and stirred for 3 hours to obtain a copper acetate solution. To the obtained copper acetate solution was then added 0.643 g of PLYSURF A208N which is a phosphoric acid ester compound, followed by stirring for 30 minutes to obtain a solution E3. 10 g of THF was added to 0.722 g of n-butylphosphonic acid ($C_4H_9PO(OH)_2$) (manufactured by Nippon Chemical Industrial Co., Ltd.), followed by stirring for 30 minutes to obtain a solution F3. The solution F3 was added to the solution E3 while the solution E3 was stirred, and the mixture was stirred at room temperature for 1 minute. To the resultant solution was then added 25 g of toluene, followed by stirring at room temperature for 1 minute to obtain a solution G3. This solution G3 was placed in a flask and subjected to solvent removal using a rotary evaporator under heating by means of an oil bath. The temperature of the oil bath was controlled to 105° C. The solution having undergone the solvent removal was then collected from the flask. A solution H3 was thus obtained. The solution H3 was a dispersion of fine particles of copper butylphosphonate. The solution H3 was transparent, and the fine particles were well dispersed therein.

To the solution D3 was added 2.200 g of a silicone resin (manufactured by Shin-Etsu Chemical Co., Ltd., product name: KR-300), followed by stirring for 30 minutes to obtain a solution I3. The solution H3 was added to the solution I3, followed by stirring for 30 minutes to obtain a light-absorbing composition according to Example 3.

Figure 7A:
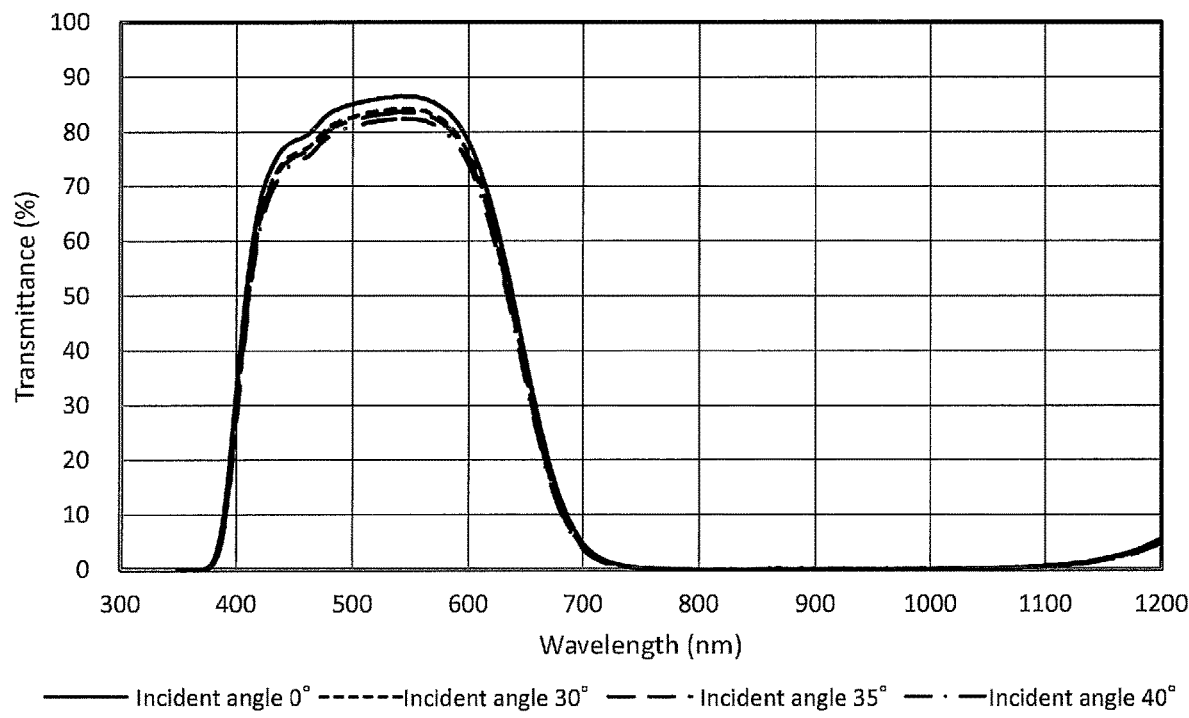
FIG. 7A shows transmittance spectra shown by an optical filter according to Example 3 for light incident at incident angles of 0°, 30°, 35°, and 40°.
Figure 7B:
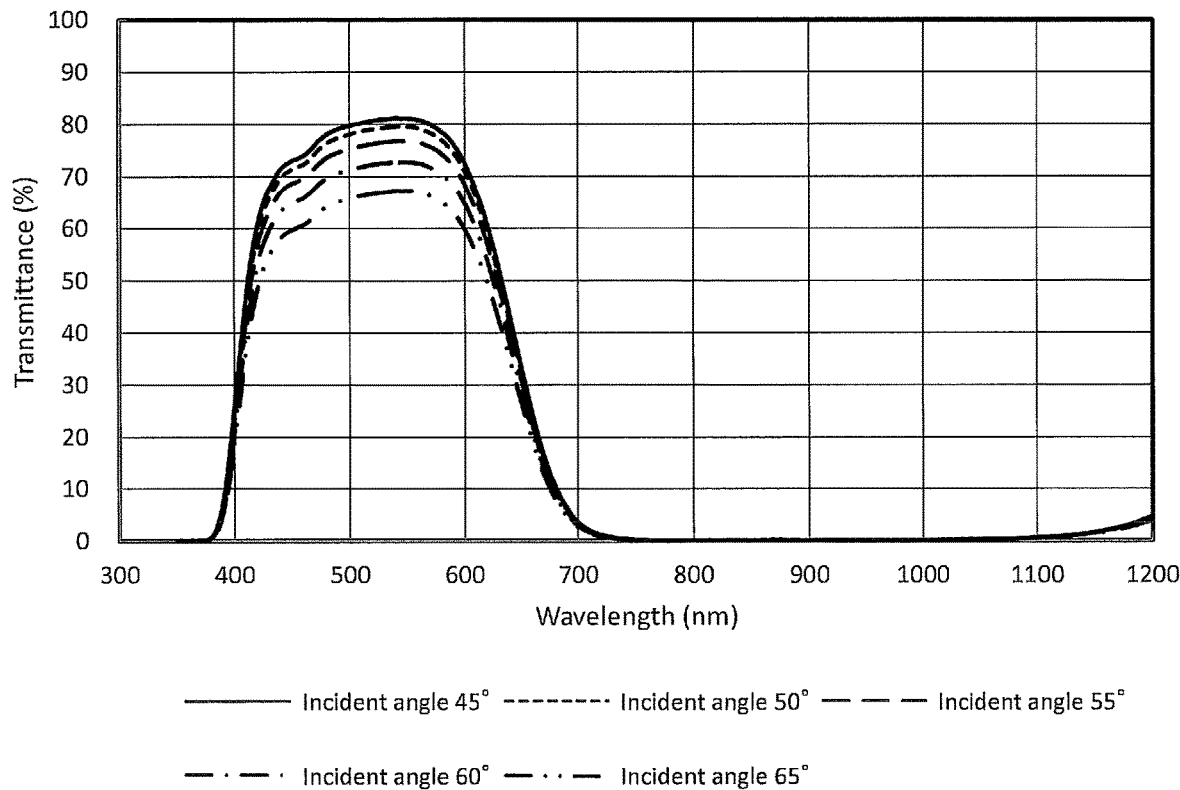
FIG. 7B shows transmittance spectra shown by the optical filter according to Example 3 for light incident at incident angles of 45°, 50°, 55°, 60°, and 65°.
Figure 8A:
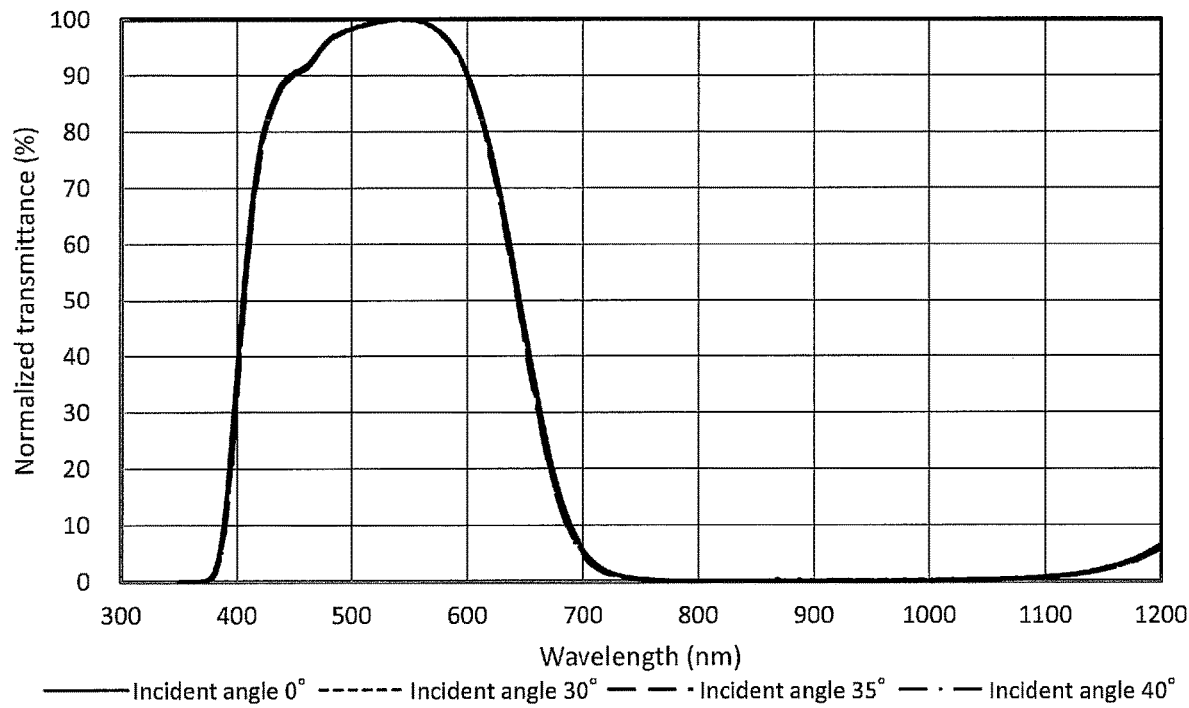
FIG. 8A shows normalized transmittance spectra shown by the optical filter according to Example 3 for light incident at incident angles of 0°, 30°, 35°, and 40°.
Figure 8B:
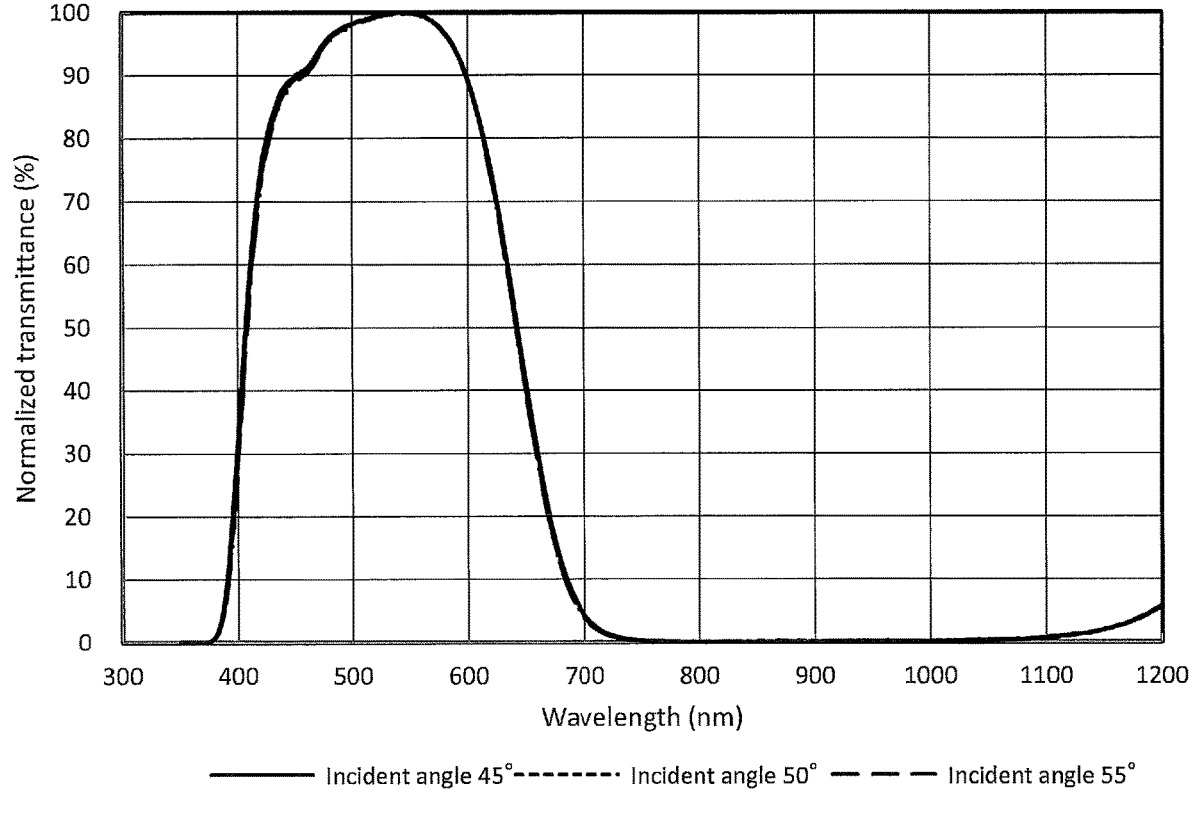
FIG. 8B shows normalized transmittance spectra shown by the optical filter according to Example 3 for light incident at incident angles of 45°, 50°, 55°, 60°, and 65°.

The light-absorbing composition according to Example 3 was applied with a dispenser to a 30 mm×30 mm central region of one surface of a transparent glass substrate (manufactured by SCHOTT AG, product name: D 263 T eco) made of borosilicate glass and having dimensions of 76 mm×76 mm×0.21 mm. A film was thus formed on the substrate. When the light-absorbing composition was applied to the transparent glass substrate, a frame having an opening corresponding in dimensions to the region where the film-forming liquid was applied was put on the transparent glass substrate to hold back the film-forming liquid and prevent the film-forming liquid from spreading. The amount of the light-absorbing composition applied was determined so that the thickness of the layer which was originally the light-absorbing composition film would eventually be about 135 μm. Subsequently, the transparent glass substrate with the undried film was placed in an oven and heat-treated at 85° C. for 6 hours to cure the film. After that, the transparent glass substrate with the film formed thereon was placed in a thermo-hygrostat set at a temperature of 85° C. and a relative humidity of 85% for a 20-hour humidification treatment to form a light-absorbing layer on the transparent glass substrate. The humidification treatment was performed to promote hydrolysis and polycondensation of the alkoxysilane monomer contained in the light-absorbing composition applied onto the transparent glass substrate and form a hard and dense matrix of the light-absorbing layer. The light-absorbing layer on the transparent glass substrate thus obtained was peeled off to obtain an optical filter according to Example 3. The thickness of the optical filter according to Example 3 is 135 μm. Transmittance spectra shown by the optical filter according to Example 3 at incident angles of 0°, 30°, 35°, 40°, 45°, 50°, 55°, 60°, and 65° are shown in FIGS. 7A and 7B. Values of characteristics derived from the transmittance spectrum shown by the optical filter according to Example 3 at an incident angle of 0° are shown in Table 5. Normalized spectral transmittance curves shown by the optical filter according to Example 3 at incident angles of 0°, 30°, 35°, 40°, 45°, 50°, 55°, 60°, and 65° are shown in FIGS. 8A and 8B. Values of characteristics derived from the normalized spectral transmittance curves shown by the optical filter according to Example 3 are shown in Table 6.

As shown in Tables 5 and 6, the above requirements (1) to (18) are satisfied by the optical filter according to Example 3. For the optical filter according to Example 3, the transmittances at wavelengths of 700 nm and 715 nm are within the acceptable range, albeit slightly high compared to those for the optical filters according to Examples 1 and 2. For the optical filter according to Example 3, transmission of a small amount of light was observed in a band of more than 1100 nm unlike in the case of the optical filter according to Example 1, but the transmittance of light in this band was limited compared to the case of the optical filter according to Example 2. In this band, common imaging devices have a low sensitivity. Therefore, incorporating the optical filter according to Example 3 in an imaging apparatus is not considered problematic in practical use. For the optical filter according to Example 3, the transmittances in a wavelength region of 380 nm or less are sufficiently low, and the transmittances at a wavelength of 450 nm and in the wavelength region of 500 to 600 nm are sufficiently high. In other words, the optical filter according to Example 3 can favorably block light in the ultraviolet and near-infrared regions and has characteristics of allowing light in the visible region to be transmitted sufficiently.

For the optical filter according to Example 3, as shown in FIGS. 8A and 8B, the normalized spectral transmittances for incident angles of 0° to 65° are sufficiently low in a wavelength region of 380 nm or less and a wavelength region of 700 nm or more, and the normalized spectral transmittances for incident angles of 0° to 65° are sufficiently high at a wavelength of 450 nm and in the wavelength range of 500 to 600 nm. Therefore, the optical filter according to Example 3 favorably blocks light in the ultraviolet and near-infrared regions and has characteristics advantageous to sufficiently transmit light in the visible region, even when sensitivity correction is made so as to cover a decrease in the amount of light in accordance with the angle of light assumed from a design viewpoint to be incident on an imaging device in an imaging apparatus. Additionally, each difference in shape between one and another of the normalized spectral transmittance curves shown by the optical filter according to Example 3 at the incident angles is small, and an image generated by an imaging apparatus employing the optical filter according to Example 3 is deemed to be unlikely to be colored unevenly. Since the optical filter according to Example 3 does not include a transparent glass substrate and is composed only of a light-absorbing layer, the thickness of the optical filter can be reduced.

Example 4

1.1 g of copper acetate monohydrate and 60 g of tetrahydrofuran (THF) were mixed and stirred for 3 hours. To the obtained solution was added 2.3 g of a phosphoric acid ester (manufactured by DKS Co., Ltd., product name: PLYSURF A208F), followed by stirring for 30 minutes to obtain a solution A4. 10 g of THF was added to 0.6 g of phenylphosphonic acid (manufactured by Tokyo Chemical Industry Co., Ltd.), followed by stirring for 30 minutes to obtain a solution B4. The solution B4 was added to the solution A4 while the solution A4 was stirred, and the mixture was stirred at room temperature for 1 minute. To the resultant solution was added 45 g of toluene, followed by stirring at room temperature for 1 minute to obtain a solution C4. The solution C4 was placed in a flask and subjected to solvent removal for 25 minutes using a rotary evaporator (manufactured by Tokyo Rikakikai Co., Ltd., product code: N-1110SF) under heating by means of an oil bath (manufactured by Tokyo Rikakikai Co., Ltd., product code: OSB-2100) controlled to 120° C. The solution having undergone the solvent removal was taken out of the flask, and to the solution was added 4.4 g of a silicone resin (manufactured by Shin-Etsu Chemical Co., Ltd., product name: KR-300), followed by stirring at room temperature for 30 minutes to obtain a light-absorbing composition IRA1.

2.25 g of copper acetate monohydrate and 120 g of tetrahydrofuran (THF) were mixed and stirred for 3 hours. To the obtained solution was added 1.8 g of a phosphoric acid ester (manufactured by DKS Co., Ltd., product name: PLYSURF A208F), followed by stirring for 30 minutes to obtain a solution E4. 20 g of THF was added to 1.35 g of butylphosphonic acid, followed by stirring for 30 minutes to obtain a solution F4. The solution F4 was added to the solution E4 while the solution E4 was stirred, and the mixture was stirred at room temperature for 3 hours. To the resultant solution was added 40 g of toluene, and the solvent was evaporated in an 85° C. environment over 7.5 hours. To the resultant solution was added 8.8 g of a silicone resin (manufactured by Shin-Etsu Chemical Co., Ltd., product name: KR-300), followed by stirring for 3 hours to obtain a light-absorbing composition IRA2.

Figure 9A:
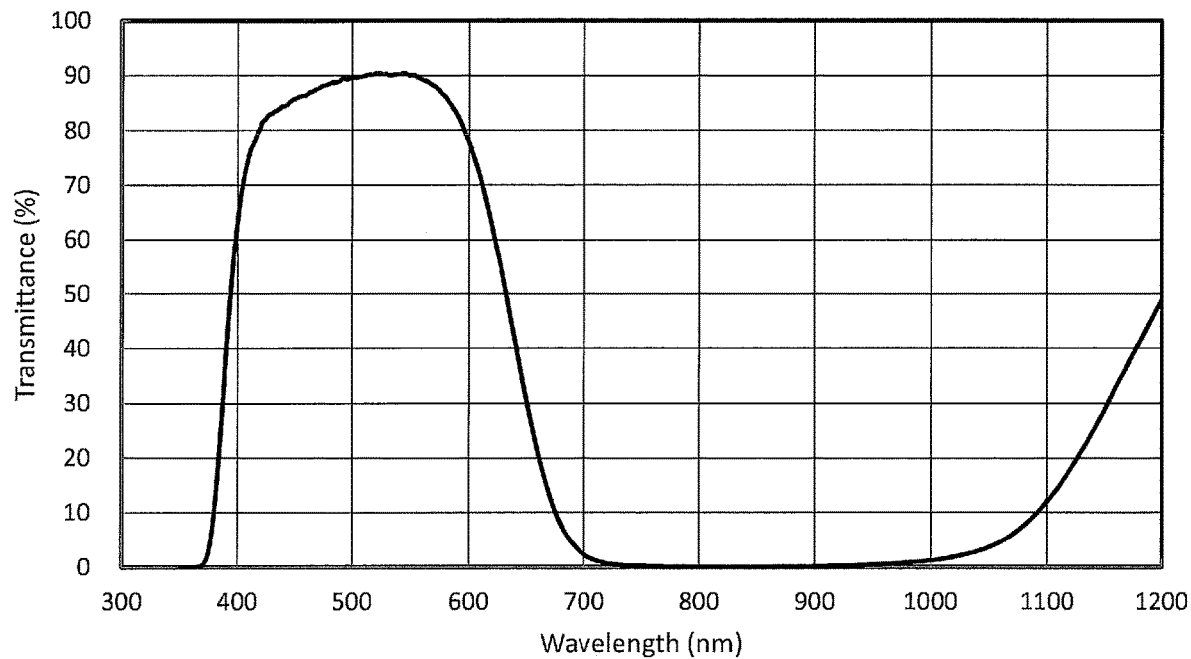
FIG. 9A shows a transmittance spectrum shown by an intermediate product of an optical filter according to Example 4 for light incident at an incident angle of 0°.

The light-absorbing composition IRA1 obtained was applied to one principal surface of a transparent glass substrate (manufactured by SCHOTT AG, product name: D 263 T eco) using a die coater. The resultant film was cured by heat treatment in an oven at 85° C. for 3 hours, at 125° C. for 3 hours, at 150° C. for 1 hour, and then at 170° C. for 3 hours to form a light-absorbing layer ira11. The light-absorbing composition IRA1 was applied in the same manner to the other principal surface of the transparent glass substrate. The resultant film was cured under the same conditions as the conditions for forming the light-absorbing layer ira11 to form a light-absorbing layer ira12. The total thickness of the light-absorbing layer ira11 and light-absorbing layer ira12 is 0.2 mm. An intermediate product α was thus obtained. A transmittance spectrum obtained upon incidence of light with a wavelength of 300 to 1200 nm on the intermediate product α at an incident angle of 0° is shown in FIG. 9A. In this transmittance spectrum, the spectral transmittance at a wavelength of 380 nm is 10.9%, the spectral transmittance at a wavelength of 450 nm is 85.7%, the average of the spectral transmittance in the wavelength range of 500 to 600 nm is 88.1%, the spectral transmittance at a wavelength of 700 nm is 2.3%, the spectral transmittance at a wavelength of 715 nm is 0.9%, the average of the spectral transmittance in the wavelength range of 700 to 800 nm is 0.4%, the maximum of the spectral transmittance in the wavelength range of 750 to 1080 nm is 7.6%, and the maximum of the spectral transmittance in the wavelength range of 1000 to 1100 nm is 12.1%.

Figure 9B:
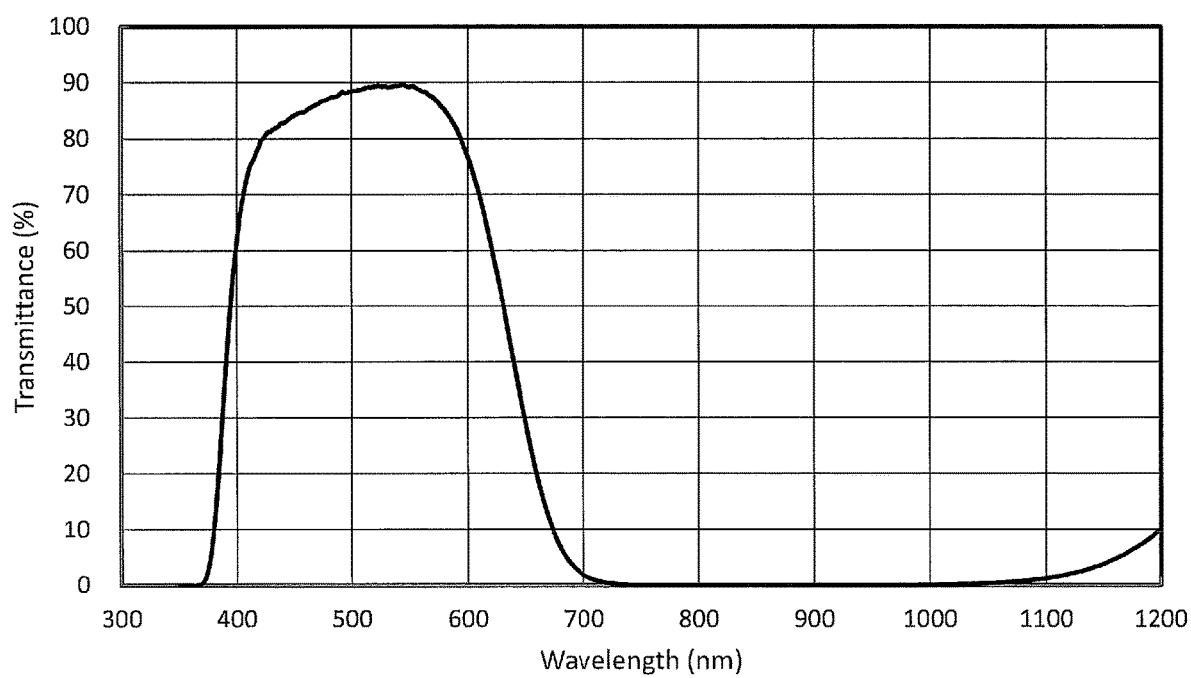
FIG. 9B shows a transmittance spectrum shown by another intermediate product of the optical filter according to Example 4 for light incident at an incident angle of 0°.

A 500-nm-thick $SiO_2$ film was vapor-deposited on the light-absorbing layer ira11 and light-absorbing layer ira12 using a vacuum deposition apparatus to form a protective layer p1 and protective layer p2, respectively. The light-absorbing composition IRA2 was applied onto the surface of the protective layer p1 with a die coater. The resultant film was cured by heat treatment in an oven at 85° C. for 3 hours, at 125° C. for 3 hours, at 150° C. for 1 hour, and then at 170° C. for 3 hours to form a light-absorbing layer ira21. The light-absorbing composition IRA2 was applied also onto the protective layer p2. The resultant film was cured under the same heating conditions as the conditions for forming the light-absorbing layer ira21 to form a light-absorbing layer ira22. The total thickness of the light-absorbing layer ira21 and light-absorbing layer ira22 is 50 μm. An intermediate product β was thus obtained. A transmittance spectrum obtained upon incidence of light with a wavelength of 300 to 1200 nm on the intermediate product β at an incident angle of 0° is shown in FIG. 9B. In this transmittance spectrum, the spectral transmittance at a wavelength of 380 nm is 10.5%, the spectral transmittance at a wavelength of 450 nm is 84.0%, the average of the spectral transmittance in the wavelength range of 500 to 600 nm is 87.2%, the spectral transmittance at a wavelength of 700 nm is 1.8%, the spectral transmittance at a wavelength of 715 nm is 0.6%, the average of the spectral transmittance in the wavelength range of 700 to 800 nm is 0.3%, the maximum of the spectral transmittance in the wavelength range of 750 to 1080 nm is 0.7%, and the maximum of the spectral transmittance in the wavelength range of 1000 to 1100 nm is 1.2%.

A 500-nm-thick $SiO_2$ film was vapor-deposited on the infrared-absorbing layer ira22 using a vacuum deposition apparatus to form a protective layer p3.

To a solution containing MEK as a solvent and an ultraviolet-absorbing substance composed of a benzophenone-based ultraviolet-absorbing substance which has low light absorption in the visible region and is soluble in methyl ethyl ketone (MEK) was added polyvinyl butyral (PVB) in an amount equivalent to 60 weight % of the solids of the solution, followed by stirring for 2 hours to obtain a light-absorbing composition UVA1.

Figure 9C:
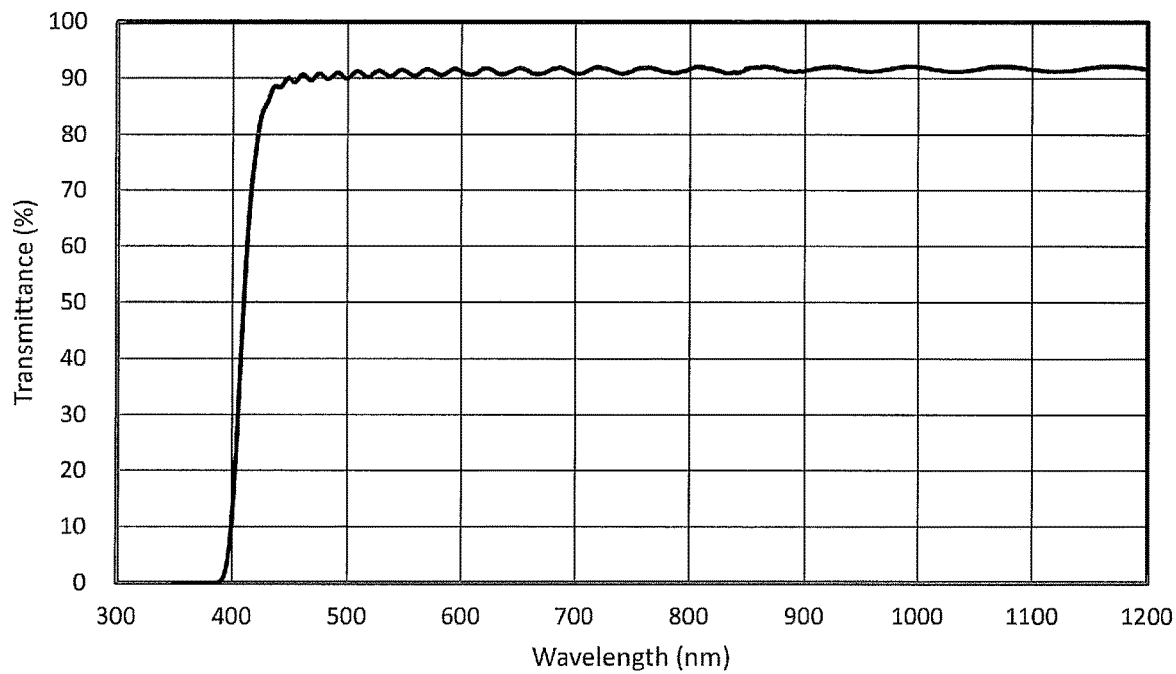
FIG. 9C shows a transmittance spectrum shown by a laminate according to Reference Example 1 for light incident at an incident angle of 0°.

The light-absorbing composition UVA1 was applied onto the protective layer p3 by spin coating, followed by curing of the resultant film by heating at 140° C. for 30 minutes to form a light-absorbing layer uva1. The thickness of the light-absorbing layer uva1 is 6 μm. Separately, a 6-μm-thick light-absorbing layer uva1 was formed on one principal surface of a transparent glass substrate (manufactured by SCHOTT AG, product name: D 263 T eco) using the light-absorbing composition UVA1 to obtain a laminate according to Reference Example 1. A transmittance spectrum obtained upon incidence of light with a wavelength of 300 to 1200 nm on the laminate according to Reference Example 1 at an incident angle of 0° is shown in FIG. 9C.

Figure 9D:
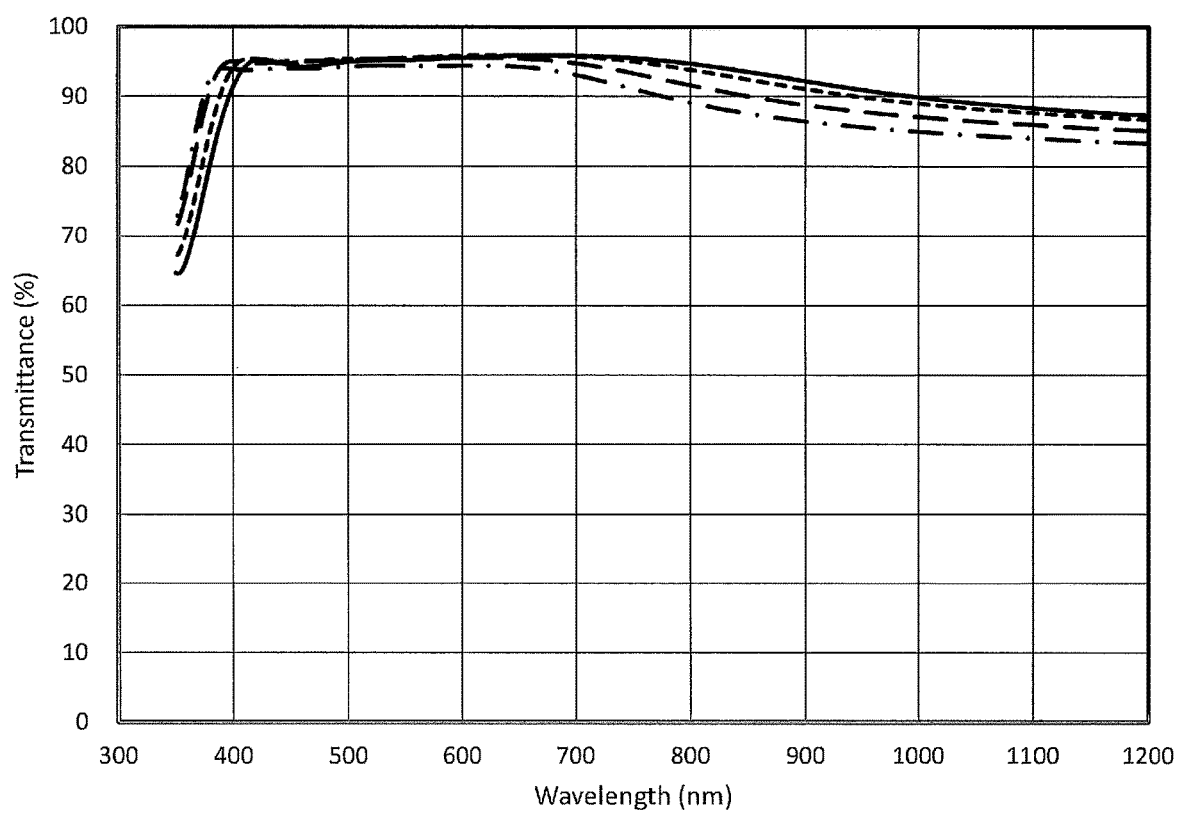
FIG. 9D shows transmittance spectra shown by a laminate according to Reference Example 2 for light incident at incident angles of 0°, 30°, 50°, and 65°.

An anti-reflection film ar1 and anti-reflection film ar2 were formed on the light-absorbing layer ira21 and light-absorbing layer uva1, respectively, by vacuum deposition. The specifications of the anti-reflection film ar1 and anti-reflection film ar2 were the same. Each of the anti-reflection film ar1 and anti-reflection film ar2 was a film composed of $SiO_2$ and $TiO_2$ that were alternately laminated. Each of the anti-reflection film ar1 and anti-reflection film ar2 included seven layers and had a total thickness of about 0.4 μm. An optical filter according to Example 4 was thus obtained. Additionally, an anti-reflection film ar1 was formed on one surface of a transparent glass substrate (manufactured by SCHOTT AG, product name: D 263 T eco) to obtain a laminate according to Reference Example 2. Transmittance spectra obtained upon incidence of light with a wavelength of 300 to 1200 nm on the laminate according to Reference Example 2 at incident angles of 0°, 30°, 50° and 65° are shown in FIG. 9D. For the laminate according to Reference Example 2, as shown in FIG. 9D, a wavelength band including a local transmittance decrease does not exist in the wavelength range of 400 to 700 nm for any of the incident angles.

Figure 10A:
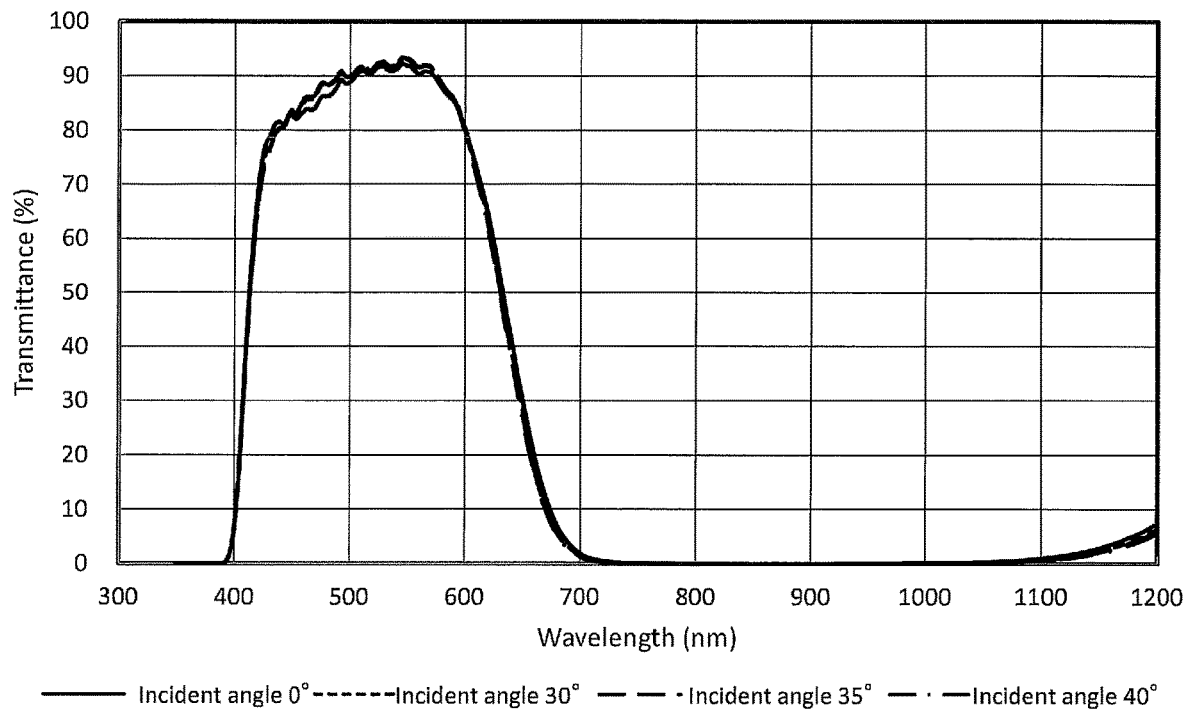
FIG. 10A shows transmittance spectra shown by the optical filter according to Example 4 for light incident at incident angles of 0°, 30°, 35°, and 40°.
Figure 10B:
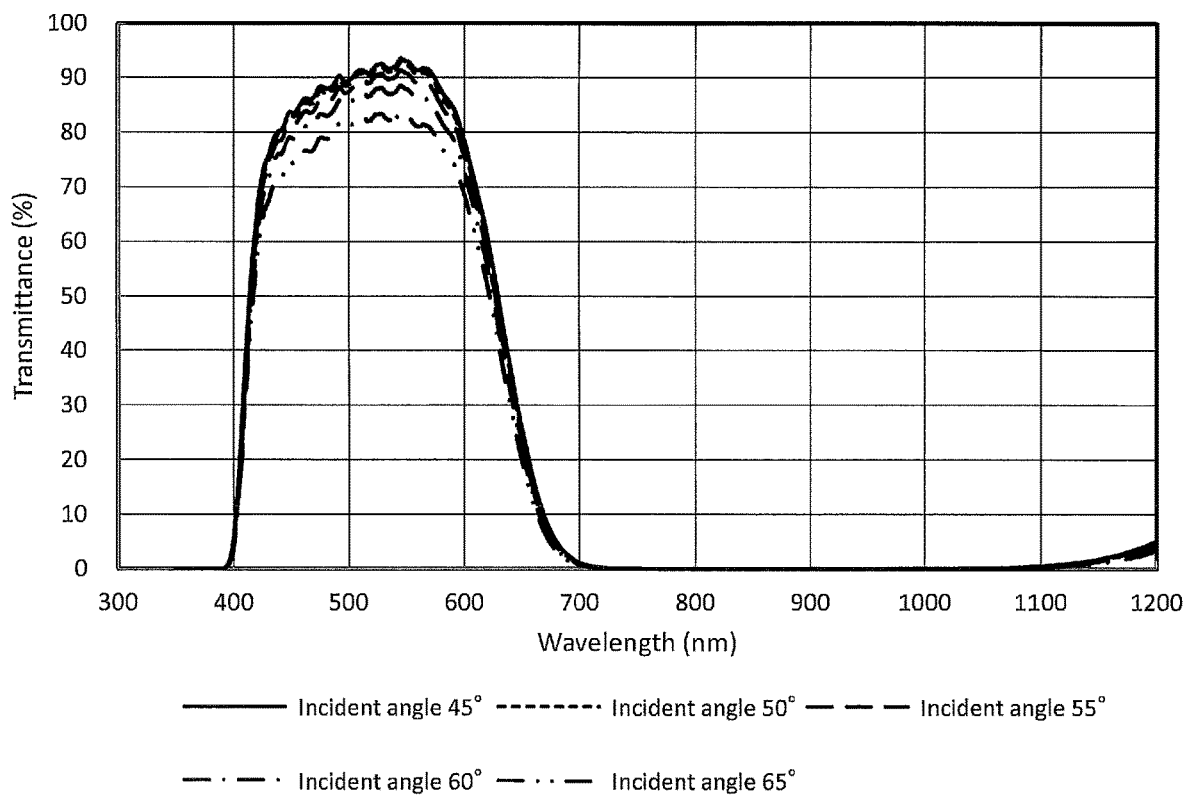
FIG. 10B shows transmittance spectra shown by the optical filter according to Example 4 for light incident at incident angles of 45°, 50°, 55°, 60°, and 65°.
Figure 11A:
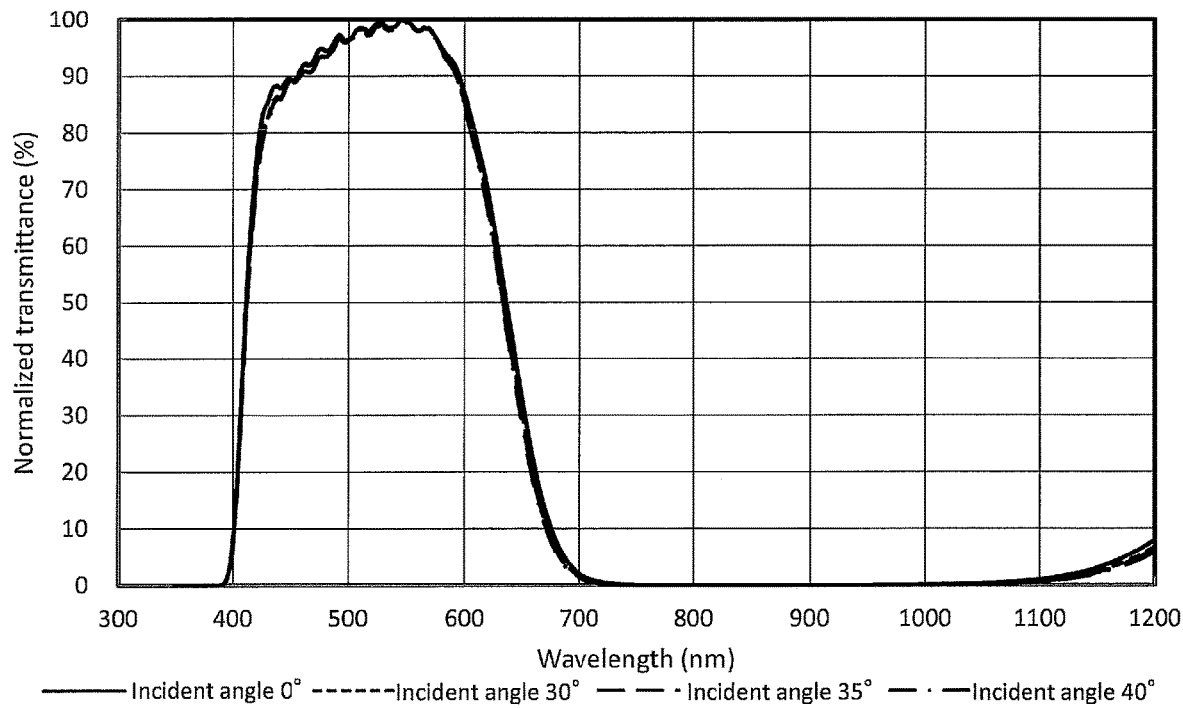
FIG. 11A shows normalized transmittance spectra shown by the optical filter according to Example 4 for light incident at incident angles of 0°, 30°, 35°, and 40°.
Figure 11B:
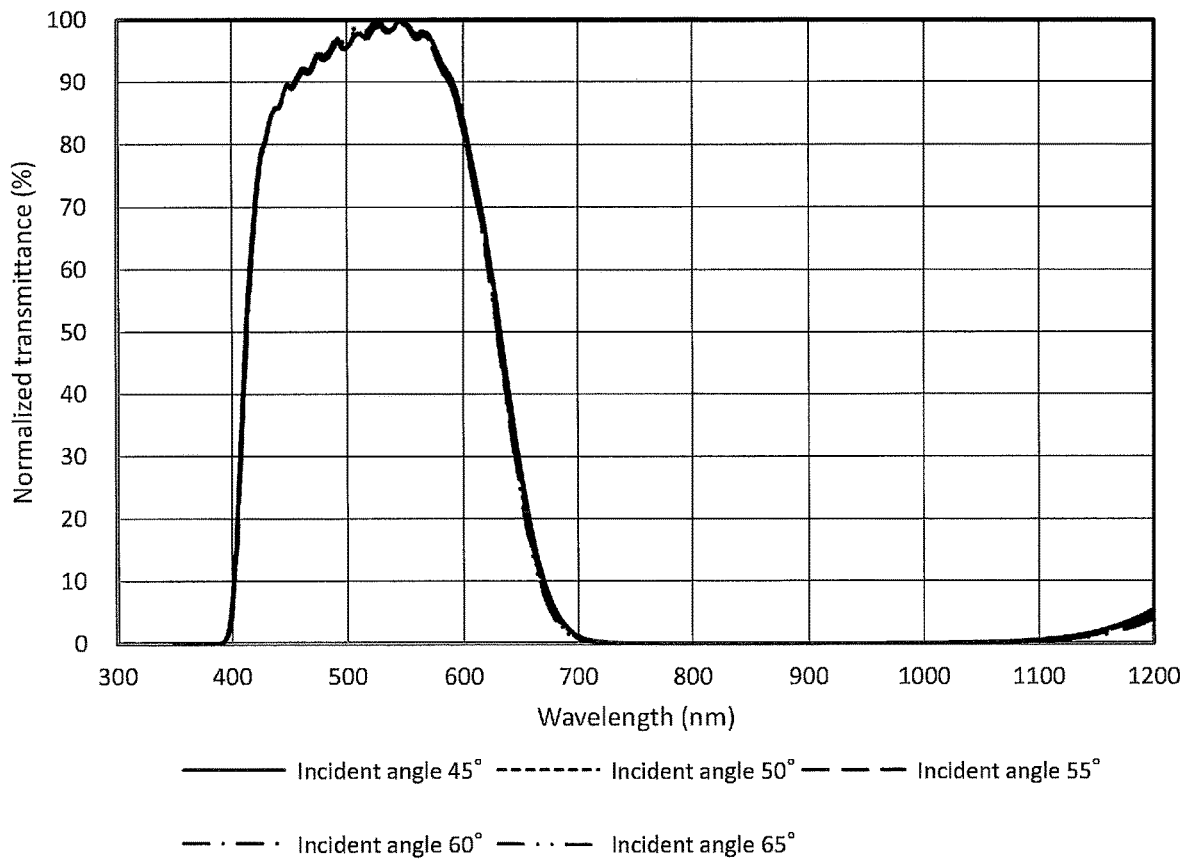
FIG. 11B shows normalized transmittance spectra shown by the optical filter according to Example 4 for light incident at incident angles of 45°, 50°, 55°, 60°, and 65°.

Transmittance spectra shown by the optical filter according to Example 4 at incident angles of 0°, 30°, 35°, 40°, 45°, 50°, 55°, 60°, and 65° are shown in FIGS. 10A and 10B. Values of characteristics derived from the transmittance spectrum shown by the optical filter according to Example 4 at an incident angle of 0° are shown in Table 7. Normalized spectral transmittance curves shown by the optical filter according to Example 4 at incident angles of 0°, 30°, 35°, 40°, 45°, 50°, 55°, 60°, and 65° are shown in FIGS. 11A and 11B. Values of characteristics derived from the normalized spectral transmittance curves shown by the optical filter according to Example 4 are shown in Table 8.

As shown in Tables 7 and 8, the above requirements (1) to (18) are satisfied by the optical filter according to Example 4. For the optical filter according to Example 4, the transmittances in a wavelength region of 380 nm or less and a wavelength region of 700 nm or more are sufficiently low, and the transmittances at a wavelength of 450 nm and in the wavelength region of 500 to 600 nm are sufficiently high. In other words, the optical filter according to Example 4 can favorably block light in the ultraviolet and near-infrared regions and has characteristics of allowing light in the visible region to be transmitted sufficiently. Moreover, since the optical filter according to Example 4 includes the anti-reflection film, the optical filter according to Example 4 has high transmittances in the visible region compared to those of the optical filters according to Examples 1 to 3 in the visible region. Additionally, no ripple occurs in the wavelength range of 400 to 700 nm upon incidence of light on the optical filter according to Example 4 at incident angles of 0° to 65°. Furthermore, since the optical filter according to Example 4 includes the light-absorbing layer uva1, the transmittance sharply increases around 400 nm with increase in wavelength.

For the optical filter according to Example 4, as shown in FIGS. 11A and 11B, the normalized spectral transmittances for incident angles of 0° to 65° are sufficiently low in a wavelength region of 380 nm or less and a wavelength region of 700 nm or more, and the normalized spectral transmittances for incident angles of 0° to 65° are sufficiently high at a wavelength of 450 nm and in the wavelength range of 500 to 600 nm. Therefore, the optical filter according to Example 4 favorably blocks light in the ultraviolet and near-infrared regions and has characteristics advantageous to sufficiently transmit light in the visible region, even when sensitivity correction is made so as to cover a decrease in the amount of light in accordance with the angle of light assumed from a design viewpoint to be incident on an imaging device in an imaging apparatus. Additionally, each difference in shape between one and another of the normalized spectral transmittance curves shown by the optical filter according to Example 4 at the incident angles is small, and an image generated by an imaging apparatus employing the optical filter according to Example 4 is deemed to be unlikely to be colored unevenly.

Comparative Example 1

Figure 12A:
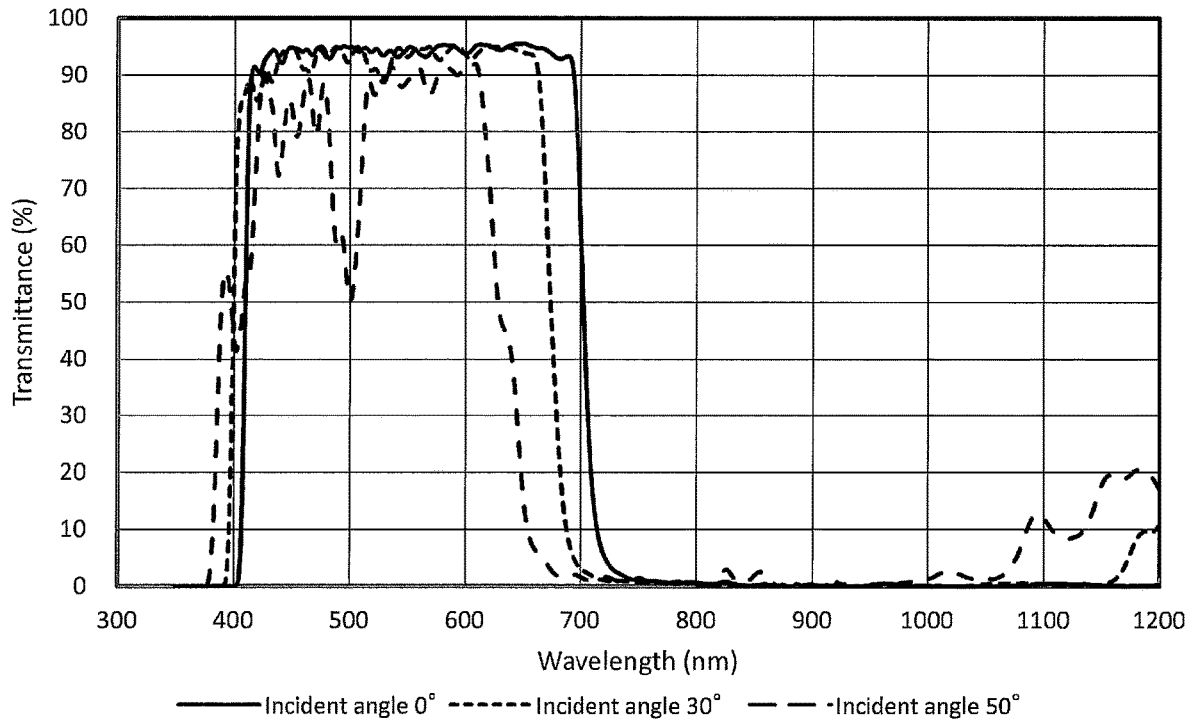
FIG. 12A shows transmittance spectra shown by an intermediate product of an optical filter according to Comparative Example 1 for light incident at incident angles of 0°, 30°, and 50°.

A light-reflecting layer irr1 that reflects light with a wavelength in the range of 730 to 1100 nm was formed on one principal surface of a transparent glass substrate (manufactured by SCHOTT AG, product name: D 263 T eco) by alternately laminating $SiO_2$ and $TiO_2$ in 50 layers using a vacuum deposition apparatus. An intermediate product γ was thus obtained. Transmittance spectra obtained upon incidence of light with a wavelength of 300 to 1200 nm on the intermediate product γ at incident angles of 0°, 30°, and 50° are shown in FIG. 12A. In the transmittance spectrum for an incident angle of 0°, the spectral transmittance at a wavelength of 380 nm is less than 0.2%, the spectral transmittance at a wavelength of 450 nm is 94.8%, the average of the spectral transmittance in the wavelength range of 500 to 600 nm is 94.3%, the spectral transmittance at a wavelength of 700 nm is 62.8%, the spectral transmittance at a wavelength of 715 nm is 9.5%, the average of the spectral transmittance in the wavelength range of 700 to 800 nm is 6.1%, the maximum of the spectral transmittance in the wavelength range of 750 to 1080 nm is 1.0%, and the maximum of the spectral transmittance in the wavelength range of 1000 to 1100 nm is 0.5%. In the transmittance spectrum for an incident angle of 30°, the spectral transmittance at a wavelength of 380 nm is less than 0.2%, the spectral transmittance at a wavelength of 450 nm is 94.6%, the average of the spectral transmittance in the wavelength range of 500 to 600 nm is 93.3%, the spectral transmittance at a wavelength of 700 nm is 3.2%, the spectral transmittance at a wavelength of 715 nm is 1.4%, the average of the spectral transmittance in the wavelength range of 700 to 800 nm is 1.0%, the maximum of the spectral transmittance in the wavelength range of 750 to 1080 nm is 0.8%, and the maximum of the spectral transmittance in the wavelength range of 1000 to 1100 nm is 0.6%. In the transmittance spectrum for an incident angle of 50°, the spectral transmittance at a wavelength of 380 nm is 3.7%, the spectral transmittance at a wavelength of 450 nm is 84.0%, the average of the spectral transmittance in the wavelength range of 500 to 600 nm is 86.0%, the spectral transmittance at a wavelength of 700 nm is 1.6%, the spectral transmittance at a wavelength of 715 nm is 1.1%, the average of the spectral transmittance in the wavelength range of 700 to 800 nm is 0.9%, the maximum of the spectral transmittance in the wavelength range of 750 to 1080 nm is 6.8%, and the maximum of the spectral transmittance in the wavelength range of 1000 to 1100 nm is 12.7%.

Figure 12B:
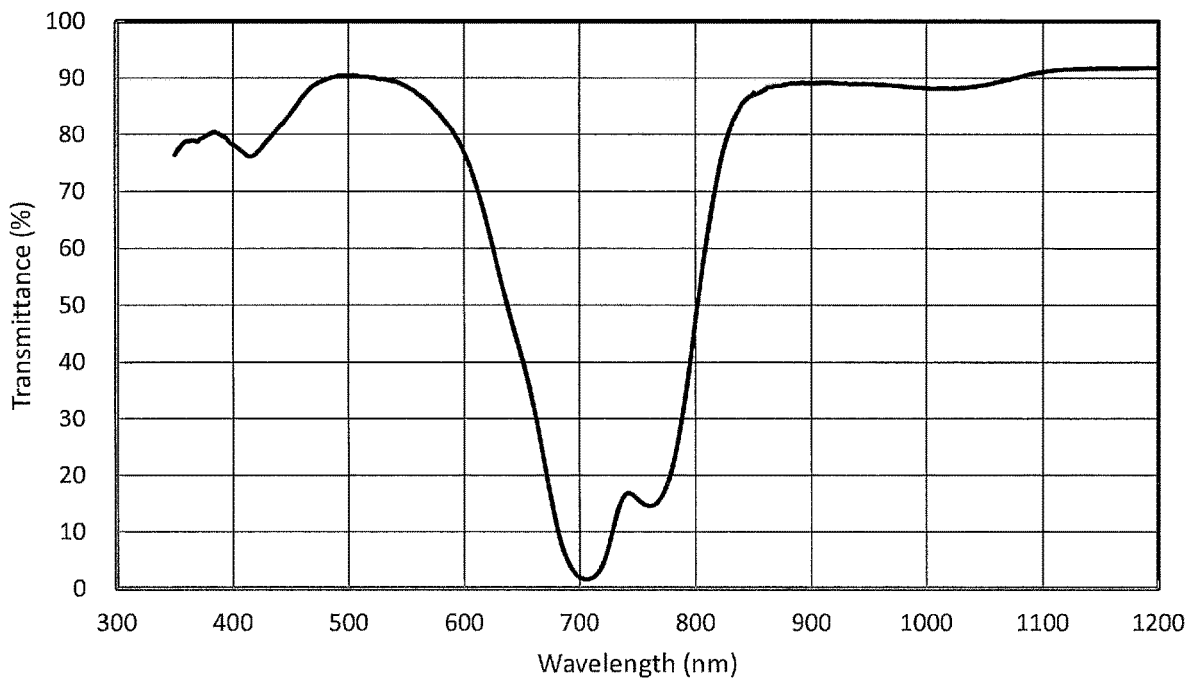
FIG. 12B shows a transmittance spectrum shown by a laminate according to Reference Example 3 for light incident at an incident angle of 0°.

A cyanine-based organic dye and squarylium-based organic dye which are soluble in MEK were added to MEK serving as a solvent to prepare a solution. PVB in an amount equivalent to 99 weight % of the solids of the solution was added to the solution, followed by stirring for 2 hours to obtain a coating liquid. This coating liquid was applied by spin coating onto a principal surface of the transparent glass substrate of the intermediate product γ, the principal surface opposite to the principal surface on which the light-reflecting layer irr1 was formed, and the resultant film was cured by heating at 140° C. for 30 minutes to form a light-absorbing layer ira3. Separately, a light-absorbing layer ira3 was formed in the same manner on one principal surface of a transparent glass substrate (manufactured by SCHOTT AG, product name: D 263 T eco) to obtain a laminate according to Reference Example 3. A transmittance spectrum obtained upon incidence of light with a wavelength of 300 to 1200 nm on the laminate according to Reference Example 3 at an incident angle of 0° is shown in FIG. 12B. In this transmittance spectrum, the spectral transmittance at a wavelength of 380 nm is 80.1%, the spectral transmittance at a wavelength of 450 nm is 83.8%, the average of the spectral transmittance in the wavelength range of 500 to 600 nm is 86.9%, the spectral transmittance at a wavelength of 700 nm is 2.0%, the spectral transmittance at a wavelength of 715 nm is 2.6%, the average of the spectral transmittance in the wavelength range of 700 to 800 nm is 15.9%, the maximum of the spectral transmittance in the wavelength range of 750 to 1080 nm is 90.2%, and the maximum of the spectral transmittance in the wavelength range of 1000 to 1100 nm is 91.1%.

An anti-reflection film ar1 was formed on the light-absorbing layer ira3 by vacuum deposition according to the same specifications as those of the anti-reflection film art of the optical filter according to Example 4. An optical filter according to Comparative Example 1 was fabricated in this manner.

Figure 13A:
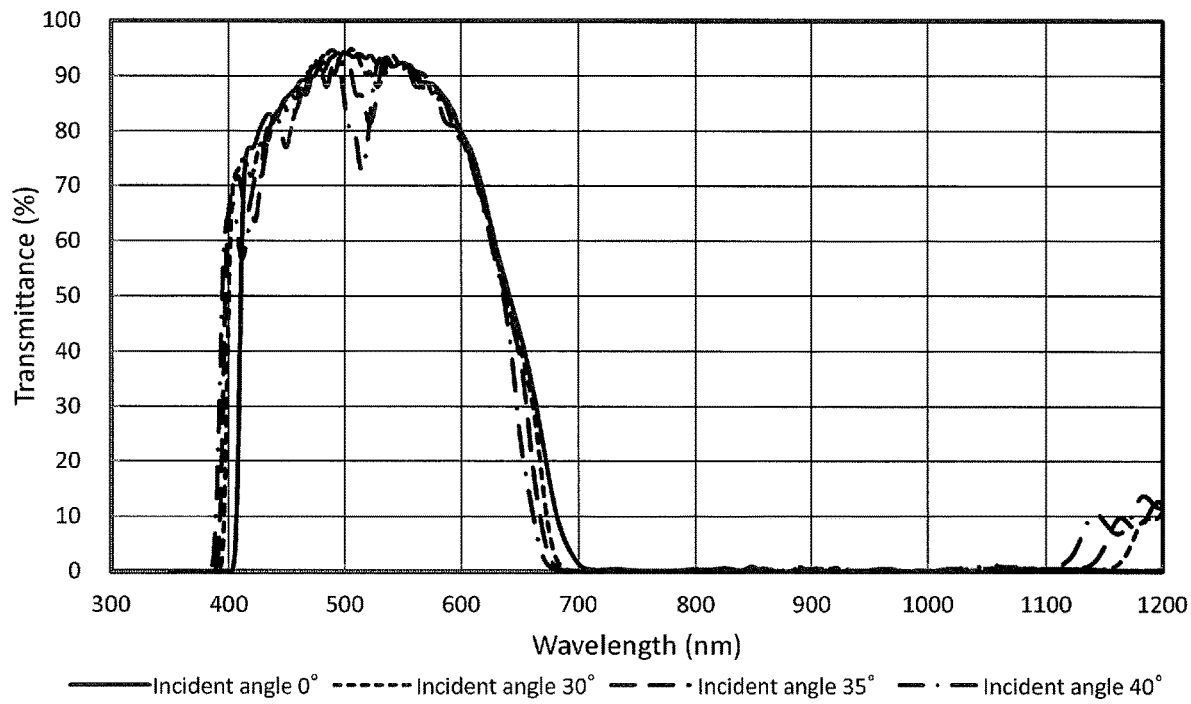
FIG. 13A shows transmittance spectra shown by the optical filter according to Comparative Example 1 for light incident at incident angles of 0°, 30°, 35°, and 40°.
Figure 13B:
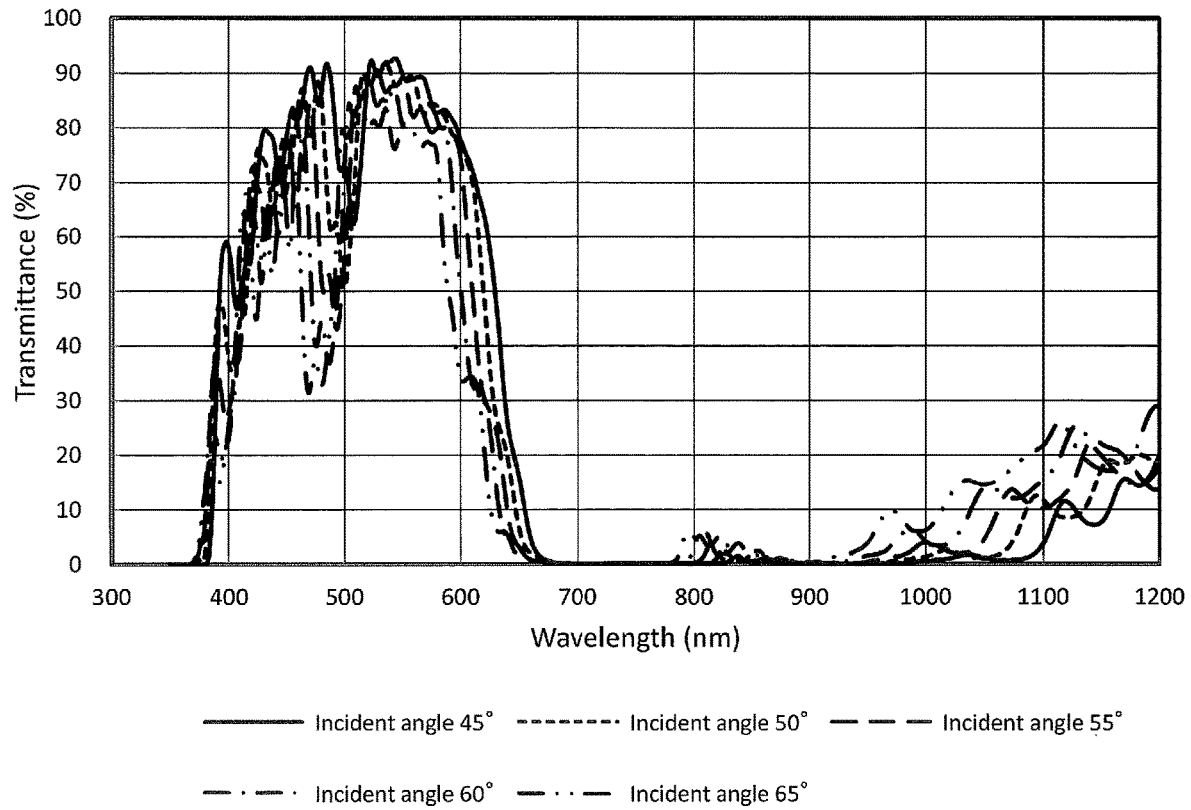
FIG. 13B shows transmittance spectra shown by the optical filter according to Comparative Example 1 for light incident at incident angles of 45°, 50°, 55°, 60°, and 65°.
Figure 14A:
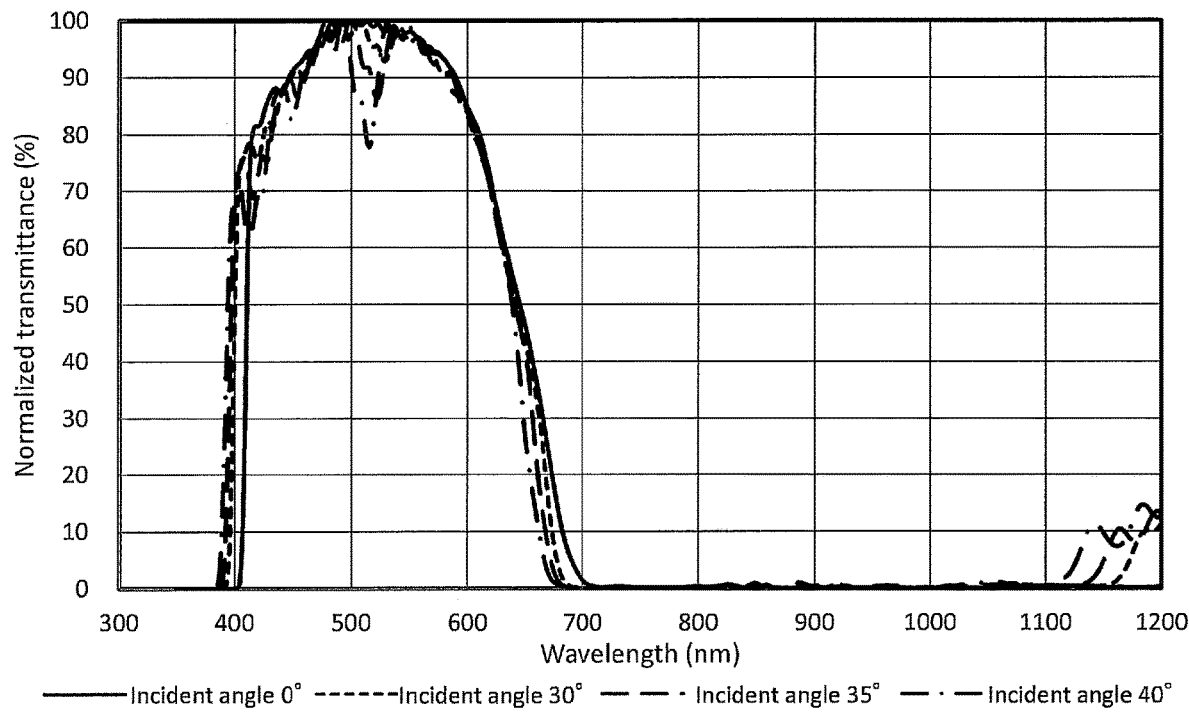
FIG. 14A shows normalized transmittance spectra shown by the optical filter according to Comparative Example 1 for light incident at incident angles of 0°, 30°, 35°, and 40°.
Figure 14B:
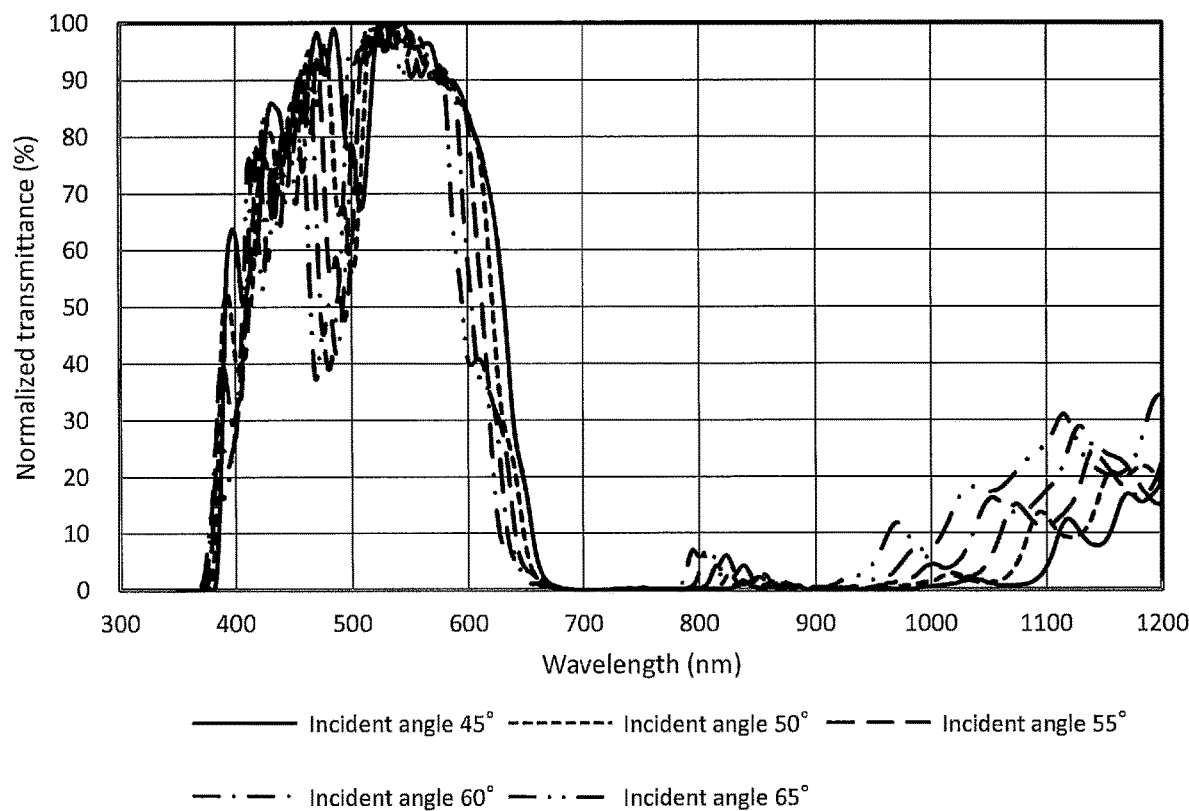
FIG. 14B shows normalized transmittance spectra shown by the optical filter according to Comparative Example 1 for light incident at incident angles of 45°, 50°, 55°, 60°, and 65°.

Transmittance spectra shown by the optical filter according to Comparative Example 1 at incident angles of 0°, 30°, 35°, 40°, 45°, 50°, 55°, 60°, and 65° are shown in FIGS. 13A and 13B. Values of characteristics derived from the transmittance spectrum shown by the optical filter according to Comparative Example 1 at an incident angle of 0° are shown in Table 9. Normalized spectral transmittance curves shown by the optical filter according to Comparative Example 1 at incident angles of 0°, 30°, 35°, 40°, 45°, 50°, 55°, 60°, and 65° are shown in FIGS. 14A and 14B. Values of characteristics derived from the normalized spectral transmittance curves shown by the optical filter according to Comparative Example 1 are shown in Table 10.

As shown in Table 10, the optical filter according to Comparative Example 1 does not satisfy the above requirement (11) at incident angles of 40°, 55°, and 65°, the above requirement (12) at incident angles of 30° to 65°, the above requirement (16) at incident angles of 40° to 65°, and the above requirements (17) and (18) at incident angles of 45° to 65°. For the optical filter according to Comparative Example 1, as shown in FIGS. 14A and 14B, a greater ripple occurs at a larger incident angle in the visible region in which a high transmittance is desirable, and the normalized spectral transmittance is low at a wavelength of 450 nm and in the wavelength range of 500 to 600 nm. Additionally, as shown in FIGS. 14A and 14B, when the incident angle of light is larger than 40°, there is a band in which the normalized spectral transmittance is less than 80% in the wavelength range of 450 to 520 nm and the wavelength bandwidth of wavelength bands in which the normalized spectral transmittance is 80% or more fails to be 170 nm or more.

The optical filter according to Comparative Example 1 blocks light in the near-infrared region not only by the light-absorbing layer but also in conjunction with the light-reflecting layer. The light-reflecting layer exhibits its function of reflecting light by an interference effect attributed to its multilayer film. Thus, incidence of light at a large incident angle larger than a design value results not only in a shift of a wavelength band of reflected light to the short wavelength side but also in a ripple in a wavelength band of light which should be transmitted and severe distortion of the resultant spectral transmittance curve. Therefore, although the transmittance spectrum of light vertically incident on the optical filter according to Comparative Example 1 satisfies the desired requirements, the transmittance spectra of light incident thereon at larger incident angles cannot satisfy the desired requirements. Therefore, when an imaging apparatus in which the optical filter according to Comparative Example 1 is incorporated is used to take an object at a wide angle of view, for example, for a wide-angle shot, it is difficult to reproduce an even color tone of the object in the image taken and there is also concern that the image obtained may be colored quite unevenly.

Comparative Example 2

Figure 15A:
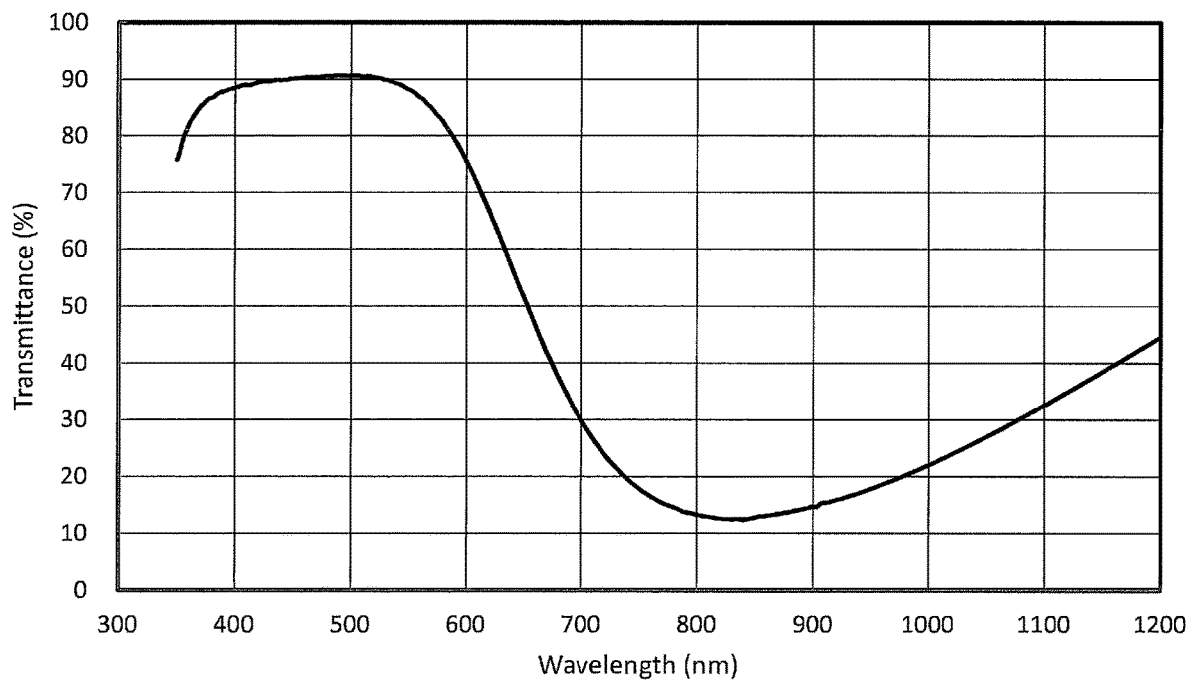
FIG. 15A shows a transmittance spectrum shown by a light-absorbing transparent substrate used for fabrication of an optical filter according to Comparative Example 2 for light incident at an incident angle of 0°.

A light-absorbing transparent substrate bg1 was prepared. A transmittance spectrum obtained upon incidence of light with a wavelength of 300 to 1200 nm on the light-absorbing transparent substrate bg1 at an incident angle of 0° is shown in FIG. 15A. In this transmittance spectrum, the spectral transmittance at a wavelength of 380 nm is 86.8%, the spectral transmittance at a wavelength of 450 nm is 90.2%, the average of the spectral transmittance in the wavelength range of 500 to 600 nm is 86.5%, the spectral transmittance at a wavelength of 700 nm is 29.8%, the spectral transmittance at a wavelength of 715 nm is 25.3%, the average of the spectral transmittance in the wavelength range of 700 to 800 nm is 19.1%, the maximum of the spectral transmittance in the wavelength range of 750 to 1080 nm is 30.2%, and the maximum of the spectral transmittance in the wavelength range of 1000 to 1100 nm is 32.5%.

Figure 15B:
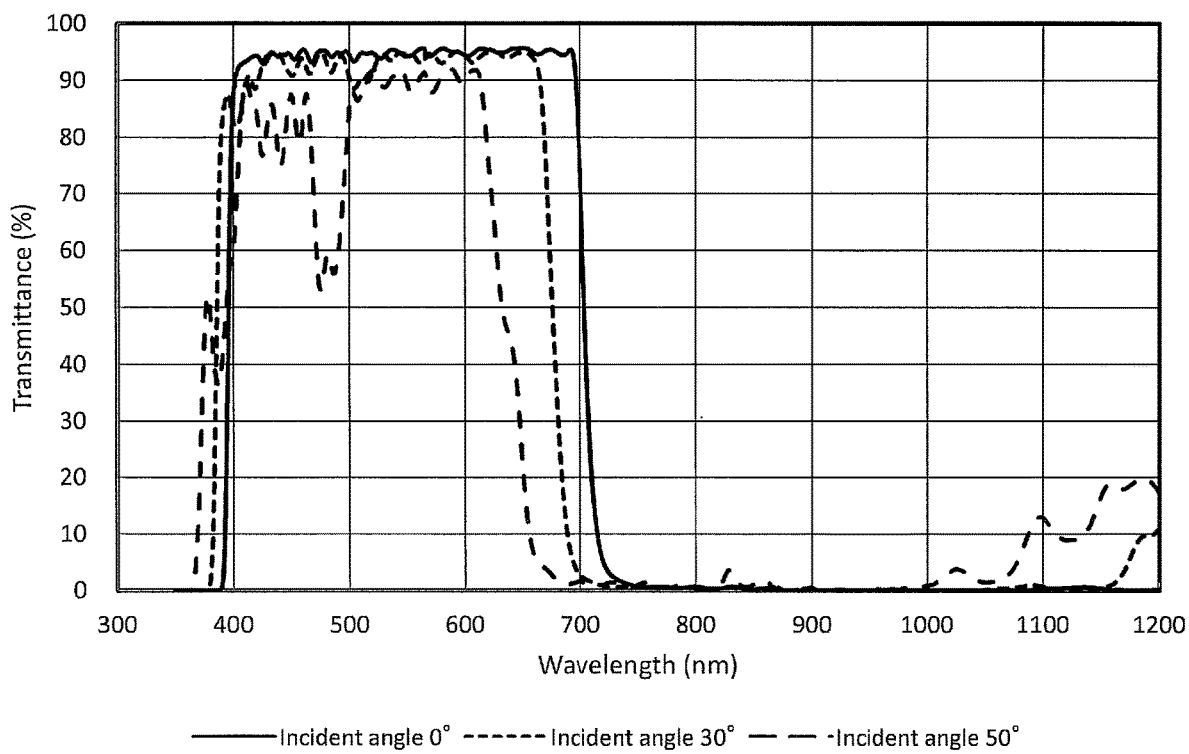
FIG. 15B shows transmittance spectra shown by a laminate according to Reference Example 4 for light incident at incident angles of 0°, 30°, and 50°.

A light-reflecting layer irr2 that reflects light in the wavelength range of 720 to 1100 nm were formed on one principal surface of the light-absorbing transparent substrate bg1 by alternately laminating $SiO_2$ and $TiO_2$ in 54 layers using a vacuum deposition apparatus. Separately, a light-reflecting layer irr2 was formed in the same manner on one principal surface of a transparent glass substrate (manufactured by SCHOTT AG, product name: D 263 T eco) to fabricate a laminate according to Reference Example 4. Transmittance spectra obtained upon incidence of light with a wavelength of 300 to 1200 nm on the laminate according to Reference Example 4 at incident angles of 0°, 30°, and 50° are shown in FIG. 15B. In the transmittance spectrum for an incident angle 0°, the spectral transmittance at a wavelength of 380 nm is less than 0.2%, the spectral transmittance at a wavelength of 450 nm is 94.3%, the average of the spectral transmittance in the wavelength range of 500 to 600 nm is 94.7%, the spectral transmittance at a wavelength of 700 nm is 73.5%, the spectral transmittance at a wavelength of 715 nm is 9.8%, the average of the spectral transmittance in the wavelength range of 700 to 800 nm is 6.7%, the maximum of the spectral transmittance in the wavelength range of 750 to 1080 nm is 0.7%, and the maximum of the spectral transmittance in the wavelength range of 1000 to 1100 nm is 0.3%. In the transmittance spectrum for an incident angle of 30°, the spectral transmittance at a wavelength of 380 nm is 1.6%, the spectral transmittance at a wavelength of 450 nm is 90.8%, the average transmittance in the wavelength range of 500 to 600 nm is 93.2%, the spectral transmittance at a wavelength of 700 nm is 2.7%, the spectral transmittance at a wavelength of 715 nm is 1.1%, the average of the spectral transmittance in the wavelength range of 700 to 800 nm is 0.8%, the maximum of the spectral transmittance in the wavelength range of 750 to 1080 nm is 0.7%, and the maximum of the spectral transmittance in the wavelength range of 1000 to 1100 nm is 1.0%. In the transmittance spectrum for an incident angle of 50°, the spectral transmittance at a wavelength of 380 nm is 49.4%, the spectral transmittance at a wavelength of 450 nm is 87.5%, the average of the spectral transmittance in the wavelength range of 500 to 600 nm is 89.8%, the spectral transmittance at a wavelength of 700 nm is 1.6%, the spectral transmittance at a wavelength of 715 nm is 0.8%, the average of the spectral transmittance in the wavelength range of 700 to 800 nm is 0.9%, the maximum of the spectral transmittance in the wavelength range of 750 to 1080 nm is 6.0%, and the maximum of the spectral transmittance in the wavelength range of 1000 to 1100 nm is 13.0%.

Figure 15C:
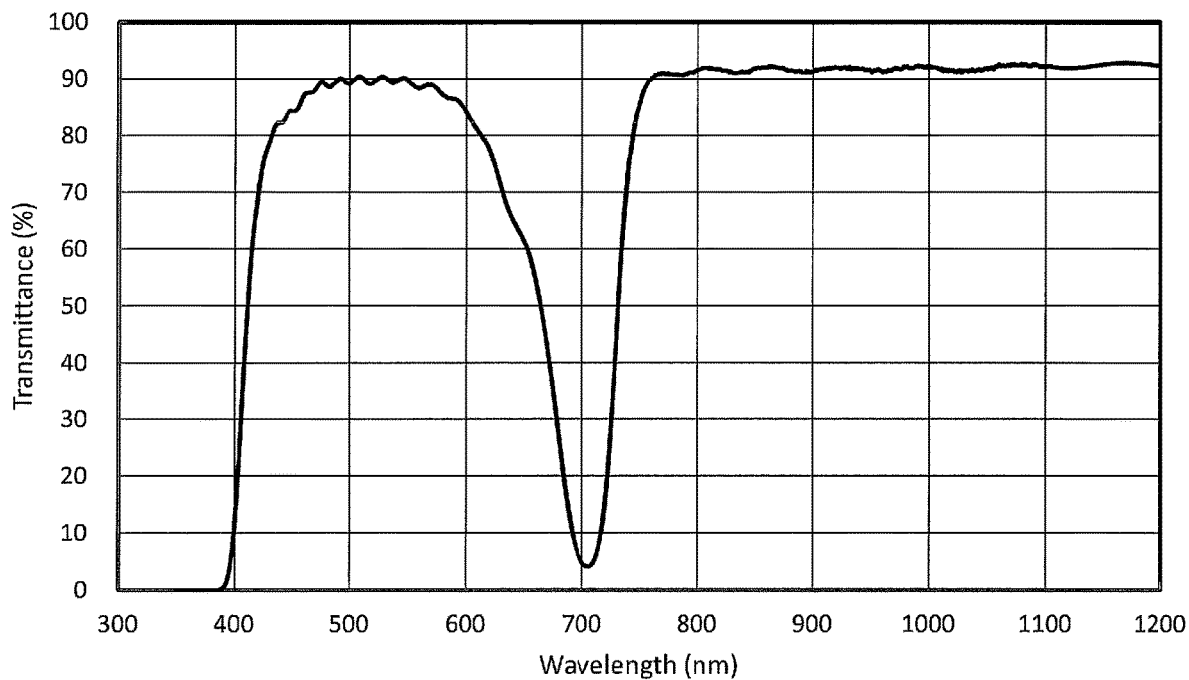
FIG. 15C shows a transmittance spectrum shown by a laminate according to Reference Example 5 for light incident at an incident angle of 0°.

A benzophenone-based ultraviolet-absorbing substance having low light absorption in the visible region and soluble in MEK was used as an ultraviolet absorber, and an infrared-absorbing dye composed of a squarylium compound and cyanine compound was used as an infrared absorber. The ultraviolet absorber and infrared absorber were weighed and added to MEK serving as a solvent to prepare a solution. PVB in an amount equivalent to 99 weight % of the solids of the solution was added to the solution, followed by stirring for 2 hours to obtain a coating liquid. This coating liquid was applied to the other principal surface of the light-absorbing transparent substrate bg1 to form a light-absorbing layer uvira2. A light-absorbing layer uvira2 was formed in the same manner on one principal surface of a transparent glass substrate (manufactured by SCHOTT AG, product name: D 263 T eco) to obtain a laminate according to Reference Example 5. A transmittance spectrum shown upon incidence of light with a wavelength of 300 to 1200 nm on the laminate according to Reference Example 5 at an incident angle of 0° is shown in FIG. 15C. In this transmittance spectrum, the spectral transmittance at a wavelength of 380 nm is less than 0.2%, the spectral transmittance at a wavelength of 450 nm is 84.3%, the average of the spectral transmittance in the wavelength range of 500 to 600 nm is 88.7%, the spectral transmittance at a wavelength of 700 nm is 4.8%, the spectral transmittance at a wavelength of 715 nm is 8.4%, the average of the spectral transmittance in the wavelength range of 700 to 800 nm is 63.8%, the maximum of the spectral transmittance in the wavelength range of 750 to 1080 nm is 92.7%, and the maximum of the spectral transmittance in the wavelength range of 1000 to 1100 nm is 92.7%.

An anti-reflection film ar1 was formed on the light-absorbing layer uvira2 formed on the other principal surface of the light-absorbing transparent substrate bg1 by vacuum deposition according to the same specifications as those of the anti-reflection film ar1 of the optical filter according to Example 4. An optical filter according to Comparative Example 2 was fabricated in this manner.

Figure 16A:
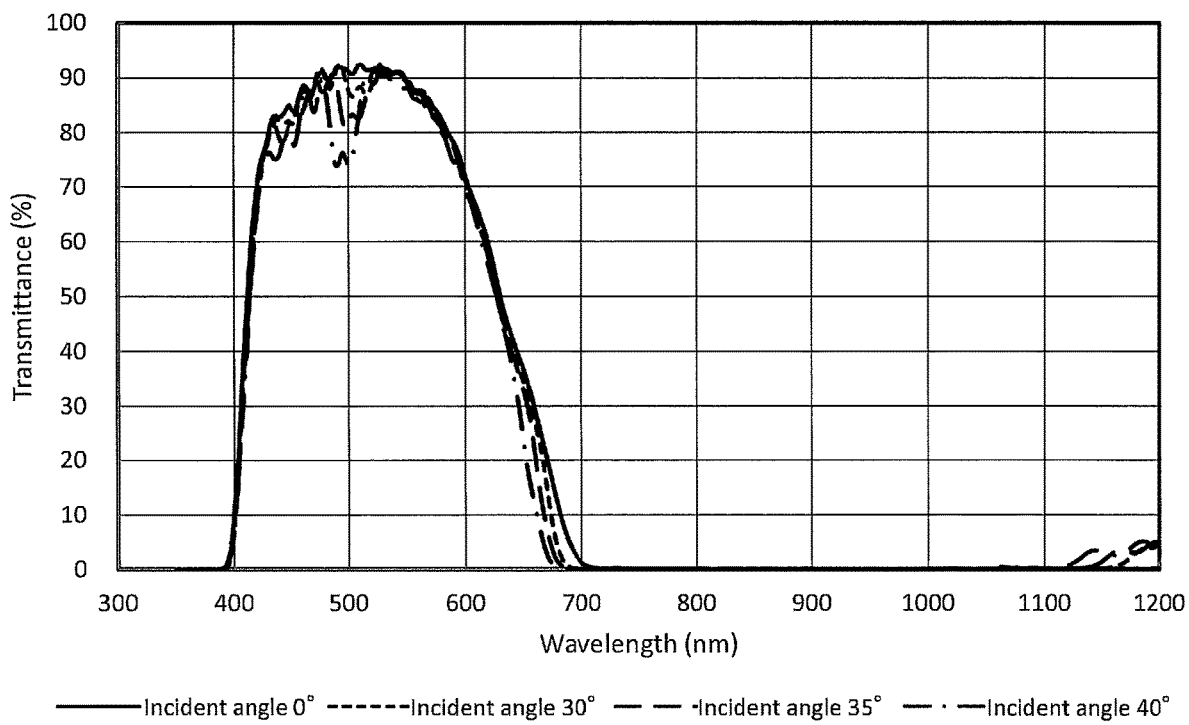
FIG. 16A shows transmittance spectra shown by the optical filter according to Comparative Example 2 for light incident at incident angles of 0°, 30°, 35°, and 40°.
Figure 16B:
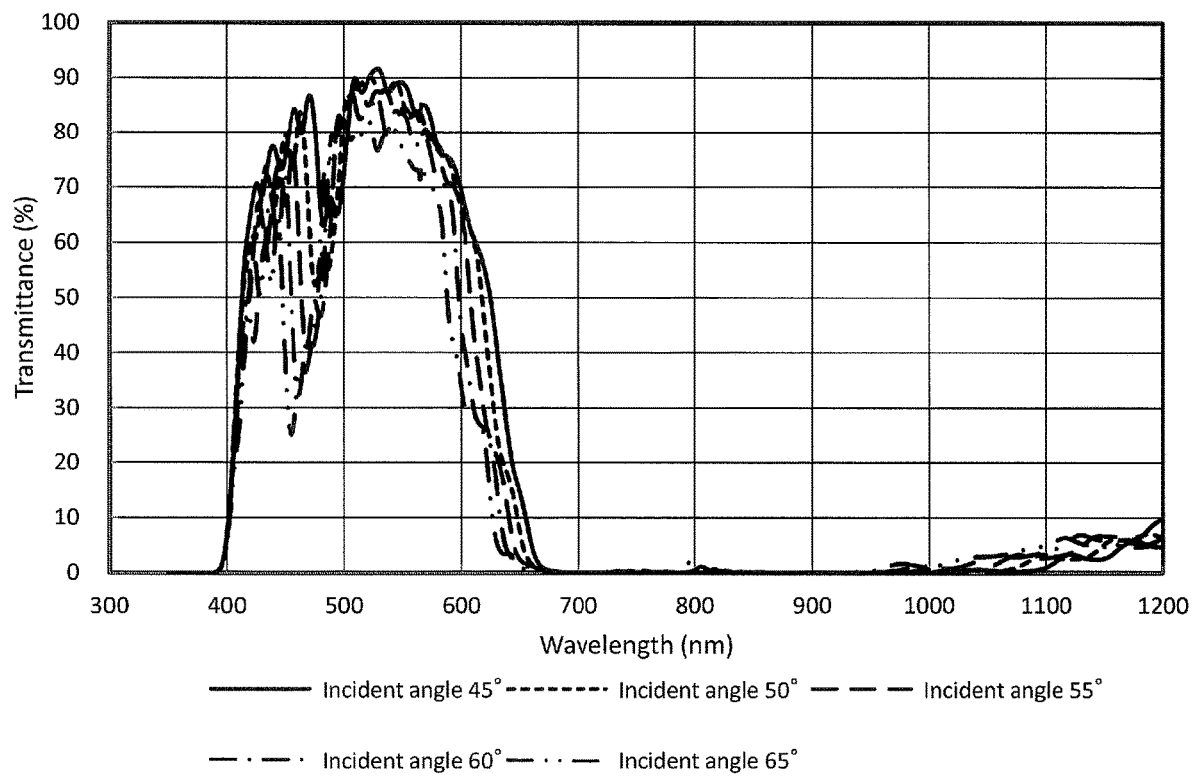
FIG. 16B shows transmittance spectra shown by the optical filter according to Comparative Example 2 for light incident at incident angles of 45°, 50°, 55°, 60°, and 65°.
Figure 17A:
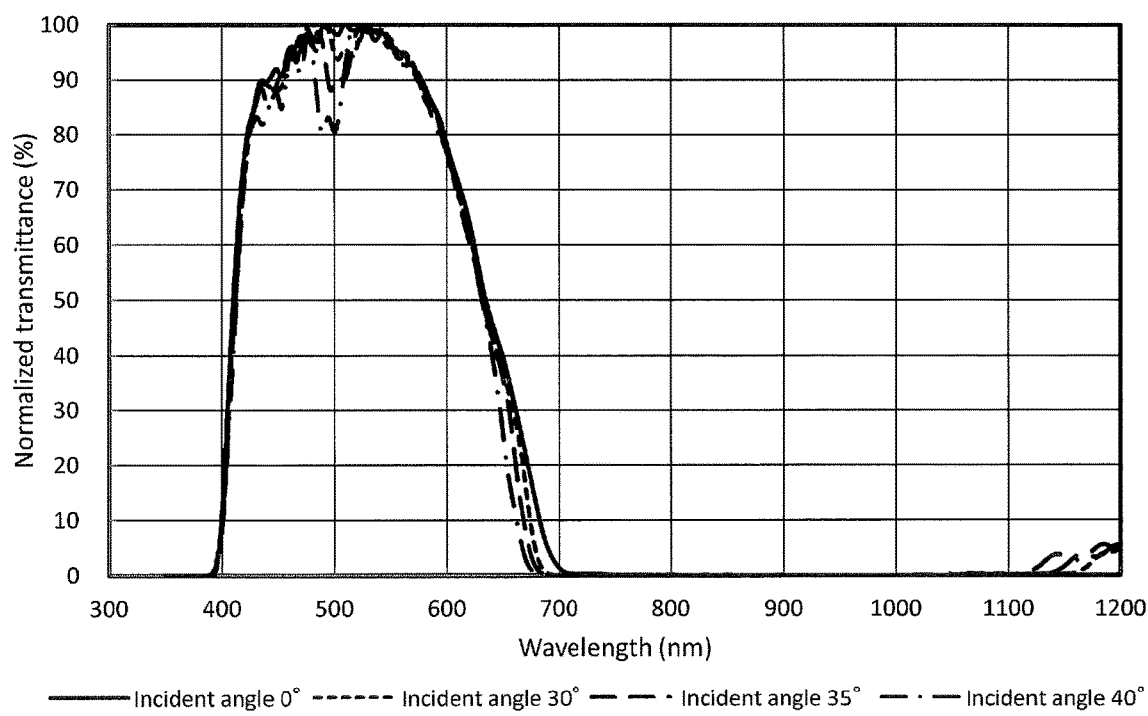
FIG. 17A shows normalized transmittance spectra shown by the optical filter according to Comparative Example 2 for light incident at incident angles of 0°, 30°, 35°, and 40°.
Figure 17B:
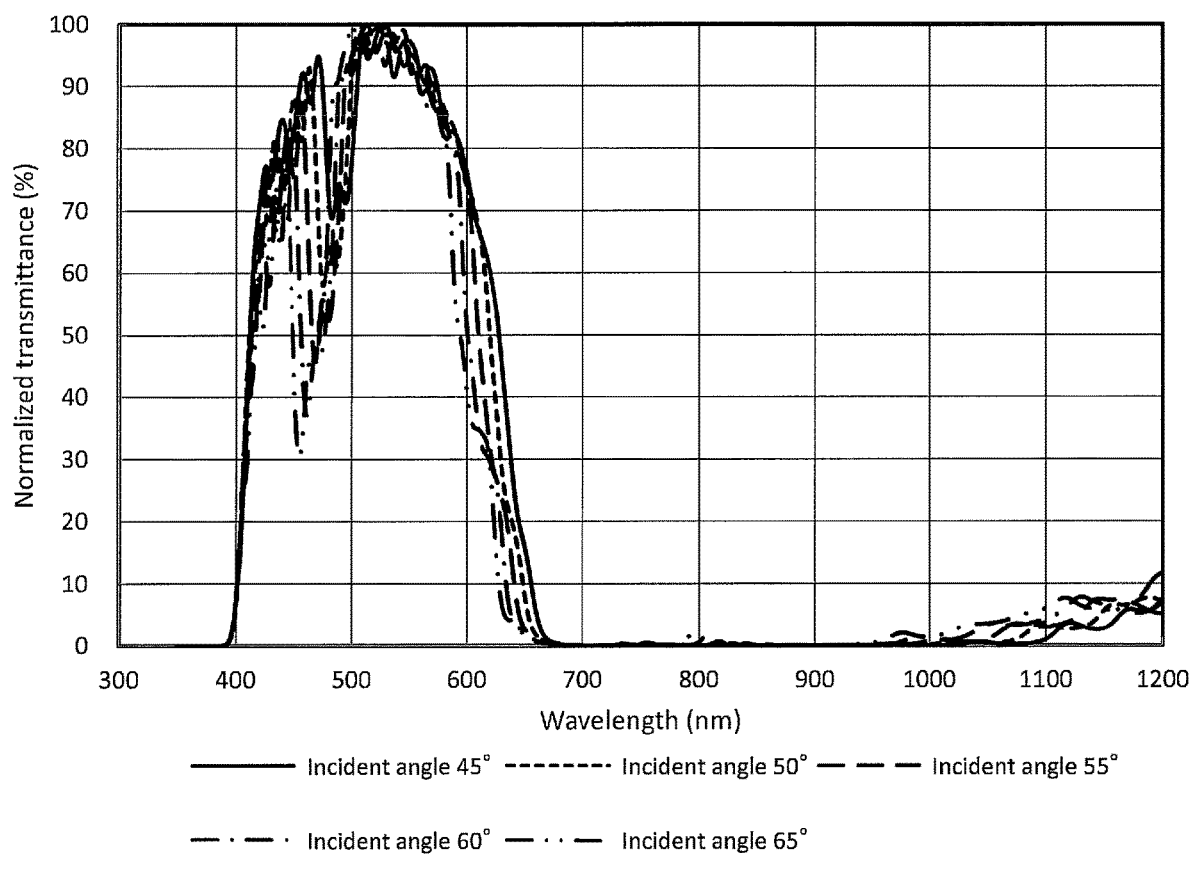
FIG. 17B shows normalized transmittance spectra shown by the optical filter according to Comparative Example 2 for light incident at incident angles of 45°, 50°, 55°, 60°, and 65°.

Transmittance spectra shown by the optical filter according to Comparative Example 2 at incident angles of 0°, 30°, 35°, 40°, 45°, 50°, 55°, 60°, and 65° are shown in FIGS. 16A and 16B. Values of characteristics derived from the transmittance spectrum shown by the optical filter according to Comparative Example 2 at an incident angle of 0° are shown in Table 11. Normalized spectral transmittance curves shown by the optical filter according to Comparative Example 2 at incident angles of 0°, 30°, 35°, 40°, 45°, 50°, 55°, 60°, and 65° are shown in FIGS. 17A and 17B. Values of characteristics derived from the normalized spectral transmittance curves shown by the optical filter according to Comparative Example 2 are shown in Table 12.

As shown in Table 12, the optical filter according to Comparative Example 2 does not satisfy the above requirement (11) at incident angles of 45°, 55°, 60°, and 65°, the above requirement (12) at incident angles of 0° to 65°, the above requirement (16) at incident angles of 50° to 65°, the above requirement (17) at incident angles of 50° to 65°, and the above requirement (18) at incident angles of 40° to 65°. For the optical filter according to Comparative Example 2, as shown in FIGS. 17A and 17B, a greater ripple occurs at a larger incident angle in the visible region in which a high transmittance is desirable, and the normalized spectral transmittance is low at a wavelength of 450 nm and in the wavelength range of 500 to 600 nm. Additionally, as shown in FIGS. 17A and 17B, when the incident angle of light is larger than 45°, there is a band in which the normalized spectral transmittance is less than 80% in the wavelength range of 450 to 520 nm and the wavelength bandwidth of wavelength bands in which the normalized spectral transmittance is 80% or more fails to be 170 nm or more.

For the optical filter according to Comparative Example 2, in both the near-infrared and ultraviolet regions, the boundary between a wavelength band of light expected to be transmitted and a wavelength band of light expected to be blocked is determined by light absorption. The light-reflecting layer exhibits its function of reflecting light by an interference effect attributed to its multilayer film. Thus, incidence of light at a large incident angle larger than a design value results not only in a shift of a wavelength band of reflected light to the short wavelength side but also in a ripple in a wavelength band of light which should be transmitted and severe distortion of the resultant spectral transmittance curve. For the optical filter according to Comparative Example 2, a narrow absorption band achieved by the light-absorbing layer in the infrared region results in failure to set the blocking band achieved by the light-reflecting layer on a sufficiently long wavelength side. Thus, the influence of the reflection band shifting to the short wavelength side with increase in incident angle of light is inevitable for the optical filter according to Comparative Example 2. As a result, although the transmittance spectrum of light vertically incident on the optical filter according to Comparative Example 2 satisfies the desired requirements, the transmittance spectra of light incident thereon at larger incident angles cannot satisfy the desired requirements. When an imaging apparatus in which the optical filter according to Comparative Example 2 is incorporated is used to take an object at a wide angle of view, for example, for a wide-angle shot, it is difficult to reproduce an even color tone of the object in the image taken and there is also concern that the image obtained may be colored quite unevenly.

TABLE 1

| | |
|---|---|
| (1) Spectral transmittance at wavelength of 380 nm | 1.0% |
| (2) Spectral transmittance at wavelength of 450 nm | 81.4% |
| (3) Average of spectral transmittance in wavelength range of 500 nm to 600 nm | 86.0% |
| (4) Spectral transmittance at wavelength of 700 nm | 2.3% |
| (5) Spectral transmittance at wavelength of 715 nm | 0.8% |
| (6) Average of spectral transmittance in wavelength range of 700 nm to 800 nm | 0.3% |
| (7) Largest value of spectral transmittance in wavelength range of 750 nm to 1080 nm | <0.2% |
| (8) Largest value of spectral transmittance in wavelength range of 1000 nm to 1100 nm | <0.2% |
| (9) Wavelength bandwidth in which spectral transmittance is 75% or more between wavelengths of 400 nm and 700 nm | 177 nm |

TABLE 2

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | 1.1% | 0.8% | 0.7% | 0.6% | 0.5% | 0.4% | 0.4% | 0.3% | 0.2% |
| (11) Normalized spectral transmittance at wavelength of 450 nm | 92.4% | 92.0% | 92.0% | 92.0% | 91.1% | 91.3% | 93.3% | 92.9% | 88.8% |
| (12) Average of normalized spectral transmittance in wavelength range of 500 nm to 600 nm | 97.6% | 97.5% | 97.5% | 97.5% | 97.3% | 97.4% | 97.4% | 97.2% | 96.6% |
| (13) Normalized spectral transmittance at wavelength of 700 nm | 2.6% | 2.2% | 2.1% | 2.0% | 1.8% | 1.7% | 1.5% | 1.4% | 1.3% |
| (14) Normalized spectral transmittance at wavelength of 715 nm | 0.9% | 0.7% | 0.6% | 0.6% | 0.5% | 0.5% | 0.4% | 0.4% | 0.3% |
| (15) Average of normalized spectral transmittance in wavelength range of 700 nm to 800 nm | 0.4% | 0.3% | 0.3% | 0.2% | 0.2% | 0.2% | <0.2% | <0.2% | <0.2% |
| (16) Largest value of normalized spectral transmittance in wavelength range of 750 nm to 1080 nm | <0.2% | <0.2% | <0.2% | <0.2% | <0.2% | <0.2% | <0.2% | <0.2% | <0.2% |
| (17) Largest value of normalized spectral transmittance in wavelength range of 1000 nm to 1100 nm | <0.2% | <0.2% | <0.2% | <0.2% | <0.2% | <0.2% | <0.2% | <0.2% | <0.2% |
| (18) Wavelength bandwidth in which normalized spectral transmittance is 80% or more between wavelengths of 400 nm and 700 nm | 191 nm | 188 nm | 187 nm | 187 nm | 185 nm | 185 nm | 186 nm | 181 nm | 175 nm |

TABLE 3

| | |
|---|---|
| (1) Spectral transmittance at wavelength of 380 nm | 17.3% |
| (2) Spectral transmittance at wavelength of 450 nm | 83.6% |
| (3) Average of spectral transmittance in wavelength range of 500 nm to 600 nm | 85.6% |
| (4) Spectral transmittance at wavelength of 700 nm | 2.2% |
| (5) Spectral transmittance at wavelength of 715 nm | 0.8% |
| (6) Average of spectral transmittance in wavelength range of 700 nm to 800 nm | 0.4% |
| (7) Largest value of spectral transmittance in wavelength range of 750 nm to 1080 nm | 1.0% |
| (8) Largest value of spectral transmittance in wavelength range of 1000 nm to 1100 nm | 1.6% |

TABLE 3-continued

| | |
|---|---|
| (9) Wavelength bandwidth in which spectral transmittance is 75% or more between wavelengths of 400 nm and 700 nm | 192 nm |

TABLE 5-continued

| | |
|---|---|
| (6) Average of spectral transmittance in wavelength range of 700 nm to 800 nm | 0.9% |
| (7) Largest value of spectral transmittance in wavelength range of 750 nm to 1080 nm | 0.4% |

TABLE 4

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | 19.7% | 18.6% | 18.0% | 17.2% | 16.5% | 15.6% | 14.5% | 13.3% | 12.8% |
| (11) Normalized spectral transmittance at wavelength of 450 nm | 95.0% | 94.6% | 94.7% | 94.7% | 94.8% | 94.7% | 93.6% | 91.7% | 90.4% |
| (12) Average of normalized spectral transmittance in wavelength range of 500 nm to 600 nm | 97.2% | 97.0% | 97.0% | 97.0% | 96.8% | 96.8% | 96.8% | 96.7% | 96.7% |
| (13) Normalized spectral transmittance at wavelength of 700 nm | 2.5% | 2.1% | 2.0% | 1.9% | 1.7% | 1.6% | 1.5% | 1.4% | 1.3% |
| (14) Normalized spectral transmittance at wavelength of 715 nm | 0.9% | 0.8% | 0.7% | 0.7% | 0.6% | 0.6% | 0.5% | 0.5% | 0.5% |
| (15) Average of normalized spectral transmittance in wavelength range of 700 nm to 800 nm | 0.4% | 0.3% | 0.3% | 0.3% | 0.3% | 0.3% | 0.2% | 0.2% | <0.2% |
| (16) Largest value of normalized spectral transmittance in wavelength range of 750 nm to 1080 nm | 1.1% | 1.0% | 1.0% | 0.9% | 0.9% | 0.9% | 0.8% | 0.8% | 0.8% |
| (17) Largest value of normalized spectral transmittance in wavelength range of 1000 nm to 1100 nm | 1.8% | 1.7% | 1.6% | 1.5% | 1.5% | 1.4% | 1.4% | 1.4% | 1.3% |
| (18) Wavelength bandwidth in which normalized spectral transmittance is 80% or more between wavelengths of 400 nm and 700 nm | 204 nm | 203 nm | 202 nm | 202 nm | 201 nm | 200 nm | 198 nm | 195 nm | 195 nm |

TABLE 5

| | |
|---|---|
| (1) Spectral transmittance at wavelength of 380 nm | 1.5% |
| (2) Spectral transmittance at wavelength of 450 nm | 78.5% |
| (3) Average of spectral transmittance in wavelength range of 500 nm to 600 nm | 85.0% |
| (4) Spectral transmittance at wavelength of 700 nm | 4.8% |
| (5) Spectral transmittance at wavelength of 715 nm | 2.2% |

TABLE 5-continued

| | |
|---|---|
| (8) Largest value of spectral transmittance in wavelength range of 1000 nm to 1100 nm | 0.7% |
| (9) Wavelength bandwidth in which spectral transmittance is 75% or more between wavelengths of 400 nm and 700 nm | 173 nm |

TABLE 6

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | 1.8% | 1.3% | 1.2% | 1.1% | 0.9% | 0.9% | 0.8% | 0.7% | 0.6% |
| (11) Normalized spectral transmittance at wavelength of 450 nm | 90.7% | 90.1% | 90.1% | 90.1% | 89.9% | 89.5% | 89.3% | 89.1% | 88.7% |
| (12) Average of normalized spectral transmittance in wavelength range of 500 nm to 600 nm | 98.2% | 98.2% | 98.1% | 98.1% | 98.0% | 98.0% | 98.0% | 98.0% | 98.0% |

TABLE 6-continued

| | Incident angle | | | | | | | | |
|---|---|---|---|---|---|---|---|---|---|
| | 0° | 30° | 35° | 40° | 45° | 50° | 55° | 60° | 65° |
| (13) Normalized spectral transmittance at wavelength of 700 nm | 5.6% | 4.9% | 4.7% | 4.5% | 4.3% | 4.2% | 4.0% | 3.8% | 3.8% |
| (14) Normalized spectral transmittance at wavelength of 715 nm | 2.5% | 2.1% | 2.0% | 1.9% | 1.8% | 1.7% | 1.6% | 1.6% | 1.5% |
| (15) Average of normalized spectral transmittance in wavelength range of 700 nm to 800 nm | 1.1% | 0.9% | 0.9% | 0.8% | 0.8% | 0.7% | 0.7% | 0.7% | 0.7% |
| (16) Largest value of normalized spectral transmittance in wavelength range of 750 nm to 1080 nm | 0.5% | 0.4% | 0.4% | 0.4% | 0.5% | 0.5% | 0.5% | 0.5% | 0.5% |
| (17) Largest value of normalized spectral transmittance in wavelength range of 1000 nm to 1100 nm | 0.8% | 0.7% | 0.7% | 0.7% | 0.7% | 0.7% | 0.7% | 0.7% | 0.8% |
| (18) Wavelength bandwidth in which normalized spectral transmittance is 80% or more between wavelengths of 400 nm and 700 nm | 194 nm | 192 nm | 191 nm | 190 nm | 189 nm | 188 nm | 187 nm | 186 nm | 186 nm |

TABLE 7

| | |
|---|---|
| (1) Spectral transmittance at wavelength of 380 nm | <0.2% |
| (2) Spectral transmittance at wavelength of 450 nm | 82.5% |
| (3) Average of spectral transmittance in wavelength range of 500 nm to 600 nm | 89.5% |
| (4) Spectral transmittance at wavelength of 700 nm | 1.9% |
| (5) Spectral transmittance at wavelength of 715 nm | 0.7% |
| (6) Average of spectral transmittance in wavelength range of 700 nm to 800 nm | 0.3% |
| (7) Largest value of spectral transmittance in wavelength range of 750 nm to 1080 nm | 0.6% |
| (8) Largest value of spectral transmittance in wavelength range of 1000 nm to 1100 nm | 0.9% |
| (9) Wavelength bandwidth in which spectral transmittance is 75% or more between wavelengths of 400 nm and 700 nm | 183 nm |

TABLE 8

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | <0.2% | <0.2% | <0.2% | <0.2% | <0.2% | <0.2% | <0.2% | <0.2% | <0.2% |
| (11) Normalized spectral transmittance at wavelength of 450 nm | 89.4% | 89.1% | 89.2% | 89.4% | 89.5% | 89.5% | 89.4% | 89.2% | 89.1% |
| (12) Average of normalized spectral transmittance in wavelength range of 500 nm to 600 nm | 97.0% | 96.8% | 96.7% | 96.5% | 96.2% | 96.1% | 95.9% | 95.9% | 96.1% |
| (13) Normalized spectral transmittance at wavelength of 700 nm | 2.1% | 1.6% | 1.5% | 1.3% | 1.2% | 1.0% | 0.9% | 0.8% | 0.7% |
| (14) Normalized spectral transmittance at wavelength of 715 nm | 0.7% | 0.5% | 0.5% | 0.4% | 0.4% | 0.3% | 0.3% | 0.2% | <0.2% |
| (15) Average of normalized spectral transmittance in wavelength range of 700 nm to 800 nm | 0.3% | 0.2% | 0.2% | <0.2% | <0.2% | <0.2% | <0.2% | <0.2% | <0.2% |
| (16) Largest value of normalized spectral transmittance in wavelength range of 750 nm to 1080 nm | 0.6% | 0.4% | 0.4% | 0.3% | 0.3% | 0.3% | 0.2% | 0.2% | <0.2% |

TABLE 8-continued

| | Incident angle | | | | | | | | |
|---|---|---|---|---|---|---|---|---|---|
| | 0° | 30° | 35° | 40° | 45° | 50° | 55° | 60° | 65° |
| (17) Largest value of normalized spectral transmittance in wavelength range of 1000 nm to 1100 nm | 1.0% | 0.8% | 0.7% | 0.6% | 0.5% | 0.5% | 0.4% | 0.3% | 0.3% |
| (18) Wavelength bandwidth in which normalized spectral transmittance is 80% or more between wavelengths of 400 nm and 700 nm | 186 nm | 182 nm | 181 nm | 179 nm | 177 nm | 175 nm | 174 nm | 174 nm | 174 nm |

TABLE 9

| | |
|---|---|
| (1) Spectral transmittance at wavelength of 380 nm | <0.2% |
| (2) Spectral transmittance at wavelength of 450 nm | 86.2% |
| (3) Average of spectral transmittance in wavelength range of 500 nm to 600 nm | 90.2% |
| (4) Spectral transmittance at wavelength of 700 nm | 1.4% |
| (5) Spectral transmittance at wavelength of 715 nm | 0.3% |
| (6) Average of spectral transmittance in wavelength range of 700 nm to 800 nm | 0.3% |
| (7) Largest value of spectral transmittance in wavelength range of 750 nm to 1080 nm | 0.7% |
| (8) Largest value of spectral transmittance in wavelength range of 1000 nm to 1100 nm | 0.5% |
| (9) Wavelength bandwidth in which spectral transmittance is 75% or more between wavelengths of 400 nm and 700 nm | 196 nm |

TABLE 11

| | |
|---|---|
| (1) Spectral transmittance at wavelength of 380 nm | <0.2% |
| (2) Spectral transmittance at wavelength of 450 nm | 84.6% |
| (3) Average of spectral transmittance in wavelength range of 500 nm to 600 nm | 87.1% |
| (4) Spectral transmittance at wavelength of 700 nm | 1.3% |
| (5) Spectral transmittance at wavelength of 715 nm | 0.3% |
| (6) Average of spectral transmittance in wavelength range of 700 nm to 800 nm | 0.2% |
| (7) Largest value of spectral transmittance in wavelength range of 750 nm to 1080 nm | <0.2% |
| (8) Largest value of spectral transmittance in wavelength range of 1000 nm to 1100 nm | <0.2% |
| (9) Wavelength bandwidth in which spectral transmittance is 75% or more between wavelengths of 400 nm and 700 nm | 172 nm |

TABLE 10

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | <0.2% | <0.2% | <0.2% | <0.2% | <0.2% | 3.5% | 10.7% | 17.1% | 16.7% |
| (11) Normalized spectral transmittance at wavelength of 450 nm | 91.5% | 90.8% | 88.6% | 82.7% | 85.2% | 84.6% | 76.8% | 84.8% | 73.8% |
| (12) Average of normalized spectral transmittance in wavelength range of 500 nm to 600 nm | 95.8% | 94.5% | 93.2% | 91.8% | 90.9% | 90.7% | 92.2% | 91.4% | 87.6% |
| (13) Normalized spectral transmittance at wavelength of 700 nm | 1.5% | <0.2% | <0.2% | <0.2% | <0.2% | <0.2% | <0.2% | <0.2% | <0.2% |
| (14) Normalized spectral transmittance at wavelength of 715 nm | 0.3% | <0.2% | <0.2% | <0.2% | <0.2% | <0.2% | <0.2% | <0.2% | <0.2% |
| (15) Average of normalized spectral transmittance in wavelength range of 700 nm to 800 nm | 0.3% | <0.2% | <0.2% | <0.2% | <0.2% | <0.2% | <0.2% | 0.2% | 0.9% |
| (16) Largest value of normalized spectral transmittance in wavelength range of 750 nm to 1080 nm | 0.7% | 0.7% | 0.9% | 1.3% | 1.8% | 7.3% | 15.1% | 16.2% | 22.3% |
| (17) Largest value of normalized spectral transmittance in wavelength range of 1000 nm to 1100 nm | 0.5% | 0.6% | 0.9% | 1.3% | 4.1% | 13.7% | 15.1% | 17.6% | 25.8% |
| (18) Wavelength bandwidth in which normalized spectral transmittance is 80% or more between wavelengths of 400 nm and 700 nm | 196 nm | 181 nm | 176 nm | 174 nm | 155 nm | 146 nm | 128 nm | 108 nm | 96 nm |

TABLE 12

| | Incident angle | | | | | | | | |
|---|---|---|---|---|---|---|---|---|---|
| | 0° | 30° | 35° | 40° | 45° | 50° | 55° | 60° | 65° |
| (10) Normalized spectral transmittance at wavelength of 380 nm | <0.2% | <0.2% | <0.2% | <0.2% | <0.2% | <0.2% | <0.2% | <0.2% | <0.2% |
| (11) Normalized spectral transmittance at wavelength of 450 nm | 91.6% | 88.5% | 90.1% | 86.6% | 83.0% | 88.3% | 74.9% | 82.3% | 43.8% |
| (12) Average of normalized spectral transmittance in wavelength range of 500 nm to 600 nm | 94.3% | 92.9% | 92.6% | 91.9% | 91.8% | 92.2% | 91.7% | 89.5% | 86.7% |
| (13) Normalized spectral transmittance at wavelength of 700 nm | 1.4% | <0.2% | <0.2% | <0.2% | <0.2% | <0.2% | <0.2% | <0.2% | <0.2% |
| (14) Normalized spectral transmittance at wavelength of 715 nm | 0.3% | <0.2% | <0.2% | <0.2% | <0.2% | <0.2% | <0.2% | <0.2% | <0.2% |
| (15) Average of normalized spectral transmittance in wavelength range of 700 nm to 800 nm | 0.2% | <0.2% | <0.2% | <0.2% | <0.2% | <0.2% | <0.2% | <0.2% | 0.4% |
| (16) Largest value of normalized spectral transmittance in wavelength range of 750 nm to 1080 nm | <0.2% | 0.2% | 0.4% | 0.4% | 0.6% | 1.6% | 3.6% | 3.5% | 5.0% |
| (17) Largest value of normalized spectral transmittance in wavelength range of 1000 nm to 1100 nm | <0.2% | 0.3% | 0.4% | 0.4% | 1.0% | 3.6% | 3.6% | 4.4% | 6.1% |
| (18) Wavelength bandwidth in which normalized spectral transmittance is 80% or more between wavelengths of 400 nm and 700 nm | 175 nm | 173 nm | 172 nm | 169 nm | 138 nm | 126 nm | 109 nm | 65 nm | 101 nm |

The invention claimed is:

1. An optical filter comprising:
a light-absorbing layer that includes a light absorber for absorbing light in at least a portion of the near-infrared region, wherein
when light with a wavelength of 300 to 1200 nm is incident on the optical filter at an incident angle of 0°, the optical filter satisfies the following requirements (1) to (9):
(1) a spectral transmittance at a wavelength of 380 nm is less than 20%, or less, and a wavelength at which a spectral transmittance is 20% in the wavelength range of 380 nm to 450 nm exceeds 400 nm;
(2) the spectral transmittance at a wavelength of 450 nm is 75% or more;
(3) an average of the spectral transmittance in the wavelength range of 500 to 600 nm is 80% or more;
(4) the spectral transmittance at a wavelength of 700 nm is 5% or less;
(5) the spectral transmittance at a wavelength of 715 nm is 3% or less;
(6) an average of the spectral transmittance in the wavelength range of 700 to 800 nm is 1% or less;
(7) the maximum of the spectral transmittance in the wavelength range of 750 to 1080 nm is 1% or less;
(8) the maximum of the spectral transmittance in the wavelength range of 1000 to 1100 nm is 2% or less; and
(9) a wavelength bandwidth of a wavelength band in which the spectral transmittance in the wavelength range of 400 to 700 nm is 75% or more is 170 nm or more,
when light with a wavelength of 300 to 1200 nm is incident on the optical filter at incident angles of 0°, 30°, 35°, and 40°, the optical filter further satisfies the following requirements (10) to (18):
(10) a normalized spectral transmittance at a wavelength of 380 nm is 24% or less;
(11) the normalized spectral transmittance at a wavelength of 450 nm is 84% or more;
(12) an average of the normalized spectral transmittance in the wavelength range of 500 to 600 nm is 95% or more;
(13) the normalized spectral transmittance at a wavelength of 700 nm is 6.0% or less;
(14) the normalized spectral transmittance at a wavelength of 715 nm is 4.5% or less;
(15) an average of the normalized spectral transmittance in the wavelength range of 700 to 800 nm is 1.2% or less;
(16) the maximum of the normalized spectral transmittance in the wavelength range of 750 to 1080 nm is 1.2% or less;
(17) the maximum of the normalized spectral transmittance in the wavelength range of 1000 to 1100 nm is 2.4% or less; and
(18) a wavelength bandwidth of a wavelength band in which the normalized spectral transmittance in the wavelength range of 400 to 700 nm is 80% or more is 170 nm or more,
the normalized spectral transmittance being determined by normalization of the spectral transmittance for each incident angle so that the maximum of the spectral transmittance for each incident angle in the wavelength range of 400 to 650 nm is 100%.

2. The optical filter according to claim 1, wherein when light with a wavelength of 300 to 1200 nm is incident on the optical filter at incident angles of 45°, 50°, and 60°, the optical filter further satisfies the requirements (10) to (18).

3. The optical filter according to claim 2, wherein when light with a wavelength of 300 to 1200 nm is incident on the optical filter at an incident angle of 65°, the optical filter further satisfies the requirements (10) to (18).

4. The optical filter according to claim 1, wherein the light absorber is formed by a phosphonic acid and copper ion.

5. The optical filter according to claim 4, wherein the phosphonic acid comprises a first phosphonic acid having an aryl group.

6. The optical filter according to claim 5, wherein the phosphonic acid further comprises a second phosphonic acid having an alkyl group.

7. An imaging apparatus comprising:
a lens system;
an imaging device that receives light having been transmitted through the lens system; and
the optical filter according to claim 1 that is disposed ahead of the imaging device.

8. The imaging apparatus according to claim 7 further comprising a color filter that is disposed ahead of the imaging device and is a filter of three colors, R (red), G (green), and B (blue), wherein
the optical filter is disposed ahead of the color filter.

9. The optical filter according to claim 1, wherein the light-absorbing layer comprises a first light-absorbing layer and a second light-absorbing layer,
the first light-absorbing layer comprises a copper ion and a first phosphonic acid with an aryl group, and
the second light-absorbing layer comprises a copper ion and a second phosphonic acid with an alkyl group.

10. The optical filter according to claim 9, further comprising:
a $SiO_2$ layer, wherein
the $SiO_2$ layer is disposed between the first light-absorbing layer and the second light-absorbing layer.

11. The optical filter according to claim 9, further comprising:
a substrate;
a first $SiO_2$ layer;
a second $SiO_2$ layer; and
an anti-reflection film comprising a dielectric multilayer, wherein
the substrate, the first light-absorbing layer, the first $SiO_2$ layer, the second light-absorbing layer, the second $SiO_2$ layer, and the anti-reflection film are disposed in this order.

12. The optical filter according to claim 1, further comprising:
an ultraviolet-absorbing layer being capable of absorbing light in at least a portion of the ultraviolet region.

* * * * *